（12）United States Patent
Lemczyk

(10) Patent No.: US 8,937,482 B1
(45) Date of Patent: Jan. 20, 2015

(54) APPARATUS AND METHOD FOR RAMPING AND CONTROLLING THE TEMPERATURE OF A COMPONENT USING A VORTEX TUBE

(75) Inventor: Tom Lemczyk, Phoenix, AZ (US)

(73) Assignee: Sensata Technologies, Inc., Attleboro, MA (US)

( * ) Notice: Subject to any disclaimer, the term of this patent is extended or adjusted under 35 U.S.C. 154(b) by 287 days.

(21) Appl. No.: 13/531,093

(22) Filed: Jun. 22, 2012

Related U.S. Application Data

(60) Provisional application No. 61/502,313, filed on Jun. 28, 2011, provisional application No. 61/576,340, filed on Dec. 15, 2011.

(51) Int. Cl.
*G01R 31/10* (2006.01)

(52) U.S. Cl.
USPC ............................... 324/750.05; 324/750.04

(58) Field of Classification Search
USPC .................. 324/750.01–750.09; 62/5
See application file for complete search history.

(56) References Cited

U.S. PATENT DOCUMENTS

| | | | |
|---|---|---|---|
| 4,584,838 A * | 4/1986 | AbuJudom, II | 62/5 |
| 5,911,740 A * | 6/1999 | Tunkel et al. | 62/5 |
| 6,401,463 B1 | 6/2002 | Dukhan et al. | |
| 6,515,862 B1 | 2/2003 | Wong et al. | |
| 6,637,502 B1 | 10/2003 | North et al. | |
| 6,643,131 B1 | 11/2003 | Huang | |
| 6,646,341 B2 | 11/2003 | Miyamura et al. | |
| 6,736,196 B2 | 5/2004 | Lai et al. | |
| 6,876,550 B2 | 4/2005 | Sri-Jayantha et al. | |
| 7,042,240 B2 | 5/2006 | Lopez et al. | |
| 7,108,517 B2 | 9/2006 | Harper | |
| 7,123,037 B2 | 10/2006 | Lopez et al. | |
| 7,187,189 B2 | 3/2007 | Lopez et al. | |
| 7,256,993 B2 | 8/2007 | Cravens et al. | |
| 7,263,836 B2 | 9/2007 | Gunawardana et al. | |
| 7,312,620 B2 | 12/2007 | Lopez et al. | |
| 7,394,271 B2 | 7/2008 | Lopez et al. | |
| 7,482,825 B2 | 1/2009 | Lopez et al. | |
| 7,751,188 B1 | 7/2010 | French et al. | |
| 2003/0161552 A1* | 8/2003 | Shima et al. | 382/312 |

OTHER PUBLICATIONS

Exair Corporation, Datasheet, Vortex Tube Installation and Maintenance, 2010, 2 pages, Publisher: Exair Corporation, Cincinatti, OH, World-Wild Web.
TE Technology, Inc., Web Page, Peltier—Thermoelectric Cooler Modules, http://www.tetech.com/Peltier-Thermoelectric-Cooler-Modules.html, 2010, 1 page, Publisher, TE Technology, Inc., Traverse City, MI, World Wide Web.

(Continued)

*Primary Examiner* — Vincent Q Nguyen
(74) *Attorney, Agent, or Firm* — Howard Russell

(57) ABSTRACT

Apparatus and method adapted for use with an optionally pre-conditioned air supply that is pressurized, for ramping a component to a temperature setpoint, having a vortex tube, a ventilated mount connected to the vortex tube, a pedestal adapted for thermal connection with the component, and a heat exchanger thermally connected with the pedestal and extending within an inward hollowed and enclosed chamber of the ventilated mount, the chamber having wall thickness and size and having a plurality of smaller apertures, or a single larger aperture, therein, and optionally baffling, so as to be adapted for regulating the airflow through the chamber for effectively ramping the temperature of the component and to maximize noise abatement performance.

17 Claims, 33 Drawing Sheets

(56) References Cited

OTHER PUBLICATIONS

Deepcool Industries Co., Ltd., Web Page, Heatpipe Heatsink, http://www.deepcooltech.com/product/Heatpipe/index.html, Copyright Date 2012, 1 page, Publisher: Deepcool Industries Co., Ltd., World-Wide-Web.

Dalton Electric Heating Co., Inc., Web Page. Cartridge Heaters, http://www.daltonelectric.com/cartridge-heater/, Copyright 2003-2011, 1 Page, Publisher: Dalton Electric Heating Co., Inc., World-Wide-Web.

* cited by examiner

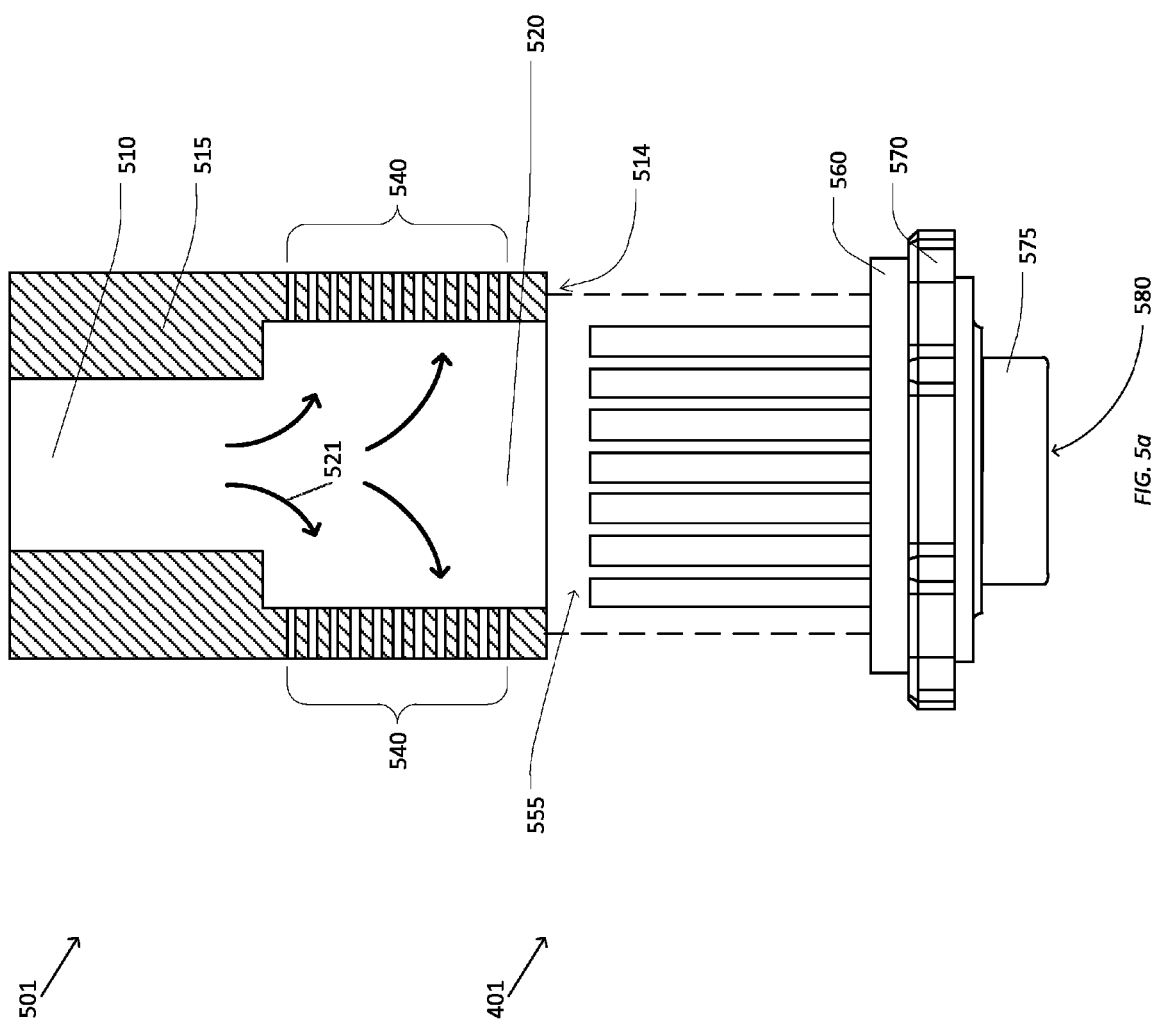

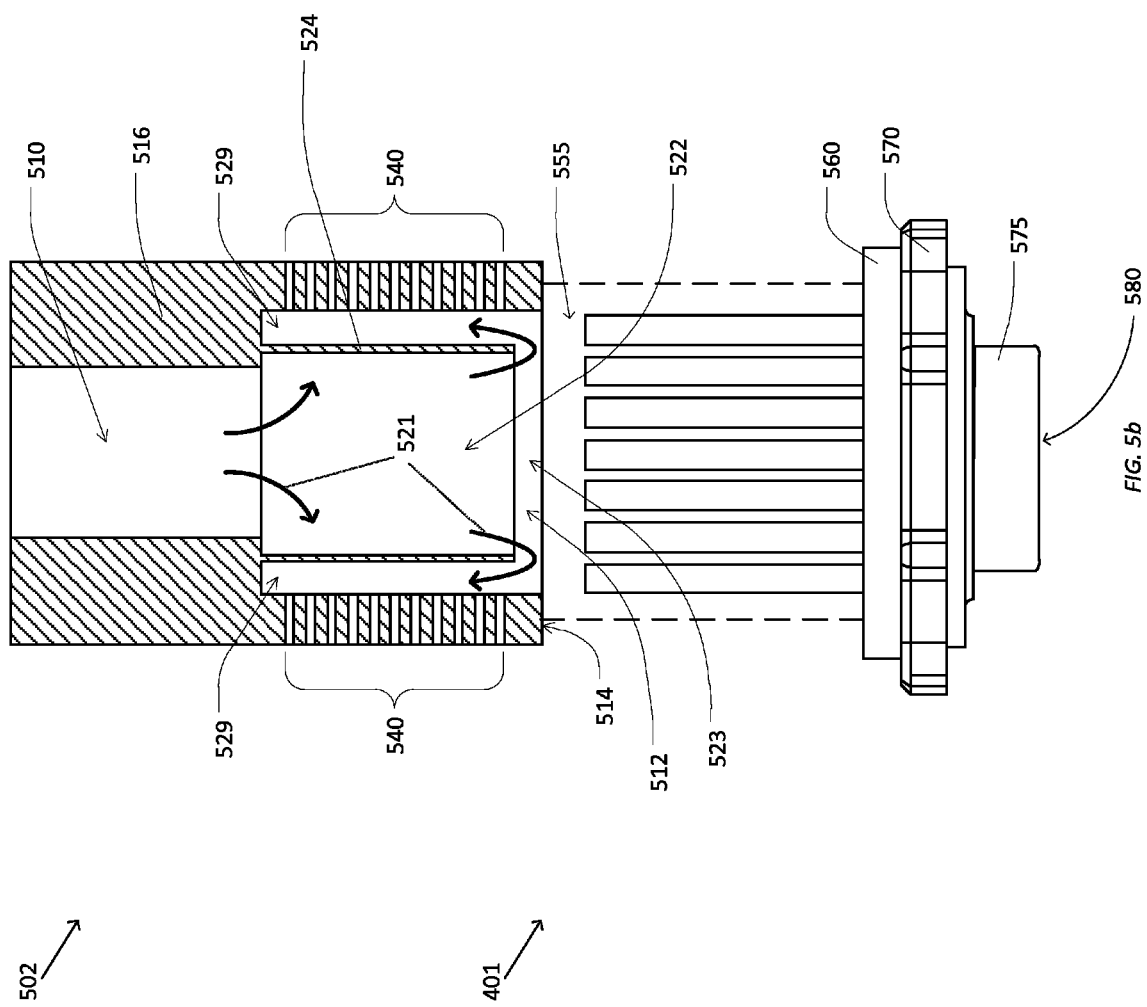

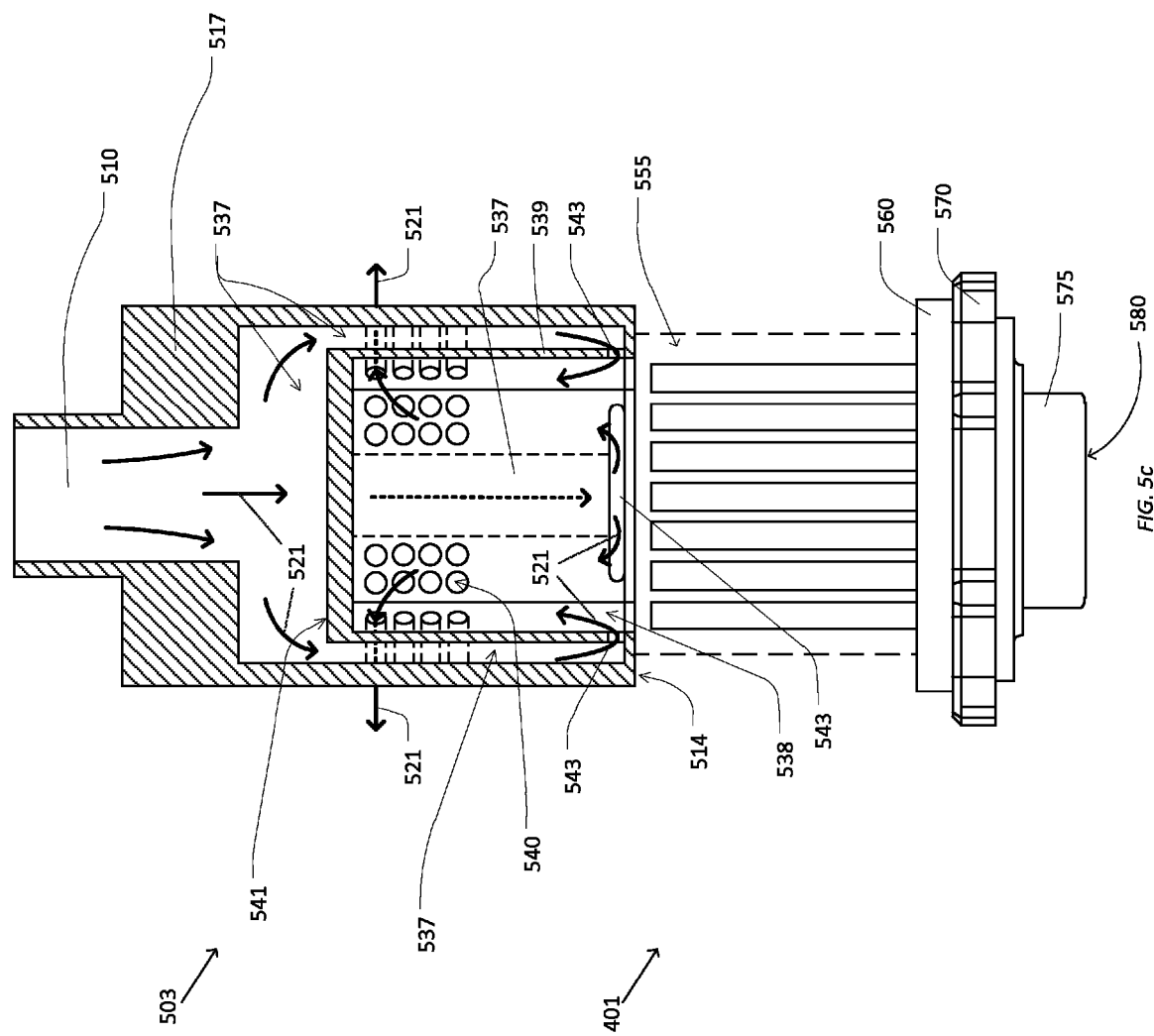

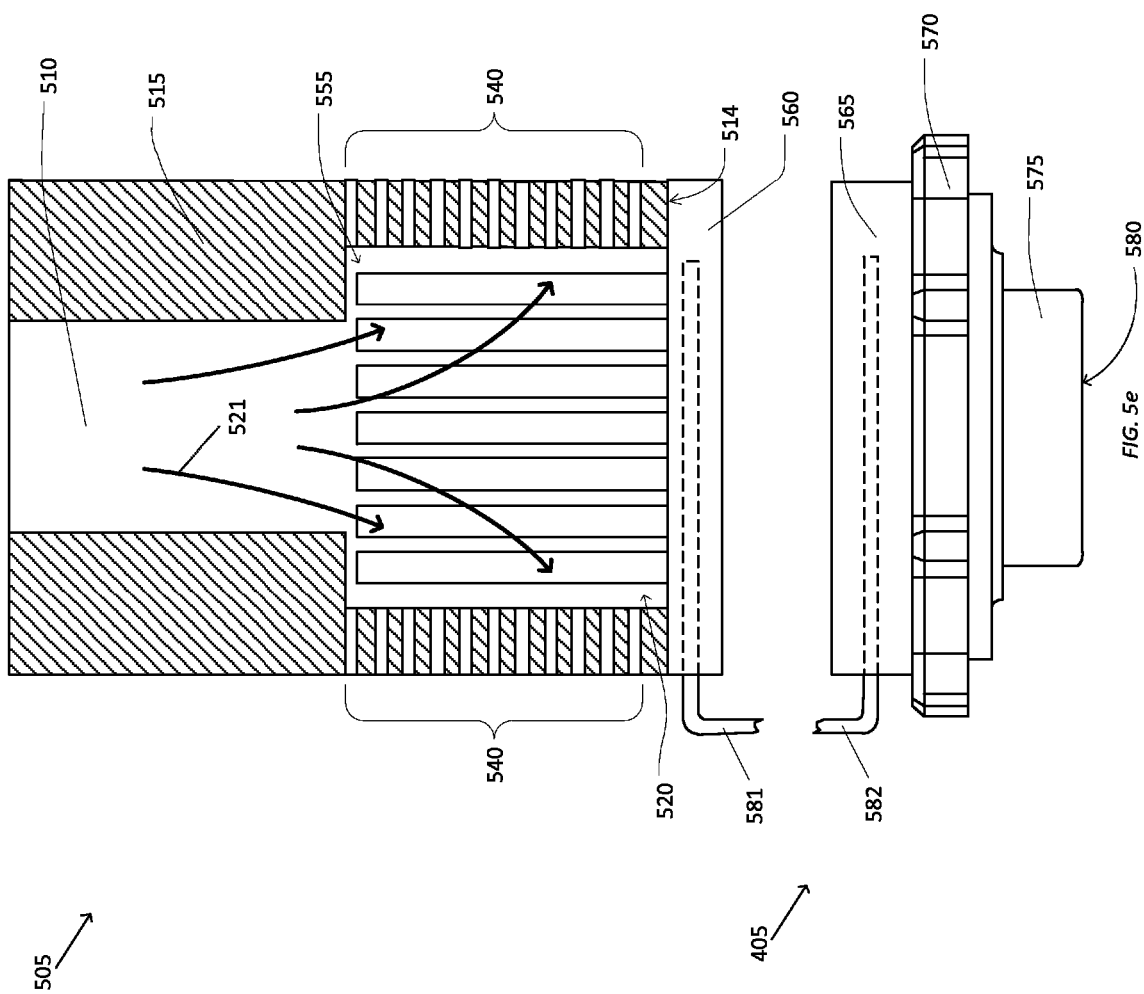

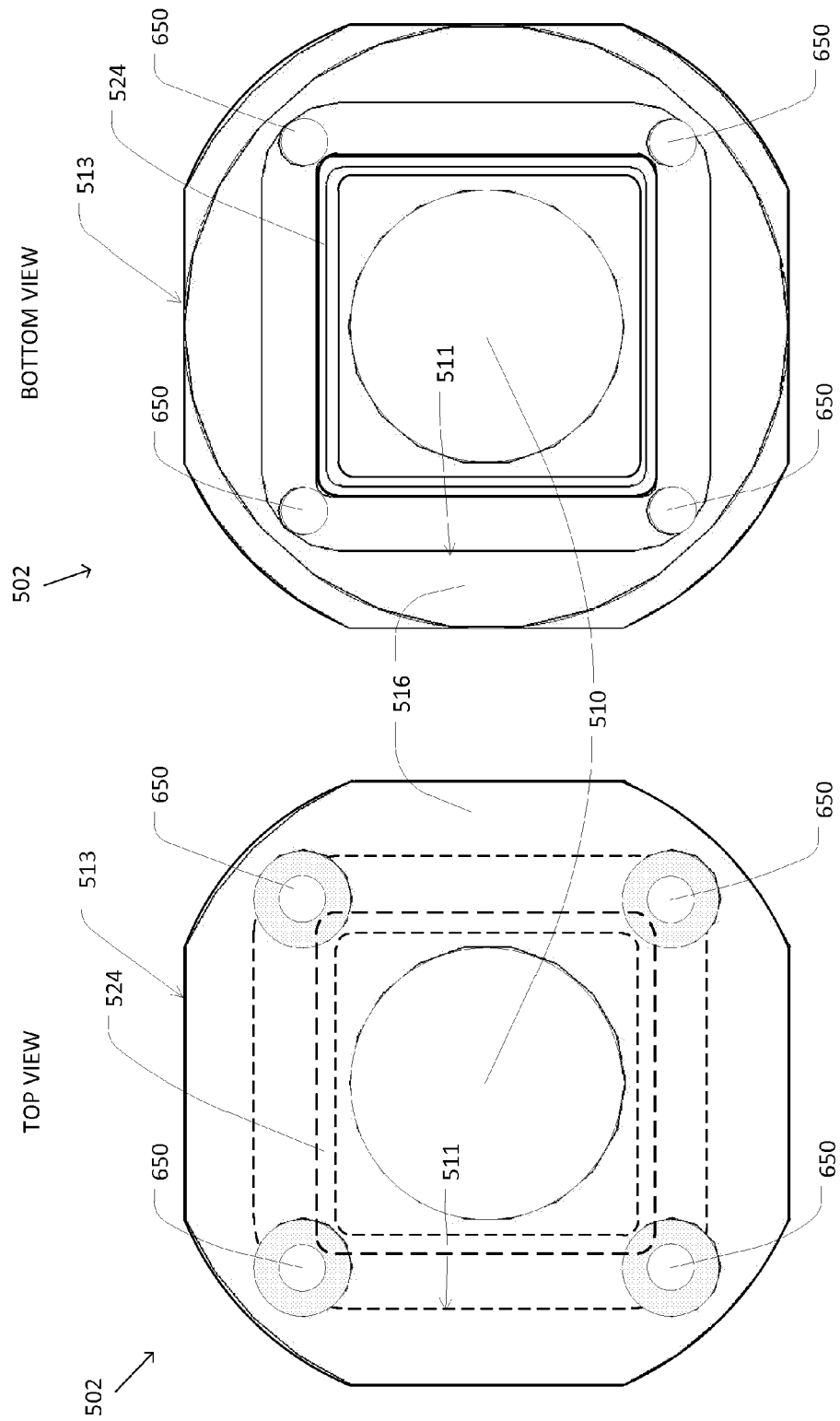

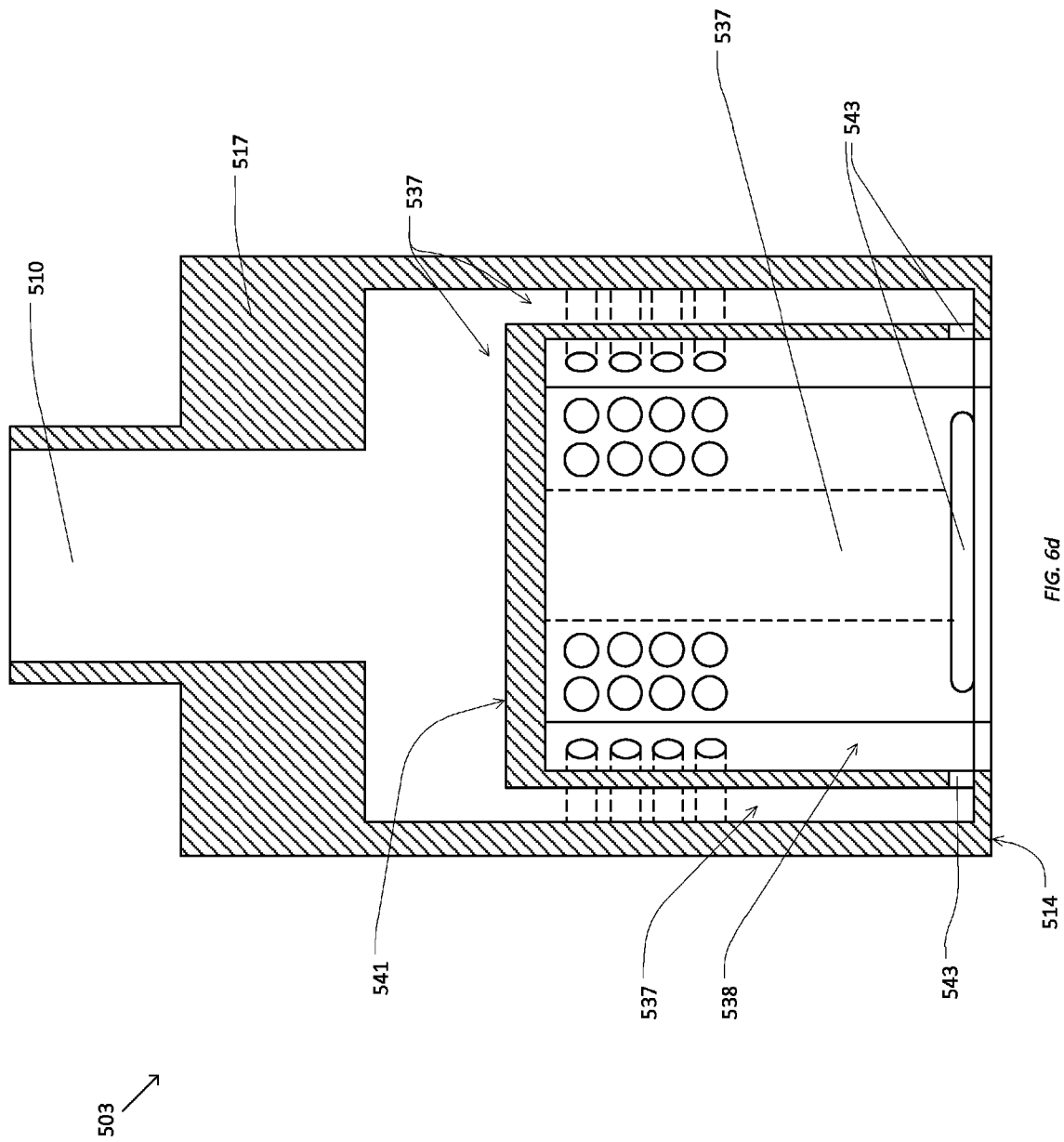

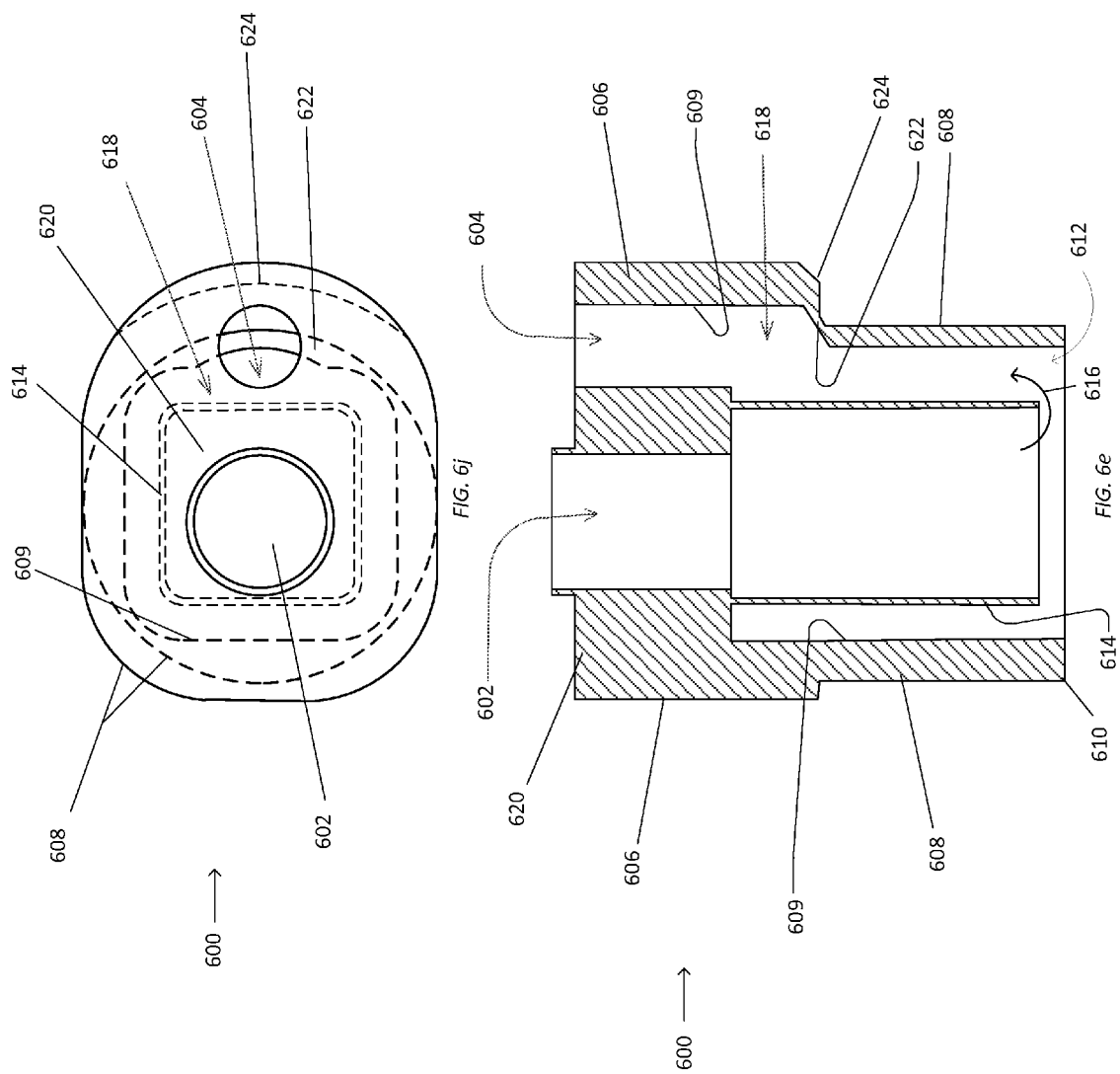

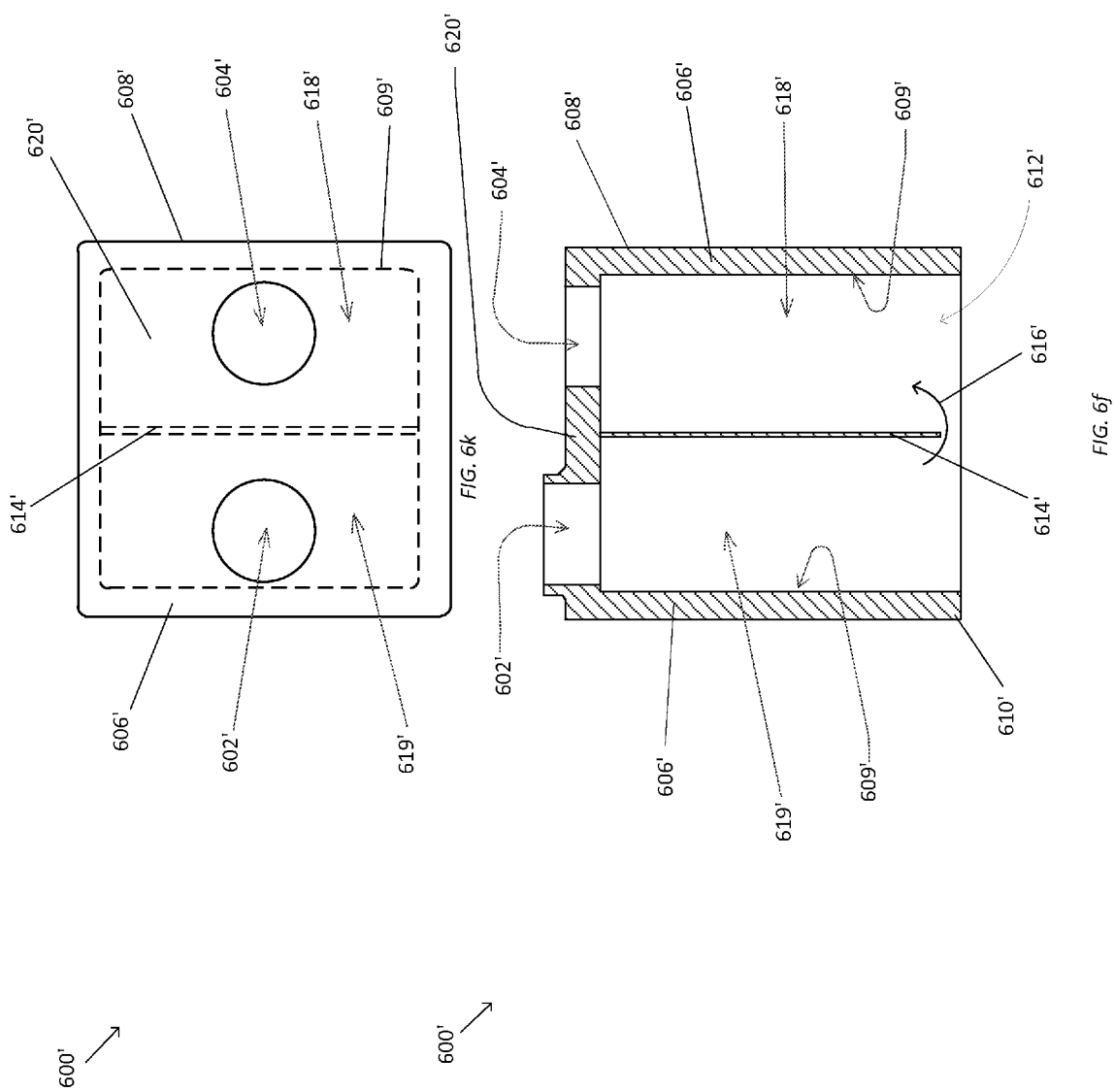

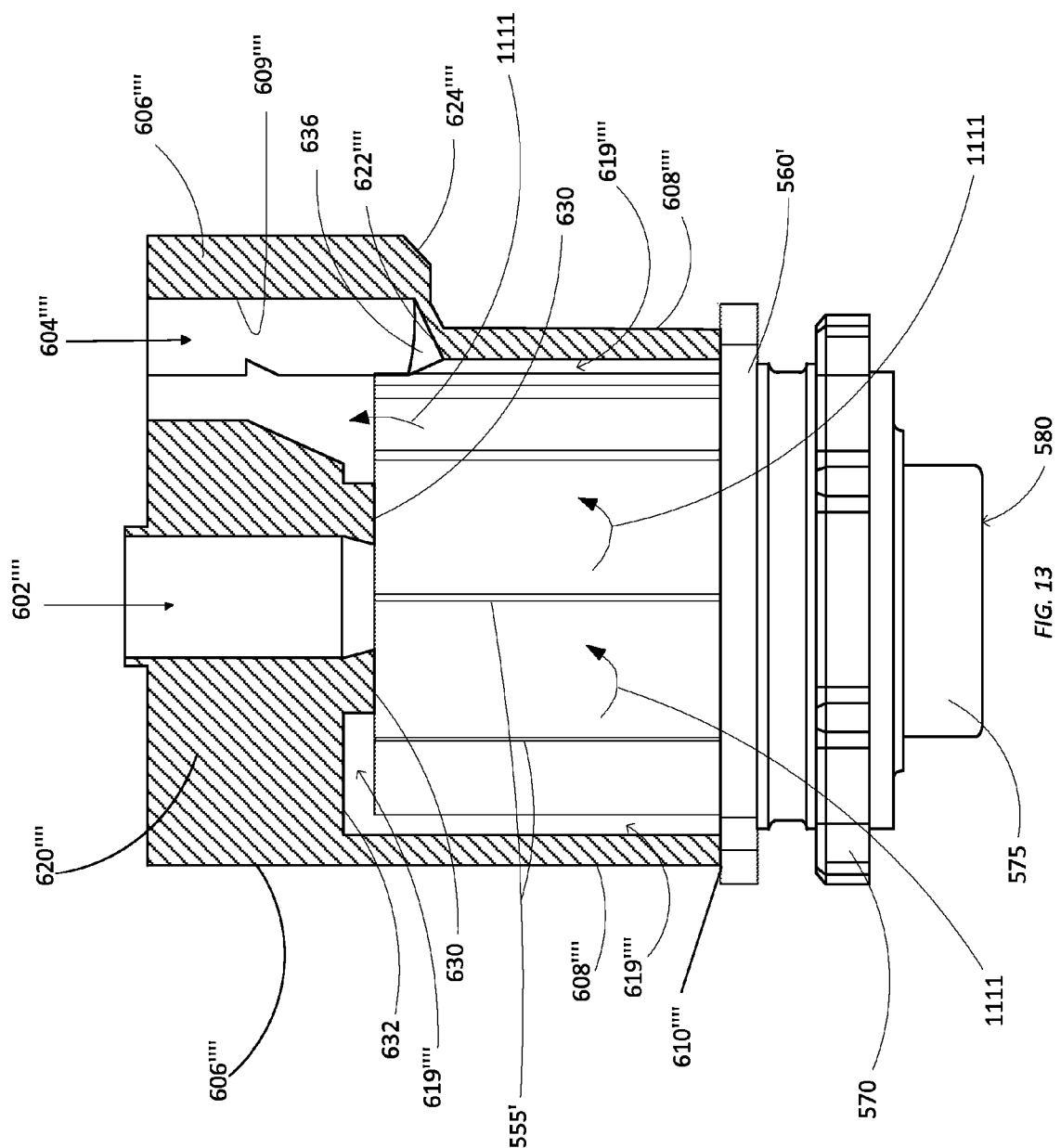

APPARATUS AND METHOD FOR RAMPING AND CONTROLLING THE TEMPERATURE OF A COMPONENT USING A VORTEX TUBE

CROSS-REFERENCES

This application claims the benefit of U.S. provisional app. Ser. No. 61/502,213 filed Jun. 28, 2011 and U.S. provisional app. Ser. No. 61/576,340 filed Dec. 15, 2011.

FIELD OF THE INVENTION

The present invention relates to a thermal ramping and control apparatus and method and specifically to an apparatus and method for ramping a device to cold and/or hot temperatures and controlling the temperature of the device at these temperatures, for example for testing of an electronic device.

BACKGROUND OF THE INVENTION

Prior Art Systems Using Vortex Tubes

Vortex tubes, such as those provided by Exair Corporation, come in a variety of sizes and models and are known to those of ordinary skill in the art of providing cooling, or alternately heating, capability to electronic and other operations.

A prior art system utilizing vortex tubes for cooling, and/or heating, of an enclosure includes U.S. Pat. No. 6,401,463 to Dukhan, et al. Dukhan teaches the use of a vortex tube with a system of chambers for simultaneous heating of one chamber of an enclosure containing battery components and cooling of another chamber of the enclosure containing other electronic components. Dukhan teaches the use of a vortex tube's output via a manifold to direct air onto specific components within an enclosure with the directed air passing into ambient air within the enclosure to help control ambient temperature in which a plurality of components function under normal operating conditions.

Another prior art system teaches the use of vortex tubes for cooling of components in a data storage system as shown in U.S. Pat. No. 7,751,188 to French et al. French teaches the use of one or more vortex tubes to generate and direct cold air over heat-generating components of an electronic system in a data storage cabinet. Hot exhaust from the vortex tube system is ducted from the cabinet to the ceiling through a chimney-like duct. As shown in FIG. 5 of the French patent, the system disclosed in French also uses a manifold to split and direct cold air output from a vortex tube to individualized electronic devices, such as CPUs. Thus, French is directed to the use of a vortex tube to direct air into cold air plates having within them radially extending fins, or baffling, for directing the cold air output from the vortex tube directly onto and over the surface of a CPU, the directed air then passing out through openings in the cold plates into ambient air within the cabinet to help control the ambient temperature in which a plurality of components function under normal operating conditions.

U.S. Pat. No. 7,263,836 to Gunawardana et al. teaches the use of a vortex tube to cool one or more components within a cooling chamber. The vortex tube is powered by a compressor that receives air from both the hot air outlet of the vortex tube and used air from the cooling chamber. A series of pressurized chambers and valves function in a closed-loop system to maintain the ambient operating temperature for electronics in the cooling chamber at appropriate operating temperatures.

None of the aforementioned systems has involved the application of vortex tubes for thermal control of testing of integrated circuits in the open where humans routinely occupy the same space as testing fixtures. Rather each has been applied within a cabinet, enclosure or data storage room not intended for frequent and consistent worker presence. Such testing in an open environment requires that extreme cold and hot air temperatures and noise generated during tests be prevented from unduly impacting workers in the test environment. Accordingly, none of the aforementioned systems has addressed the specific issues encountered in a testing-oriented thermal control scenario, such as the need for noise abatement while achieving rapid cooling and heating setpoint device temperatures, the need for rapidly heating and then cooling a single specific device in an enclosure, or the need for accurately cycling a device under test through a relatively wide range of setpoint temperatures in stepped sequence while testing and recording data for each chip tested.

Occupational Health Safety Administration standard 1910.95(a) for Occupational Noise Exposure, specifies that a worker may be exposed to a maximum noise level of 90 decibels (dBA) for a period of eight hours. Without a muffler, a single typical vortex tube operates at a noise level of over 100 decibels (dBA). With a typical muffler, a single vortex tube operates at a noise level of approximately 80-88 decibels (dBA). For a worker to be able to work around a plurality of simultaneously and continuously operating vortex tubes, the noise level of each vortex tube in operation would require significant noise reduction from existing levels to be safe for workers.

Prior art methods of employing a heatsink to cool electronic components have involved the use of a combination thermoelectric cooling device, a fan, or other cooler, together with a heatsink shroud for directing air from the fan over the heatsink, or vice versa for enhancing the cooling of the heatsink by removing heated air from the heatsink. Examples of such patents include U.S. Pat. No. 6,515,862 to Wong et al., for Heatsink Assembly For An Integrated Circuit; U.S. Pat. No. 6,637,502 to North et al., for Heatsink With Converging Device; and U.S. Pat. No. 6,876,550 to Sri-Jayantha et al., for Heatsink For High Power Microprocessors. None of these heatsink, fan and shroud type patents involve the use of fans and heatsinks in a testing environment for use for ramping a device under test (DUT) up or down to a temperature extreme for testing purposes.

Prior Art Thermal Control of Integrated Circuit Tests

It is highly desirable to test newly manufactured integrated circuits over a fairly wide range of operating temperatures on the order of −40° C. to 125° C., or in some cases even a wider range of temperatures between −55° C. to 150° C. Such testing enables a manufacturer to determine temperature extremes at which a chip will operate to in turn enable the manufacturer to certify that the chip is able to be operated at rated temperatures. This, in turn, determines to a degree the value of the chip in the marketplace and the types of applications for which the chip is suitable.

A typical integrated circuit test environment requires cycling rate requirements of a range of 0.3° C. to 2° C./second in a hot ramp to a hot setpoint, and a range of 0.2° C. to 0.5° C./second in a cold ramp to a cold setpoint.

Prior art methods of air-supplied temperature control for testing environments include fan-assisted heatsink assemblies, pressurized ambient air blown directly, or indirectly, onto a heatsink, housing or onto a device under test, or air supplied to an integrated heatsink and housing with, or without, assistance from one or more thermoelectric coolers and/or fans. The use of pressurized air and fan systems in a testing environment is noisy, requiring ear protection for workers working in that environment.

Other methods of controlling temperature of test equipment include liquid coolant assisted heatsink assemblies.

While water and other liquid coolants provide a satisfactory means of heating and cooling test fixtures, a problem with these devices is that at very cold temperatures, standard coolants tend to freeze. Alternate low-temperature coolants have been developed to deal with this problem, but they require special system components and are expensive. Also, since, liquids are corrosive and otherwise damaging to electronic components, there is a need to control the liquid with specialized apparatus and to monitor for leakages.

The lower ends of the required rate requirement ranges mentioned above correspond to normal bench top rates of about 300 seconds to attain −40° C. from 25° C. ambient, and similarly to 125° C. for hot ramp. The faster rate requirements mentioned above represent maximum values desirable in high repetitive cycling testing applications.

These maximum value ramp rates are not as conveniently attainable with prior art methods of thermal control requiring liquid thermal control systems which must account for and prevent corrosion to parts, condensation, freezing and the like.

Thermal control of such testing environments has required control of the temperature of the Integrated Circuits (ICs), sensor and other test elements, since variables in a DUT temperature can be introduced by an inability to precisely control the application of heat or cold to the DUT. As a practical matter, such testing normally occurs to a DUT within a testing socket, requiring that heat or cold being applied to the DUT also affects the temperature of the socket. Further, operation of the DUT during the test also generates a significant amount of heat. Thus, there is a need to control the amount of the heat/cooling applied to the DUT from and external source relative to the internal heat generated during operation of the DUT.

The use of heaters and/or coolers applied to a heatsink thermally connected with a DUT is not new. U.S. Pat. No. 7,187,189 to Lopez et al. teaches the use of a heater applied to a heatsink to control the temperature of a DUT similar to that of U.S. Pat. Nos. 5,164,661 and 5,420,521 to Jones.

Apparatus for cooling a DUT for test applications has included liquid coolants or forced air, using fans or air compression means, applied to a heatsink apparatus contacting the DUT. These apparatus have in some cases further comprised the use of one or more integrated thermoelectric coolers. Forced air, such as with fans or compressors, have also been used to apply the air stream directly to the DUT surface to be cooled during testing.

None of these patents or prior art methods discloses the use of output air from a vortex tube to cool or heat a DUT to the types of temperatures and in the time frames important to a successful production chip testing environment.

More accurate test results have been able to be performed by more accurately controlling the temperature of the DUT. Prior art methods of heating and cooling chips, for example in an oven without individual temperature control, have led to variable temperature characteristics for the device under test as a result of heat dissipation, radiation or convection within the oven and among the testing components in the oven.

Thus, there have been developed means of individually sensing, predicting and controlling temperature in individual IC test sockets as shown and described in U.S. Pat. No. 7,394,271 to Lopez et al.

Under normal circumstances operation of a vortex tube with normal ambient air temperature input has been capable of producing temperatures ranging from −46° C. to 127° C. In some testing applications to test components under extremely cold or extremely hot conditions it would be desirable to have colder temperatures, or hotter temperatures, than those of normal vortex tube capability with ambient air inputs. While it is known generally that a vortex tube will produce colder output based upon colder input, or hotter output based upon hotter input, specific methods of accomplishing pre-cooling or pre-heating suitable to a thermal control system for testing or other application to which the present invention is directed have not been disclosed.

Accordingly, while there has developed a need and ability to accurately and quickly control, stepwise transitioning of temperatures of individual ICs under a wide range of temperature test conditions, there has been lacking in the prior art an efficient and accurate method of heating and cooling individual ICs with pressurized air in a way that hasn't unduly impacted testing personnel with excessive noise, temperature or other undesirable chemical or other properties.

SUMMARY OF THE INVENTION

In accordance with an aspect of the invention there is provided thermal control apparatus adapted for use with a pressurized air supply, or optionally further comprising an air supply, for ramping a component to a temperature setpoint, the apparatus comprising: a vortex tube having an inlet adapted for connection with the pressurized air supply, a cold air outlet, and a hot air outlet; a ventilated mount comprising an inlet communicating with an inward hollowed chamber having a rim, the inlet of the ventilated mount connected to at least one of the outlets of the vortex tube; heat exchange means comprising a plurality of fins mounted on a base, the fins extending from the base into the inward hollowed chamber of the ventilated mount, the base of the heat exchange means adapted for sealed engagement with the rim of the chamber to form an enclosure for the fins of the heat exchange means, the base of the heat exchange means also making a thermal connection with the component; and means adapted to be operatively connected with the pressurized air supply for controlling the output temperature of the vortex tube so as to be adapted for ramping the component to a temperature setpoint. It should be noted in context of the present invention that ramping may, among other things, include ramping temperature upwardly to a hotter setpoint or ramping downwardly to a colder setpoint, whereas control in the context of the present invention may, among other things, comprise controlling temperature of a component at a certain setpoint for a particular dwell period.

In accordance with the embodiment disclosed for this aspect of the invention, there is provided the thermal control apparatus itself, as may be provided by a supplier or manufacturer of such apparatus, adapted for later use with a pressurized air supply for ramping a component to a temperature setpoint. Optionally, this aspect of the invention may comprise the foregoing system further comprised of a pressurized air supply, as the system may be used by a testing facility.

The apparatus in accordance with this aspect of the invention addresses the needs in the prior art for using air, or other suitable non-liquid form gas, for controlling the temperature of a discrete component by bringing the component to at least one temperature setpoint that is substantially different than ambient temperature, such as the ambient operating temperature of a component, whether it be a device under test or other component.

Since air is used, instead of a liquid such as water or a water and antifreeze mixture, there isn't a need to monitor and ensure that water does not leak onto the component or other apparatus which can cause electrical short circuits and damage other components. Further, the need to de-frost apparatus, or the component, exposed to frozen condensate is minimized with the present invention, where ramping to temperatures as high as 150° degrees Celsius, and as low as −55° degrees Celsius, is not uncommon.

Further, the present invention provides quick ramp times and accurate temperature control in connection with the relatively extreme temperature ramping requirements at a discrete location such as encountered in the testing of an electronic device, while at the same time providing for a significant reduction in noise from the output of the Vortex tube over normal non-muffled use, and even a significant reduction in noise from the output of the Vortex tube over existing muffled use.

The invention is preferably adapted for use with a pedestal serving as a framework or chassis for mounting testing apparatus, wherein the base of the heat exchange means resides on the pedestal, and wherein the chamber has an aperture therein, or alternately a plurality of apertures therein, for regulating the air flow out of the enclosure and enhancing the temperature of the air to which the fins of the heat exchange means are subjected within the enclosure during operation of the vortex tube. Preferably, the chamber of the invention is sized, the thickness of the chamber's walls are increased, and the chamber's exit aperture, or apertures, are sized and spaced so as to be adapted for regulating air flow within the enclosure to minimize temperature for cooling, or maximize temperature for heating, achievable within the enclosure without compromising operation of the vortex tube. An effective design of the chamber seeks to create a thermally insulated environment, while still allowing air to escape without undesirable noise or thermal performance impact.

Thus, in accordance with this aspect of the invention, and as applicable with other aspects and embodiments of the invention, the efficiency and noise abatement qualities of the temperature control apparatus can be fine-tuned. Fine-tuning of the system may obtain for optimizing, according to temperature, air pressure, noise level and possible condensation, the ability of the apparatus to efficiently accomplish temperature ramping and control capability to the temperature extremes contemplated in an electronic device testing scenario, whether hot or cold. And this efficiency in temperature ramping and control may be accomplished while minimizing noise and undesirable backpressure on the vortex tube which would render it otherwise ineffective to reach and maintain the temperatures desired.

Insulating effectiveness of the chamber may be enhanced by both wall thickness and choice of material. For a ventilating chamber comprised of a plurality of peripheral exit apertures, the wall thickness would have to be carefully chosen in order to prevent possible excessive back pressure on the vortex air delivery, which in turn would reduce performance. Thus, while increasing the thickness of the walls of the chamber to on the order of ½ of an inch or more, would generally reduce noise in the system, in the case of multiple exit aperture embodiments, this is limited by the fact that too much thickness in the walls would create excessive back pressure on the vortex system and inhibit performance. In multiple exit aperture embodiments of the invention, noise abatement also may be improved by minimizing size of exit air passages while maintaining a plurality of such to not restrict airflow. In single exit air passage embodiments of the invention, a single exit air passage, or port, may be utilized and sized appropriately, together with chamber wall thickness, to also tune the system for optimum performance, noise abatement and frost prevention.

In accordance with an alternate embodiment of this aspect of the invention, there is provided a pedestal having attached thereto means operatively connected with said heat exchange means for enhancing the efficiency of the heat exchange means for controlling the temperature of the component. Such means may comprise a thermoelectric cooler able to be configured with pre-set voltage and polarity settings to assist with ramping heating and/or cooling operations. With this embodiment of the invention, the base of the heat exchange means resides on and adjacent the thermoelectric cooler, wherein the rim of the chamber is adapted for engagement with the base of the heat exchange means to form an enclosure comprising the chamber and the base of the heat exchange means. Thus, the enclosure is closely adjacent the heat exchange means, and the chamber has either a single aperture, or a plurality of apertures, therein for regulating the air flow out of the enclosure and enhancing the temperature of the air, whether it be hot or cold air, to which the heat exchange means is subjected within the enclosure during operation of the vortex tube.

With, or without, a thermoelectric cooler, the apparatus of the present invention provides a contact interface connected to the pedestal, and thermally connected with the heatsink and/or thermoelectric cooler, if any, adapted for thermally engaging with the component. Still further, in an alternate embodiment of the invention, there is provided a contact interface adapted for contacting a plurality of devices for which thermal control is desirable. Also, this and other aspects of the invention may advantageously comprise means for relocating the apparatus from one component site to another. Or conversely, means for relocating successive new components or devices into thermal engagement with the apparatus of the present invention for ramping and/or controlling the temperature of the component or device.

In accordance with another aspect of the invention, there is provided specific apparatus for capability of the invention to provide both heating and cooling operations for a component, such as by controlling the temperature of a device under test to a plurality of pre-determined setpoints for testing. In such case, apparatus is provided wherein the inlet of the ventilated mount is adapted for selectable communication with both the cold and hot air outlets of the vortex tube. With this aspect of the invention, there is provided means operatively connected with the vortex tube outlets for controlling which outlet passes air into the ventilated mount for ramping and controlling the temperature within the enclosure, such as to one or more of a plurality of pre-determined setpoints.

With this aspect of the invention, there is provided the ability for alternatingly ramping to a hot temperature setpoint, say 150° C., followed by quickly ramping to a cold temperature setpoint, say −55° C., by activating, for example, a switch activating a solenoid controlling which air outlet is in communication with the ventilated mount for access to the component.

In accordance with another aspect of the invention, there is provided thermal control apparatus adapted for controlling the temperature of a component comprising: a pressurized air supply; a vortex tube having an inlet adapted for connection with the pressurized air supply, a cold air outlet, and a hot air outlet; a ventilated mount comprising an inlet communicating with an inward hollowed chamber having a rim, the inlet of the ventilated mount connected to at least one of the outlets of the vortex tube; heat exchange means comprising a plurality of fins mounted on a base, the fins extending from the base into the inward hollowed chamber of the ventilated mount, the base of the heat exchange means being adapted for sealed engagement with the rim of the chamber to form an enclosure for the fins of the heat exchange means, the base of the heat exchange means also making a thermal connection with the component; and means operatively connected with the heat exchange means for enhancing the efficiency of the heat exchange means for controlling the temperature of the component.

Preferably the base of the heat exchange means of this embodiment and aspect of the invention resides on a pedestal, framework or chassis, and the means operatively connected with the heat exchange means comprises a thermoelectric cooler having a plate with hot and cold leads for which voltage and polarity of inputs to the cooler may be set and changed. Thus, with this embodiment, preferably the base of the heat exchange means resides on and adjacent the thermoelectric cooler, wherein the rim of the chamber is adapted for engagement with the base of the heat exchange means to form an enclosure comprising the chamber and the base of the heat exchange means, the enclosure being closely adjacent the heat exchange means, and wherein the chamber has a plurality of apertures therein for regulating the air flow out of the enclosure and enhancing the temperature of the air to which the heat exchange means is subjected within the enclosure during operation of the vortex tube.

To make thermal contact with the component to be heated/cooled, the pedestal preferably further comprises a contact interface adapted for thermally engaging with the component. Further, with this and other embodiments of the invention, the pedestal may further comprise a cartridge heater retained within the pedestal for assisting with raising the temperature of the component.

Further in accordance with this aspect of the invention, an embodiment of the invention is provided wherein the inlet of the ventilated mount is in selectable communication with both the cold and hot air outlets of the vortex tube, and there is provided means operatively connected with the vortex tube outlets for controlling which outlet passes air into the ventilated mount for ramping and controlling the temperature within the enclosure, such as to one or more of a plurality of pre-determined setpoints, whether they be hot or cold setpoints.

In accordance with this, and other, aspects of the invention, there is advantageously provided recording means adapted for recording the component's activity at a particular temperature setpoint. Such systems, including control apparatus, test measurement and recording systems, are generally known in the art of testing semiconductor devices, comprising a controller having a user interface, various input/output connections for inputs to the controller being used to sample measured current conditions and other device operating parameters or metrics and outputs being used to control effectors such as vortex tube, heaters, coolers, etc. The controller is able to be programmed to perform an automated sequence of steps involved in a particular test, such as supplying pre-determined temperature setpoints and taking action based upon the input values. A system for recording and storing measured parameters and metrics is operatively connected to the controller comprising data storage means well known in the art. An example of a known semiconductor testing device is demonstrated in U.S. Pat. No. 7,394,271 to Lopez et al. and related references. In the '271 patent, current consumption of the device under test is measured under a variety of temperature conditions. Other measurements of the device are possible with such a system.

Thus, the system is preferably fully adapted to a lab, or even a production, electronic device test scenario, where the device is operated at varying temperature setpoints and device operation speed and accuracy is able to be tested and recorded for later rating and marking of the electronic device. As part of the recording mechanisms, there is provided a temperature sensor retained within, or adjacent, the pedestal for transmitting temperature values to the recording means.

Preferably, in accordance with this and other aspects of the invention, whether in a thermoelectric cooler embodiment, or not, there is provided in an alternative embodiment means internal of the chamber of the ventilated mount for directing air flow from the inlet of the ventilated mount to adjacent the base of the heat exchange means, and wherein the aperture, or apertures, in the chamber are spaced a distance from the base of the heat exchange means to encourage air flow from the base of the heat exchange means, traveling along and adjacent the length of the fins of the heat exchange means and exiting through one or more apertures. Thus, in this alternative embodiment, the air from the vortex tube is directed to the base of the heat exchanger fins, after which it travels along the fins towards and out the aperture, or apertures, in the ventilated mount which is, in a preferred single aperture embodiment, or are in an alternate multiple aperture embodiment, positioned adjacent the upper ends of the fins of the heat exchange means.

In accordance with yet another embodiment of this aspect of the invention comprising the addition of means for enhancing the effectiveness of the vortex tube and ventilated mount at ramping and controlling the temperature of a component, there is provided a heat pipe having first and second ends, the heat pipe being in thermal contact at the first end with the component and at the second end with the heat exchange means, and wherein the second end of the pipe extends within the enclosure formed by the ventilated mount and the base of the heat exchange means. In this way, the heat pipe may create a more efficient pathway for heat transfer between the heat exchange means exposed to the vortex tube and the device under test.

In accordance with another aspect of the invention, there is provided apparatus for ramping and controlling the temperature of a device under test comprising: a pressurized air supply; means for selecting at least one target temperature setpoint; a vortex tube having an inlet adapted for connection with the pressurized air supply, a cold air outlet, and a hot air outlet; means for mounting at least one outlet of the vortex tube for directing outlet air from the vortex tube onto the device; and means operatively connected to the pressurized air supply for regulating the pressure of air input to the vortex tube in accordance with parameters from the means for selecting at least one target temperature setpoint.

In accordance with another aspect of the invention, there are provided methods of testing a device in accordance with the present invention. For a burn-in test, the steps of the method for burn-in testing of a device at an operating extreme temperature using a vortex tube having outlet air directed at the device under test comprises the steps of: selecting at least one target temperature setpoint for the device; adjusting inlet air pressure control to the vortex tube in accordance with the selected target temperature setpoint; operating the device under test to the device's maximum performance capability at the first target temperature setpoint; collecting performance data of the device at the first target temperature setpoint; and approving the device for operation.

For a performance rating test, there is provided a method of testing a device at varying temperatures using a vortex tube having outlet air directed at the device under test comprising the steps of: selecting a plurality of target temperature setpoints for the device; adjusting inlet air pressure control to the vortex tube in accordance with a first selected target temperature setpoint; operating the device under test to the device's maximum performance capability at the first target temperature setpoint; collecting performance data of the device at the first target temperature setpoint; adjusting inlet air pressure control to the vortex tube in accordance with a subsequent selected target temperature setpoint; operating the device under test to the device's maximum performance capability at the subsequent target temperature setpoint; collecting performance data of the device at the subsequent target temperature setpoint; and marking the device according to its measured capability.

For further enhancing the efficiency of the vortex tube to ramp and hold temperatures for testing purposes, the method further provides the step of making an adjustment to voltage and polarity settings on a thermoelectric cooling device thermally connected with the device under test in accordance with an adjustment to the inlet air pressure control to the vortex tube both in accordance with a first selected target temperature setpoint.

In yet another aspect of the invention, there is provided a combined ventilated chamber mount and heatsink apparatus adapted for use in a thermal control system and for directing pressurized air from a vortex tube to ramp the temperature of a discrete target zone comprising: a ventilated mount air chamber comprising an inlet port adapted for receiving an air supply from a vortex tube system, the ventilated mount air chamber further defining at least one airflow aperture for the discharge of air; a heatsink comprising fins extending from a base member, the base member of the heatsink being mounted to the chamber such that the fins of the heatsink extend within the chamber so as to be adapted for exposure to the air supply; and a pedestal assembly which provides a contact interface with the target zone.

To provide additional temperature control capability of this aspect of the invention, the combined ventilated chamber mount and heatsink apparatus may further comprise a thermoelectric cooler interposed between the heatsink and the pedestal assembly.

With this aspect of the invention, a unique subsystem that addresses the deficiencies of the prior art, namely liquid-based thermal control systems that are prone to leakage and corrosion, or alternatively fan-based systems which are noisy and less efficient in their thermal control performance characteristics, is provided. The chamber/heatsink combination subsystem of this aspect of the invention allows adaptation to a dry, readily available, compressed air source from an efficient and reliable vortex tube apparatus that allows application of pressurized air to high and low temperature extremes desirable for component testing purposes.

The invention allows ramping to and control at a design target setpoint temperature, for reference as indicated by the pedestal contact zone, via a mechanical contact. For semiconductor test, this would imply the surface temperature of a DUT, be it of typical package construction or an exposed die. Also, this surface or may or may not have an inherent power dissipation which must be additionally thermally "pumped" into the heatsink system as with a thermoelectric cooler or heat pipe subsystem. The larger the power dissipation of the DUT and testing inputs, the more capable the heatsink system needs to be. This requirement has usually implied standard use of larger heatsinks, larger airflow and/or colder or hotter air temperatures.

The surface size of a DUT may vary, and this dictates the dimensional constraints of the system; the pedestal contact zone typically will match the required (device) target surface, and the overall girth dimensions of the heatsink assembly system can be dictated by electronic board constraints, or socket-to-socket spacing, as examples. These dimensional constraints may also dictate whether the vortex cooler system can be placed in close proximity to the heatsink system; typically there would be physical extensions, both mechanical and electrical extensions, between the two systems requiring connecting members.

The operation of the heatsink assembly consists typically of hot or cold mode setpoints. These can usually be attained by supplying the heatsink with an air flow and reduced or elevated temperature, either cold or hot compared with ambient. The heatsink itself, having an integral or separate pedestal assembly, could provide the needed requirements for a thermal target to which the output of a vortex tube may be directed. If a thermoelectric cooler is included in the assembly, it will dramatically improve both hot and cold mode operations, since substantial temperature differentials can be attained with such a thermoelectric subsystem.

By providing a suitable cold airflow, from the vortex system, setpoint temperature can be targeted by operating the heatsink system with a thermoelectric cooler. If maximum cold air temperatures are sought, that is for cold mode setpoint, then typically the vortex cooler system would need to be tuned for maximum cold temperature or refrigeration delivery, implying least amount of airflow cold fraction at highest possible air pressure. Conversely, maximum hot air temperature can be attained with larger cold fraction, that is for hot mode setpoint operations.

It will be appreciated by those of ordinary skill in the art that while air is the primary gas with which the vortex tube is operable to accomplish the purposes of the invention, other gases that are compatible for use with the apparatus disclosed and the component concerned would fall within the true scope and spirit of the claims of the invention appended hereto. For example, it is conceivable that nitrogen gas may be used with the present invention without modification to the apparatus of the invention or the methods described. Use of such may have the beneficial effect of retarding flame and/or operating to cooler temperatures.

In accordance with another aspect and embodiment of the invention, there is provided thermal control apparatus further comprising an air pre-conditioning subsystem adapted for providing enhanced temperature air to the inlet of a vortex tube of the vortex tube system of the invention.

More specifically, the thermal control apparatus air pre-conditioning subsystem further comprises: a heat exchanger having a first inlet adapted for receiving pressurized air from said pressurized air supply, a second inlet adapted for selectably receiving part of the outlet air from at least one of the outlets of the vortex tube, the heat exchanger also comprising a first outlet adapted for supplying air to the inlet of said vortex tube adapted for connection with the pressurized air supply and a second outlet for supplying exhaust, wherein the heat exchanger is adapted for at least one of pre-heating and pre-cooling the pressurized air source prior to receipt by the vortex tube.

Optionally, and in accordance with another embodiment of the invention, instead of allowing for receipt by the heat exchanger of essentially partial, bleed outlet from the vortex tube upstream from application of vortex tube output to a device, the second inlet of the heat exchanger is instead adapted for receiving recovered exhaust air from the ventilated mount.

In an alternative embodiment of such an air pre-conditioning subsystem there is provided another vortex tube having an inlet adapted for constant, or alternatively selectable, receipt of air through its connection with the pressurized air supply, a cold air outlet, and a hot air outlet; and a heat exchanger having a first regulated inlet adapted for receiving pressurized air from the pressurized air supply, a second inlet adapted for receiving the outlet air from at least one of the outlets of the another vortex tube, the heat exchanger also comprising a first outlet for supplying air to the inlet of the vortex tube of the vortex tube system and adapted for connection with the pressurized air supply and a second outlet adapted for supplying exhaust, wherein the heat exchanger is adapted for at least one of pre-heating and pre-cooling the pressurized air source prior to receipt by the vortex tube.

In this alternative aspect and embodiments of the invention, pre-condition of air supplied to the thermal control system of the invention enables greater temperature ramping, control and range performance of the system. With pre-cooling, temperatures as low as −55° C. as measured at the pedestal surface are achievable.

In accordance with another aspect of the invention, downstream bleed air from the vortex tube system may be used to cool other testing or thermal control apparatus, such as a printed circuit board, a test socket, or other device in the environment needing cooling.

In accordance with another aspect of the invention, there are provided other alternate embodiments of the invention wherein the chamber of the ventilated mount further comprises a single exit aperture therein for regulating the air flow out of the enclosure and enhancing the temperature of the air to which the fins of the heat exchange means are subjected within the enclosure during operation of said vortex tube. While this embodiment of the ventilated mount may be used for a non-regenerative-type temperature control system as described above, it is particularly suited for a regenerative-type temperature control system where pre-conditioning of air is accomplished with a heat exchanger before delivering the pressurized air to the vortex tube for operation of the system.

As with previous embodiments of the invention, these embodiments of the invention are adapted for use with a pressurized air supply, or may include a pressurized air supply, a vortex tube for directing output air at a component to be cooled or heated and may be combined with other subsystems, such as a pedestal with a thermal electric cooler, or not, a finned heat-exchange means, or not, with an air-pre-cooling subsystem, such as a heat exchanger or another vortex tube, or not, with temperature control apparatus, such as is operatively connected with a pressurized air supply, and logic for ramping temperature up and down, and with other modifications to the chamber of the ventilated mount (such as varying the thickness of the walls of the chamber) to enhance thermal and noise abatement characteristics of the system, all without departing from the true scope and spirit of the invention as claimed. Thus, it will be appreciated by those of ordinary skill in the art with the benefit of this specification that there are various combinations of elements described herein that may be combined and mixed and matched with the basic subsystems disclosed, to achieve desired temperature control characteristics without departing from the true scope and spirit of the invention.

Preferably, in accordance with this aspect of the invention and alternate embodiments, the exit aperture of this embodiment of the invention is sized and located so as to be adapted for regulating air flow within the enclosure to maximize the magnitude of temperature achievable within the enclosure without compromising operation of the vortex tube.

With any of the aforementioned embodiments in accordance with this aspect of the invention, as with previous embodiments, the ventilated mount may be employed with a pedestal and heatsink, or other heat exchange means, wherein the base of the heat exchange means resides on the pedestal, and wherein the chamber of the ventilated mount further comprises an exit aperture therein for regulating the air flow out of the enclosure and enhancing the temperature of the air to which the fins of the heat exchange means are subjected within the enclosure during operation of the vortex tube. These embodiments may also be employed with a heat pipe version of the pedestal and heat exchange means.

In accordance with embodiments of the invention comprising a single aperture in the ventilated mount used in connection with an air-precooling subsystem, in another aspect of the invention, the invention further comprises a conduit, such as a flexible hose, pipe or other conduit known in the art, interconnecting the exit aperture and air pre-conditioning subsystem. This aspect of the invention further enables the capturing of exhaust from the ventilated mount for re-use, regeneration, recirculation of conditioned air in an air pre-conditioning or pre-cooling subsystem, such as a heat exchanger.

Thus, in accordance with this aspect of the invention, the air pre-conditioning subsystem, as described previously in connection with other embodiments of the invention, may further comprise: a heat exchanger having a first inlet adapted for receiving pressurized air from the pressurized air supply, a second inlet adapted for selectably receiving part of the outlet air from at least one of the outlets of the vortex tube, the heat exchanger also comprising a first outlet adapted for supplying air to the inlet of the vortex tube adapted for connection with the pressurized air supply and a second outlet for exhaust, wherein the heat exchanger is adapted for at least one of pre-heating and pre-cooling the pressurized air source prior to receipt by the vortex tube. It will be appreciated that the conduit may be used, as needed, with varying configurations of air pre-conditioning subsystems, or even without an air pre-conditioning system but for other purposes, without departing from the scope of the invention.

In accordance with another aspect of the invention and in connection with the single exit aperture embodiments of the invention, there is provided a baffle internal of the chamber of the ventilated mount for directing airflow from the inlet of the ventilated mount to adjacent the base of the heatsink, or heat exchange means. In such case, preferably the exit aperture of the chamber is located opposite the base of the heat exchange means to further encourage air flow from the base of the heat exchange means to travel along and adjacent the length of the fins of the heat exchange means toward the exit aperture.

In an embodiment of the invention further comprising such a baffle, the ventilated mount comprises an inverted cup-shaped member having a partially closed end, or alternately a side wall, through which the inlet communicates and an open end adjacent the rim of the ventilated mount, wherein the baffle comprises a partially enclosed cup-shaped (circumferential type) hood having a partially closed end depending from the partially closed end of the ventilated mount such that the inlet communicates through both the chamber and the baffle, the baffle having a cup wall terminating in a circumferential rim suspended above the base of the heat exchange means when the rim of the chamber is engaged on the base of the heat exchange means, and wherein the cup wall of the baffle partially separates the inlet and the exit aperture such that air flowing through the chamber passes beneath the suspended rim of the baffle to the exit aperture.

In another embodiment of the invention further comprising such a baffle, the ventilated mount comprises an inverted cup-shaped member having a partially closed end through which the inlet communicates and an open end adjacent the rim of the ventilated mount, wherein the baffle comprises a wall having first and second ends and partially dividing the chamber between the inlet and the exit aperture, the baffle wall forming an inlet chamber and an exit chamber, the first end of the baffle wall depending from the partially closed end of the cup and such that the second end of the baffle wall is suspended above the base of the heat exchange means when the rim of the chamber is engaged on the base of the heat exchange means and such that air flowing through the chamber passes beneath the suspended second end of the baffle wall to the exit aperture. The baffle wall may extend downwardly from the cap top portion of the mount, extend fully between two side walls of the mount, or extend from one wall of the mount to closely adjacent an opposing wall of the mount to allow passage of air around the baffle wall.

While three primary heatsink types have been tested, pin-fin style, a curve-fin (i.e., involute) style, and straight-fin style heatsinks, it will be appreciated by those of ordinary skill in the art that other configuration types of heatsinks may be employed without departing from the true scope and spirit of the invention.

Design for performance and noise abatement optimization of the ventilated mount chamber, its thickness, its inlet aperture and its outlet aperture, or apertures, is dependent upon the type of heat sink employed and further depends upon physical requirements, such as, for example, whether or not regeneration or pre-cooling is used, the number and location of inlet and exhaust ports, or connection lines, the direction of desired airflow for a particular application and testing site size constraints including such considerations as the number of devices to be tested simultaneously. With any of the foregoing described heatsink styles, a ventilated mount chamber comprising multiple exit apertures for exhausting the chamber air may be implemented.

With a regenerative design system, having for example a single topside inlet and a single topside outlet, where exhaust from the ventilated mount chamber is recirculated into the vortex tube form the outlet atop the chamber, certain design criteria are beneficially employed to specifically match the ventilated mount chamber with a chosen heatsink type. More specifically, with a pin-fin style heatsink, a chamber having a side or top inlet with multiple side outlets, or a single side or top outlet, may be used, and a chamber having an internal baffle, either a wall or a circumferential baffle, partially separating inlet and outlet chambers, is advantageous for enhancing airflow through the system.

With a curve-fin style heatsink, a chamber having a top centrally-located inlet, together with either side peripherally-located multiple exit apertures, or a single topside or side peripherally located exit outlet, may be employed, and an internal baffle is not needed with this heatsink chamber combination. With the curve-fin style heatsink, the inlet should be sealed with the inlet port against the topside opening of the heatsink, to prevent immediate side-bypass of pressurized air directly to the exit port. Further, some space allowance between the rest of the top of the chamber and the heat sink fins, as shown, allows for more optimal pressure-drop characteristics.

With a straight-fin style heatsink, either a top, or side peripheral, single inlet and top, or side peripheral, single outlet may be used, or a top, or side peripheral, inlet with a plurality of side apertures may also be employed. A central baffle helps direct airflow for enhanced performance, and clearance between the chamber top and side walls allows for increased airflow through the heatsink.

The straight-fin and curve-fin designs provide comparable increased surface area improvement for more optimal heat transfer compared with the pin-fin style heatsink. However, if a side-air-flow port configuration is necessary as a system requirement, a pin-fin style may be more appropriate, since it inherently allows for better omni-directional airflow paths.

Of course, any of the aforementioned baffle embodiments may be used, or mix and matched, with, or without, air pre-conditioning systems of varying types as further set forth in the claims without departing from the true scope and spirit of the invention. Further, as set forth with previous embodiments of the invention, either of the baffle systems of these later described embodiments of the invention are provided that may be used with thermoelectric coolers, fans, heat pipes and the like and that interleave between fingers, fins or pins of a heat exchanger on a pedestal for directing airflow from the inlet of the chamber advantageously over the fins of the heat exchange means. Thus, as a more general example, the invention in accordance with this aspect and embodiment of the invention further comprises a baffle internal of the chamber of the ventilated mount for directing airflow from the inlet of the ventilated mount to adjacent the base of the heat exchange means, and wherein the exit aperture of the chamber is located opposite the base of the heat exchange means to further encourage air flow from the base of the heat exchange means to travel along and adjacent the length of the fins of the heat exchange means toward the exit aperture.

Still further, it will be appreciated that the various baffle embodiments set forth, used with or without the various air pre-conditioning systems described, may or may not be used in connection with a flexible, or non-flexible, conduit interconnecting the exit aperture and the second inlet of the heat exchanger, such that air flowing through the chamber passes beneath (or alternately around) the suspended second end of the baffle wall to the exit aperture and out the conduit to the air pre-conditioning system. As will be appreciated by those of ordinary skill in the art with the benefit of this disclosure, and as previously described, these combinations including baffled chambers and conduits may be made with either the bleed air pre-conditioning subsystem or the exhaust air pre-conditioning subsystems described above without departing from the true scope and spirit of the invention. In configuring such a system, care must be maintained to not put undue pressure on the vortex tube used for ramping temperature of the target component for heating or cooling. Further, various muffler systems may also be employed for noise abatement purposes as long as such do not unduly impact performance of the system, it being the case that inlet and exit apertures, including their sizes, the chamber size and wall thickness, and pressures introduced into the system by conduits, all must be designed and integrated into an overall effective system as further described herein.

The subject matter of the present invention is particularly pointed out and distinctly claimed in the concluding portion of this specification. However, both the organization and method of operation, together with further advantages and objects thereof, may best be understood by reference to the following descriptions taken in connection with accompanying drawings wherein like reference characters refer to like elements.

BRIEF DESCRIPTION OF THE DRAWINGS

FIG. 5a is a front partial cross-section, partially exploded view of an apparatus for controlling the temperature of a component in accordance with an embodiment of the invention;

FIG. 5b is a front partial cross-section, partially exploded view of an apparatus for controlling the temperature of a component in accordance with another embodiment of the invention;

FIG. 5c is a front partial cross-section, partially exploded view of an apparatus for controlling the temperature of a component in accordance with yet another embodiment of the invention;

FIG. 5e is a front partial cross-section, partially exploded view of an apparatus for controlling the temperature of a component in accordance with another embodiment of the invention;

FIG. 6b is a top view of the ventilated mount portion of apparatus for controlling temperature of a component in accordance with the apparatus shown in FIG. 6a;

FIG. 6c is a bottom view of the ventilated mount portion of apparatus for controlling temperature of a component in accordance with the apparatus shown in FIG. 6a;

FIG. 6d is a front cross section view of a preferred embodiment of a ventilated mount portion of apparatus for controlling temperature of a component in accordance with an embodiment of the invention;

FIG. 6e is a side orthogonal cross section view of a ventilated mount portion of apparatus for controlling temperature of a component in accordance with another embodiment of the invention;

FIG. 6f is a front cross section view of another ventilated mount portion of apparatus for controlling temperature of a component in accordance with yet another embodiment of the invention;

FIG. 6j is a top orthogonal view of a ventilated mount portion of apparatus for controlling temperature of a component in accordance with the embodiment of the invention shown in FIG. 6e;

FIG. 6k is a top orthogonal view of a ventilated mount portion of apparatus for controlling temperature of a component in accordance with the embodiment of the invention shown in FIG. 6f;

FIG. 11a is a perspective view of an alternate involute curve-fin heatsink apparatus for use as part of the present invention;

FIG. 11b is a top plan view of the involute curve-fin heatsink apparatus shown in FIG. 11a;

FIG. 13 is a front partial cross section view of an apparatus for controlling the temperature of a component in accordance with an alternate embodiment of the invention.

DETAILED DESCRIPTION

System Overview

Figure 1:
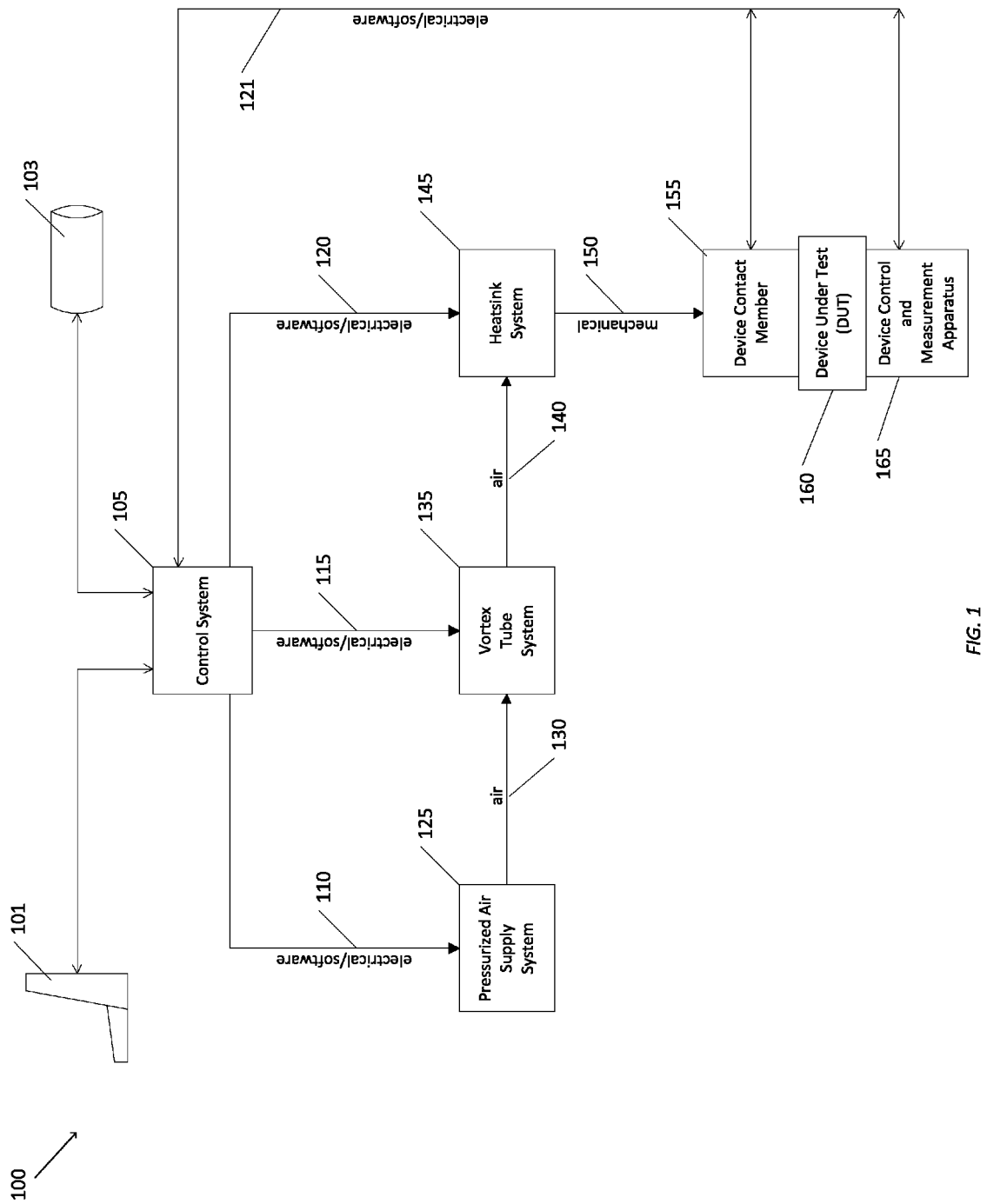
FIG. 1 is an overview schematic flow diagram of a system in accordance with one embodiment of the present invention.

Referring to FIG. 1, an overview of a preferred embodiment of a thermal control apparatus and system 100 for ramping and/or controlling the temperature of a component or a device under test (DUT) is provided. This embodiment of the system and apparatus comprises a control system 105 operatively connected via software and electrical means 110, 115, 120 to each of a pressurized air supply 125, a vortex tube system 135 and a heatsink system 145 to allow thermal control of a component, or device, via mechanical means 150 having a device contact interface member 155. Control for programming, measuring, recording and storing of test results of a device under test 160 are shown with control system 105, user interface 101 and electrical/software inputs/outputs 121 to a device control and measurement apparatus in 155 and 165 as are known in the art. It should be noted in context of the present invention that ramping may, among other things, include ramping temperature upwardly to a hotter setpoint or ramping downwardly to a colder setpoint, whereas control in the context of the present invention may, among other things, comprise controlling temperature of a component at a certain setpoint for a particular dwell period.

One embodiment of the invention comprises a system as shown in FIG. 1 with subassembly components as shown and described above. The air connections between the subassemblies would typically consist of tubing or hard piping with associated standard fittings. Each of the sub-systems have particular engineered variations as further described herein. Valves are typically suitably comprised of solenoids which enable automatic, electrically controlled, operation, but could also be of the manual type.

Figure 2:
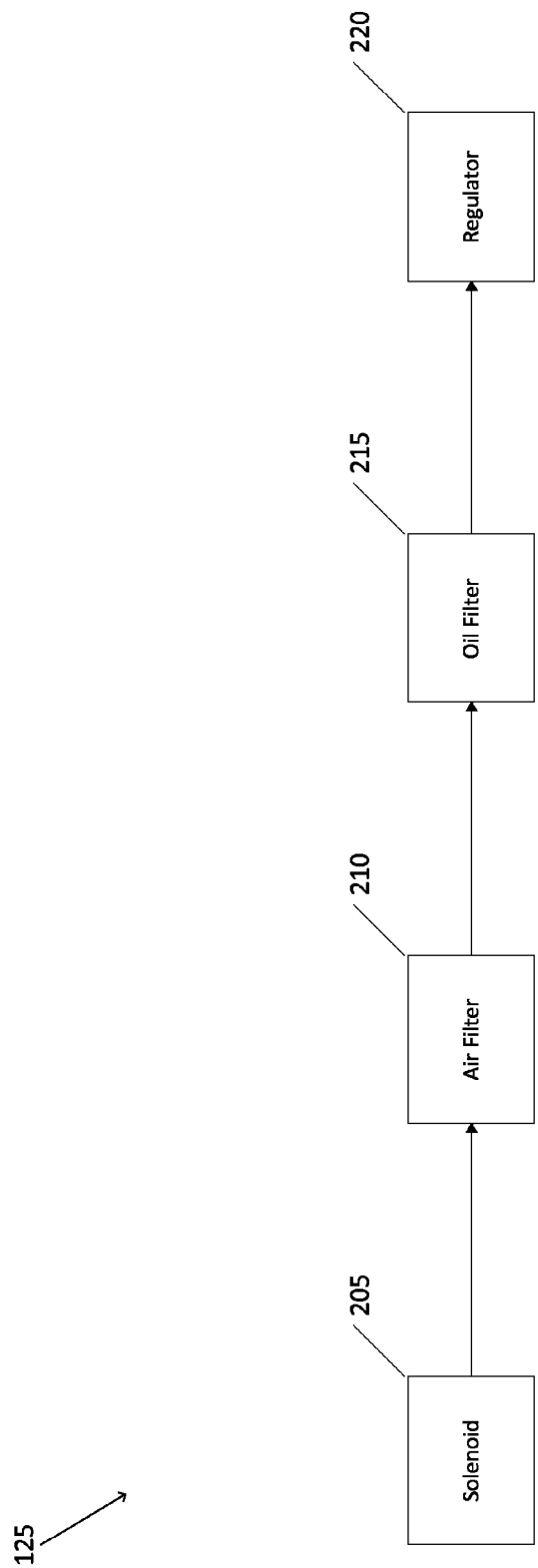
FIG. 2 is a schematic flow diagram of a system for controlling a pressurized air source for supply to an apparatus and method of the present invention.

Referring now also to FIG. 2, a pressurized air supply system 125 for the apparatus of the invention allows controlled release of pressurized air from a pressurized air tank (not shown) via the use of a solenoid controlled valve 205 that is electrically operated via software actuation means of the control system 105. At 125 and 130 (FIG. 1) the air passes through a high pressure air filter 210 and oil filter 215 into an air pressure regulator 220 for adjusting the pressure of the air for delivery to the vortex tube system 135. Air pressure regulator 220 may be digitally or manually controlled.

The pressurized air input may be provided by a central plant compressor or appropriate portable unit. The regulation of the air supply can be locally controlled, manually or electrically, using a solenoid, regulator or combination thereof, along with standard filtration components as commonly known in the art. Regulation and filtering of the air supply is necessary for optimal vortex tube operation, whereby higher pressures will provide for colder temperature at lower cold fractions.

Vortex Tube Subsystem Examples

Figure 3A:
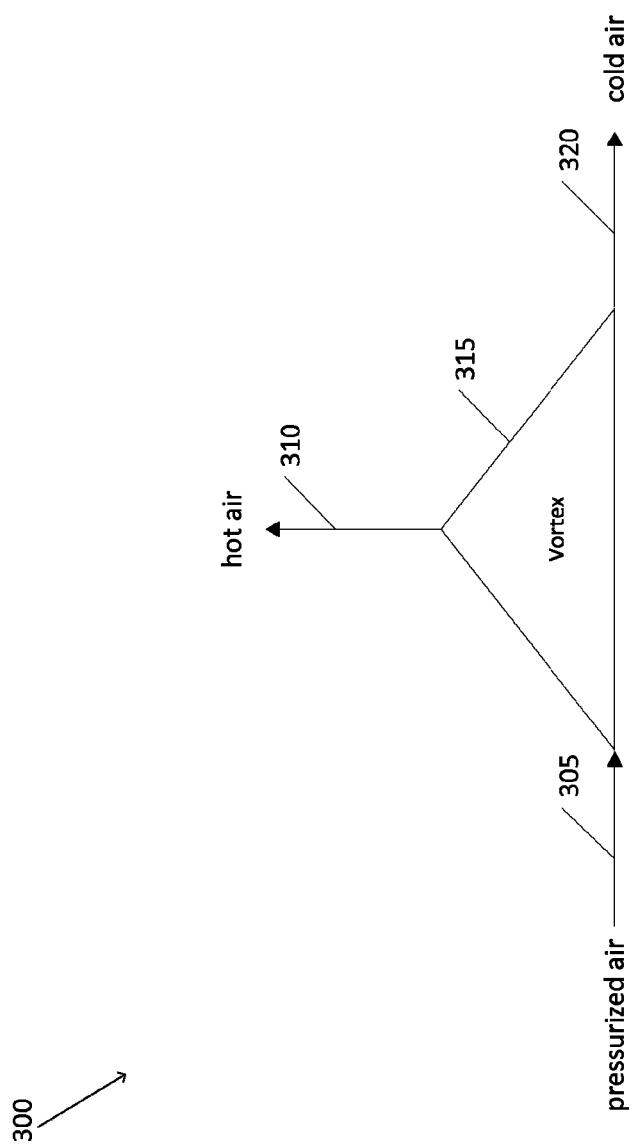
FIG. 3a is a schematic flow diagram of a vortex tube suitable for use with the present invention.
Figure 3B:
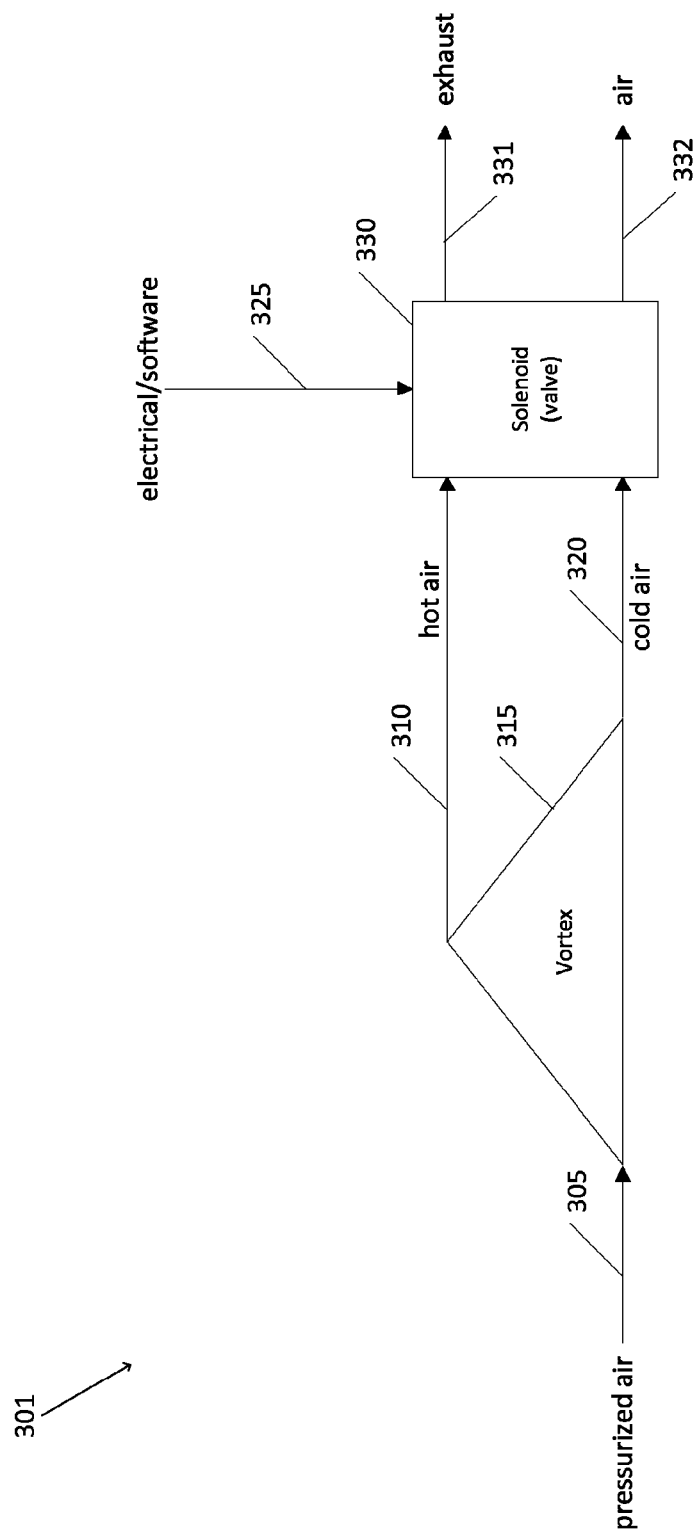
FIG. 3b is a schematic flow diagram of a vortex tube and controlled solenoid valve combination suitable for use with and part of the present invention.
Figure 3C:
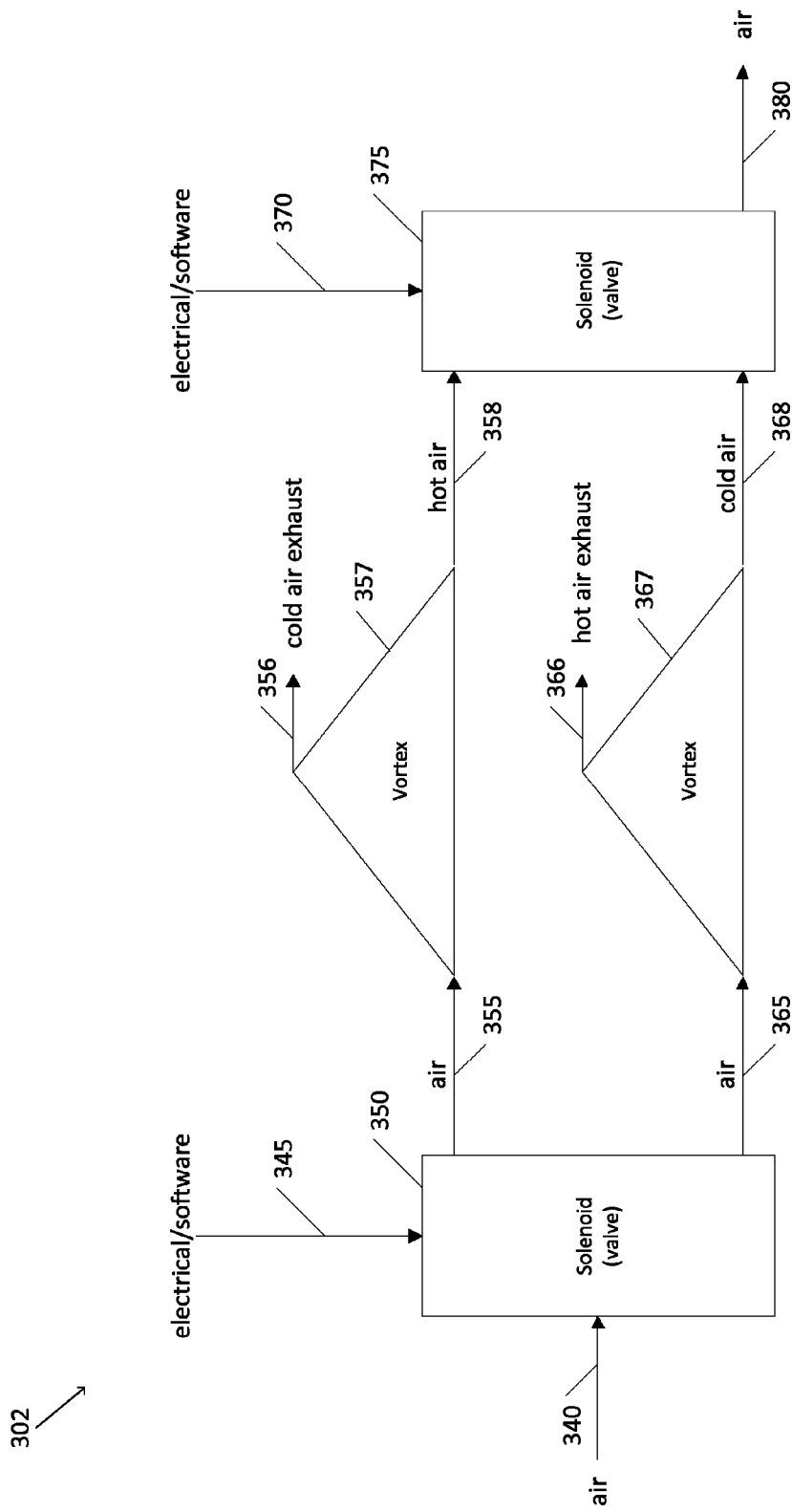
FIG. 3c is a schematic flow diagram of a dual vortex tube and controlled solenoid valve system suitable for use with and part of the present invention.

Referring to FIGS. 3a-3c, vortex tube systems 300, 301 and 302 are detailed. Referring specifically to FIG. 3a, a vortex tube system 300 comprises a standard vortex tube 315 currently made by Exair Corporation and which is preferably comprised of a medium-sized, 3200 series, vortex tube rated for 10-40 cubic feet per minute (scfm) inlet pressure. The last two digits of the model number of the vortex tube correspond with the inlet pressure rating for the vortex tube. Thus, a model 3210 vortex tube is rated for 10 scfm air pressure inlet for effective operation. The vortex tube 315 alone, and the operation thereof, is well known in other art areas and comprises an inlet port 305 for admission of pressurized air into the vortex tube, a hot air outlet 310, or exhaust port, and a cold air outlet 320. Of course, other-sized vortex tubes, including smaller tubes, such as 2-8 scfm tubes, may be used for Applications that require less capacity, and larger tubes (50-150 scfm), may be used for applications requiring greater capacity, without departing from the scope and spirit of the invention.

There is an exit port adjustment screw on the vortex tube 315 that is not shown, and which is adjustable manually but not during operation of the tube. The exit port adjustment screw is preferably adjusted to an optimum setting for the greatest number of applications and then mostly left in that position for most operations. The adjustment of the aforementioned exit port adjustment screw tunes the vortex tube in accordance with a desired output air temperature range given a range of input air pressures from the air pressure regulator 220.

Embodiment 300 of the vortex tube system is best suited with cold air to the downstream supply to the heatsink system of the invention, since cooling may be provided by the cold airstream supply, and a thermoelectric cooler subsystem (described further below) can provide heat as necessary at the contact interface 155. Whereas with only a hot airstream supply from the vortex tube 315, only heating of the contact interface 155 would be practical. Thus, while the advantage of embodiment 300 is its simplicity, only one airstream, hot or cold, would provide the downstream supply to the heatsink 145, with the other to exhaust, or other possible use.

In FIG. 3b, an alternate vortex tube system 301 comprises a vortex tube 315 having the same inlet port 305, hot air outlet 310 and cold air outlet 320, but unlike vortex tube system 300, system 301 further comprises a solenoid valve 330 that is software controlled by controller 105 to electrically operate the valve to selectively switch the output of the vortex tube 315 to the heatsink system 145 between hot air outlet exhaust as shown at 331 and cold air outlet 332. Thus, this embodiment of the vortex tube system 301 of the thermal control system 100 enables ramping to and control at either a hot temperature or a cold temperature. Thus, for example, in the case of testing of an electronic device at a pre-determined setpoint temperature, the vortex tube system 301 is operational to permit ramping of the device to the pre-determined setpoint temperature by setting of the pressure regulator 220 of the air supply system 125 to a pressure corresponding to the pre-determined setpoint temperature, given other temperature factors as described further herein. The system can then, via software programming and control, control the temperature at the desired setpoint temperature for a pre-determined dwell period, before being changed to another pre-determined setpoint temperature. This subsystem shown in FIG. 3b provides improved control, whereby either hot or cold airstreams from the vortex tube system may supply the downstream heatsink system, using a solenoid or similar valved system. The advantage of this subsystem, compared to the subsystem shown and described in connection with FIG. 3a, is the use of the hot airstream output from the vortex tube, during targeting heating mode at the contact interface, to improve the rate of heating as well as the final target temperature.

Thus, for example, the alternate embodiment of the vortex tube system 301 could be used if the first pre-determined setpoint temperature of the system was a cold temperature followed by a hot temperature, the solenoid valve 330 could be controlled by the controller 105 to first direct cold air outlet 320 to pass through to the heatsink system 145 for a pre-determined period of time to allow ramping to the cold temperature extreme, say −25° C., and dwell at that extreme for a period of time, say five minutes, after which the controller 105 could alternately direct the solenoid valve to direct hot air outlet 310 to pass exhaust air 331 to the heatsink system 145 for ramping to a hotter temperature, say 125° C., for a period of time, say another five minutes, for testing operation of the component at that higher temperature.

In FIG. 3c, yet another alternate embodiment 302 of the vortex tube system 135 is shown wherein there are shown two vortex tubes 357, 367 being employed with two solenoid valves 350, 375. Like vortex tube 315, vortex tubes 357, 367 each have inlet ports 355, 365, respectively, cold air outlets 356, 368, respectively, and hot air exhaust outlets 358, 366, respectively. Solenoid valve 350 of vortex tube system 302 comprises a solenoid valve that is software controlled by controller 105 to determine whether vortex tube 357 or vortex tube 367 is operational during a particular temperature control operation. As shown, vortex tube 357 is oriented for hot air outlet 358 to the second solenoid valve 375, venting cold air as exhaust at 356, and vortex tube 367 is oriented for cold air outlet 368 to the solenoid valve 375, venting hot air as exhaust at 366. Solenoid valve 375 is software controlled at 370 by controller 105 to direct either the hot air outlet 358 of the vortex tube 357 or the cold air outlet 368 of the vortex tube 367 to the component for thermal control as shown at 380, depending upon whether a heating or cooling ramping or control/dwell operation is desired.

The vortex tube system 302 enables convenient use of an optimized vortex tube 357, 367 for either hot or cold operation, respectively. Since the tuning of each vortex tube is mechanical, alteration of the tuning of each vortex tube to optimize its hot, or alternatively cold, target extreme output is not able to be performed during operation. Rather the tuning of each vortex tube 357, 367 is able to be performed only during setup. Thus, similar to the example described above for vortex tube system 301, if a pre-determined hot setpoint temperature is desired, solenoid 375 may be actuated by controller 105 to allow passage of the hot air output 358 from dedicated, optimized-for-hot-output vortex tube 357, but if a pre-determined cold setpoint temperature is desired, solenoid 375 may be directed by controller 105 to allow passage of the cold air output 368 from dedicated, optimized-for-cold-output vortex tube 367. In this way, greater temperature extremes may be accomplished by the system 100, depending upon input air pressure, vortex tube model, and tuning characteristics. The advantage of this embodiment 302 over embodiment 301 is the dedicated separate tuning of each vortex tube 357, 367 for hot or cold desired output flow. Hence, a dedicated hot flow vortex tube 357 and a dedicated cold flow vortex tube 367 ideally allows a more optimized thermal control system.

Heatsink/Device Contact Subsystem Examples

Figure 4B:
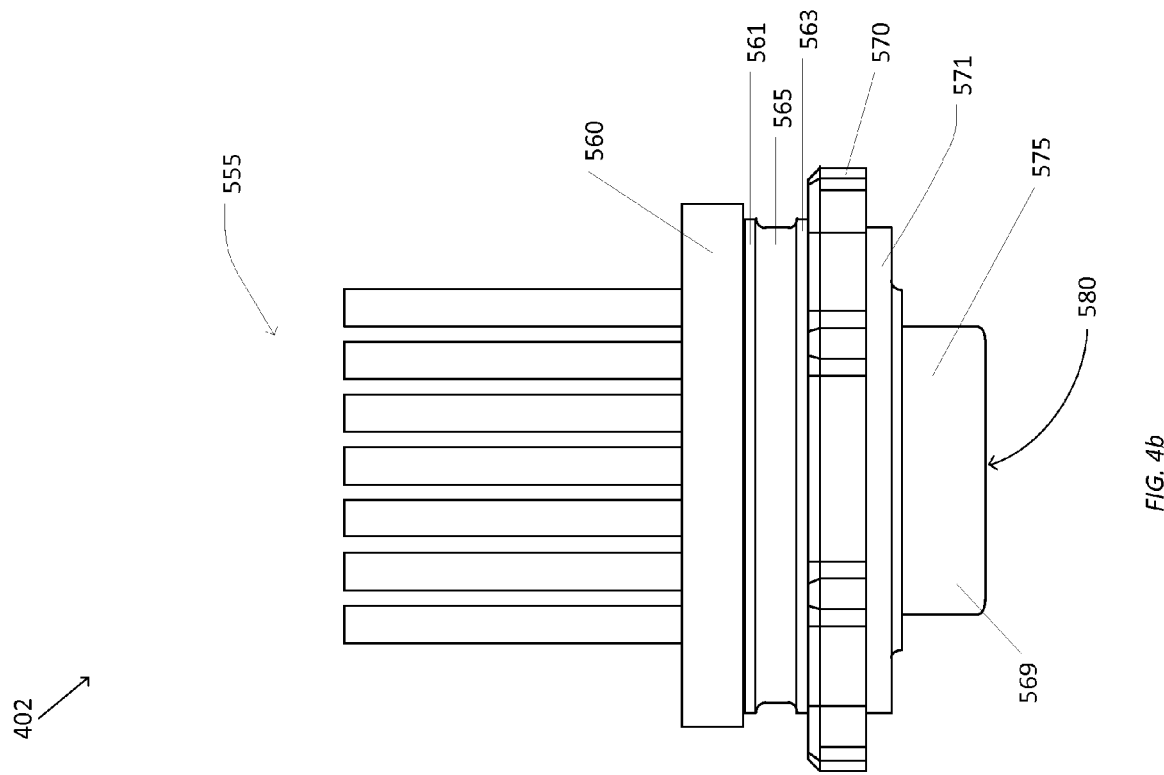
FIG. 4b is a front plan view of part of a testing apparatus employing a heatsink and a thermoelectric cooler adapted to enhance capability of temperature control of a component.
Figure 4A:
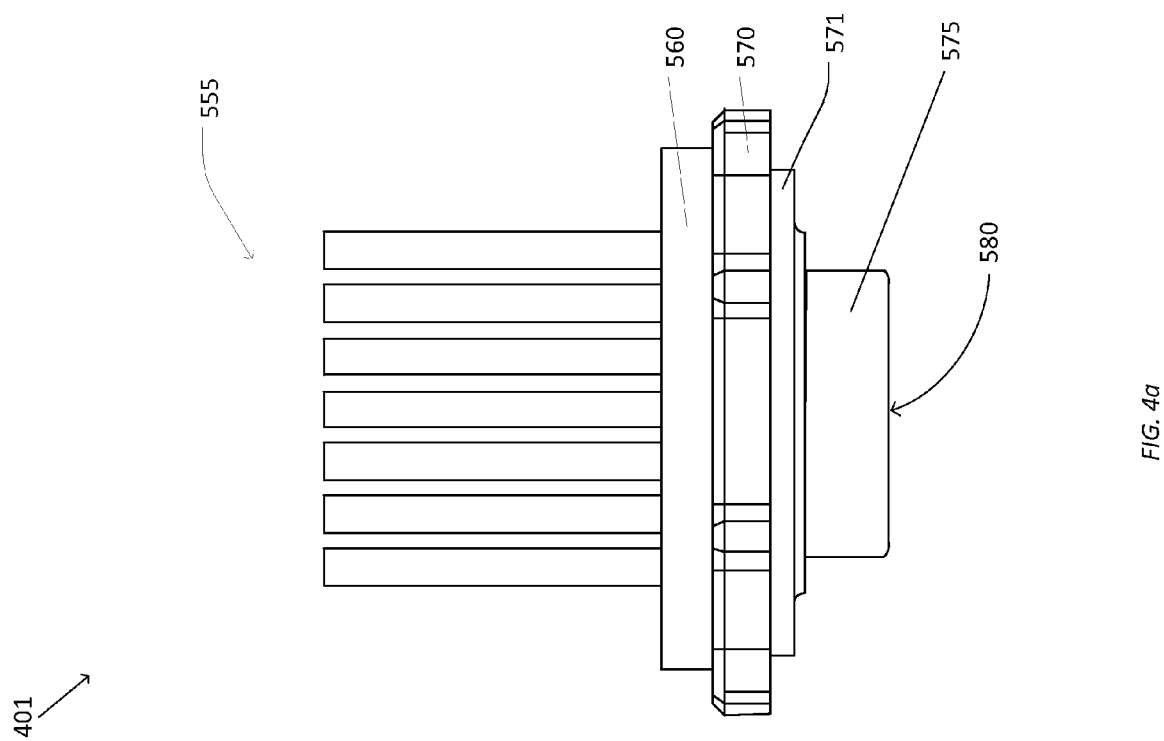
FIG. 4a is a front plan view of part of a testing apparatus for controlling temperature of a component showing a contact member for contacting a device under test (DUT) and heatsink with fin members.

Referring now to FIGS. 4a-4e, various heatsink and device contact member combinations are shown that are suitably preferred for use with the thermal control system of the invention depending upon the needs of the required application. In FIG. 4a there is shown a heatsink system comprising extended/enhanced surfaces referred to herein as posts or pin-type fins 555 extending in thermal transfer relation from a base member 560 where the fins are mounted. The base member 560 is in turn mounted in thermal relation on a frame, or chassis, referred to as a pedestal 570 having a subframe member 571. Extending in thermal relation downwardly in FIG. 4a from the pedestal 570 is a device contact zone, interface or member 575 having a device contact surface 580 on the underside of the device contact member for making direct contact with the device, its packaging, or a socket for retaining the device to be thermally controlled. All thermal interfaces of the invention may employ appropriate thermal interface material for improvement of contact conditions. Also, it will be appreciated that the heatsink 555, base member 560, pedestal 570, device contact member 575 and device contact surface 580 may all comprise a unitary integral device.

In FIG. 4b, there is shown an alternate embodiment heatsink and device contact member combination 402 for use with the thermal control system of the invention. The heatsink portion of the device in this embodiment comprises extended surfaces referred to herein as posts or fins 555 extending from a base member 560. The base member 560 in this alternate embodiment is mounted to an upper typically ceramic plate surface 561 of a thermoelectric cooler 565 (TEC), the preferably solid state TEC device also having a lower typically ceramic plate 563, each of the plates being powered by a DC voltage source and having between them a substance, such as bismuth telluride pellets, or antimony telluride pellets, that causes heat to quickly and actively flow from one ceramic plate to the other to more effectively transfer the heat to the heatsink base member 560. The lower ceramic plate 563 of the thermoelectric cooler 565 is connected in thermal relation with a pedestal 570. A plurality of thermoelectric coolers may be used in stages to improve cooling capacity, and the polarity of the plates may be changed to cause heat to flow in an opposite direction (e.g., into the DUT as opposed to out of the DUT) of an initial direction chosen. It will be appreciated by those of ordinary skill in the art that other means of enhancing the flow of heat within the system may be employed, such as a fan or heat pipe, without departing from the true scope and spirit of the invention.

Extending in thermal relation downwardly in FIG. 4b from the pedestal 570 is a device contact zone, interface or member 575 having a device contact surface 580 on the underside of the device contact member for making direct contact with the device, its packaging, or a socket for retaining the device to be thermally controlled.

Figure 4C:
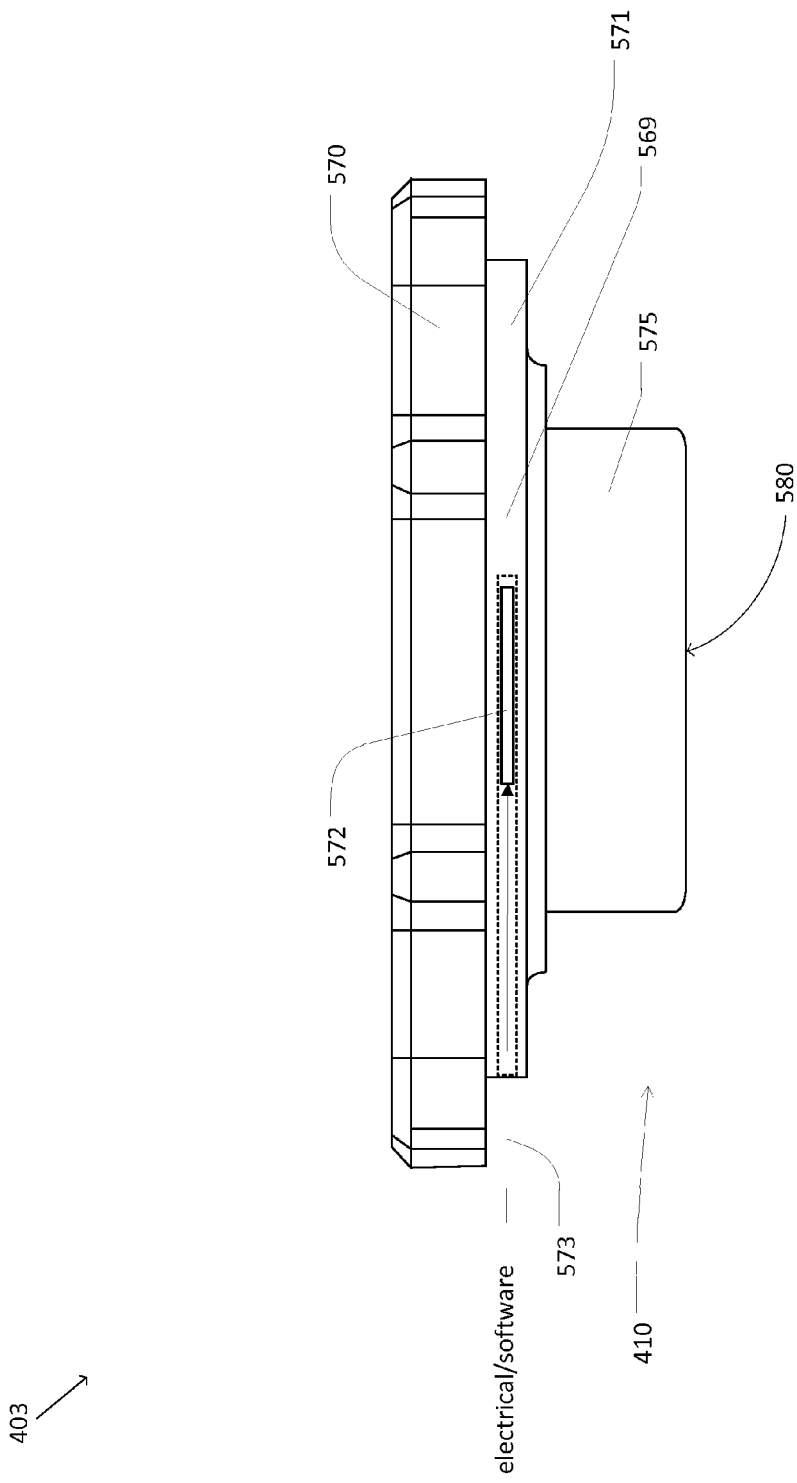
FIG. 4c is a front plan view of part of a testing apparatus comprising a pedestal and cartridge heater combination suitable for use with the present invention.

In FIG. 4c, there is shown a "heatsink" pedestal assembly 403 wherein the pedestal 570 has a subframe member 571 for retaining a cartridge heater 572 that is able to be software controlled through an electrical interface 573 for the purpose of indirectly supplying heat to the device contact surface 580 via the pedestal 570 and the device contact member 575. While a preferred embodiment for location of the cartridge heater 572 has been shown and described, alternate locations of placement of a cartridge heater, for example in the device contact interface, are known and would fall within the spirit and scope of the present invention. Alternatively, a temperature sensor 569 may be employed on the pedestal 570 for allowing transmission of temperature data pertaining to the DUT to a recording device used for testing. Purge air 410 may be used to blow on the device contact interface 575, 580 to avoid condensation occurrence on the lower pedestal surface. This purge air may come from a separate airflow source, or may utilize bleed air from the upstream subsystems, including the vortex system, the pressurized air supply system or even partial bleed air from a ventilated mount described further below.

Figure 4D:
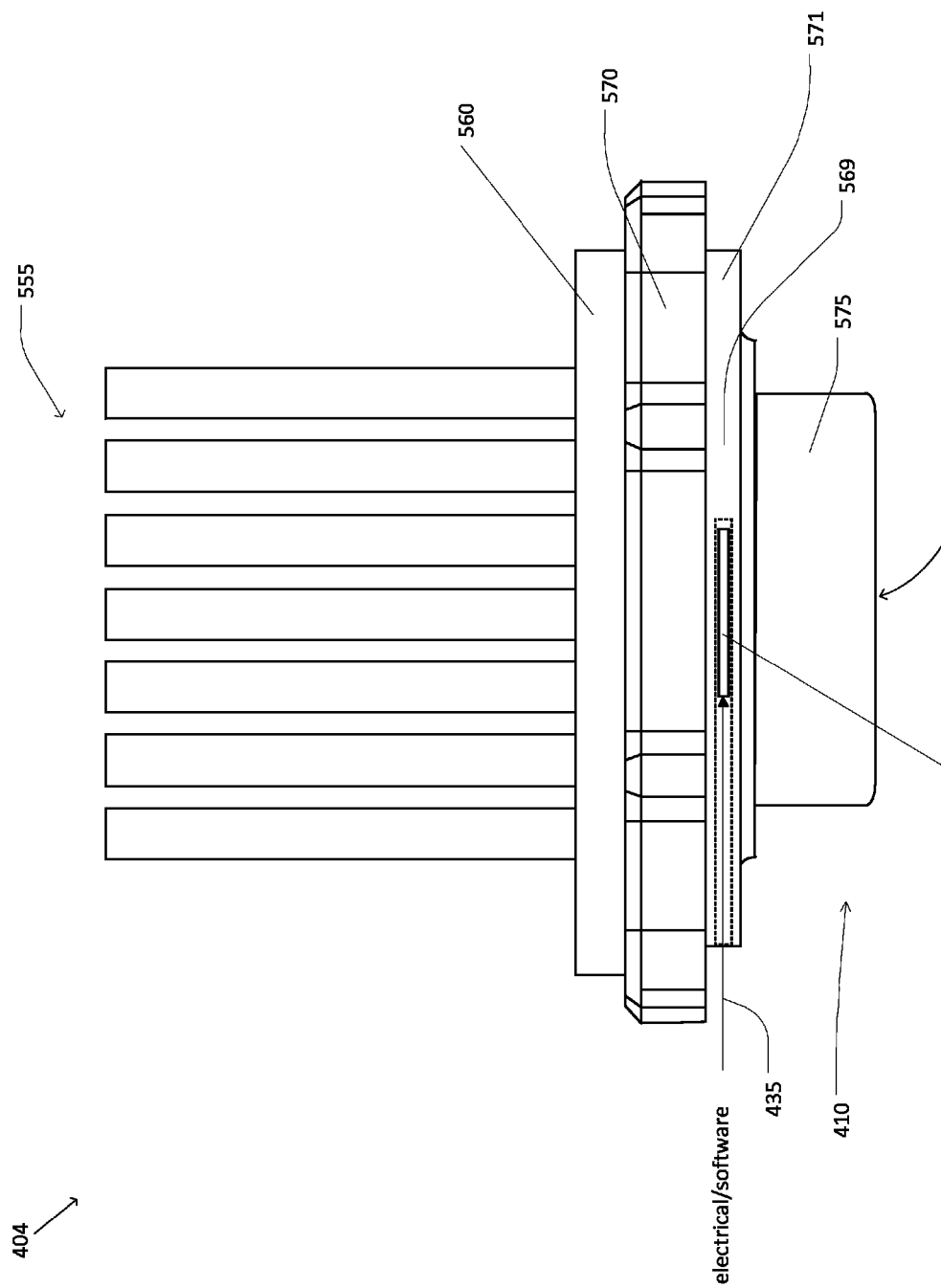
FIG. 4d is a front plan view of a part of a testing apparatus employing a heatsink with a pedestal and cartridge heater combination suitable for use with the present invention.

In FIG. 4d, there is shown a heatsink device contact system 404 comprising extended surfaces, posts or fins 555 extending in thermal transfer relation from a base member 560 where the fins are mounted. The base member 560 is in turn mounted in thermal relation on a frame, or chassis, referred to as a pedestal 570. Extending in thermal relation downwardly in FIG. 4d from the pedestal 570 is a device contact zone, interface or member 575 having a device contact surface 580 on the underside of the device contact member for making direct contact with the device, its packaging, or a socket for retaining the device to be thermally controlled. Attached to the pedestal assembly 570 there is a subframe member 571 for retaining a cartridge heater 572 that is able to be software controlled through an electrical interface 573 for the purpose of indirectly supplying heat to the device contact surface 580 via the pedestal 570 and contact member 575.

Figure 4E:
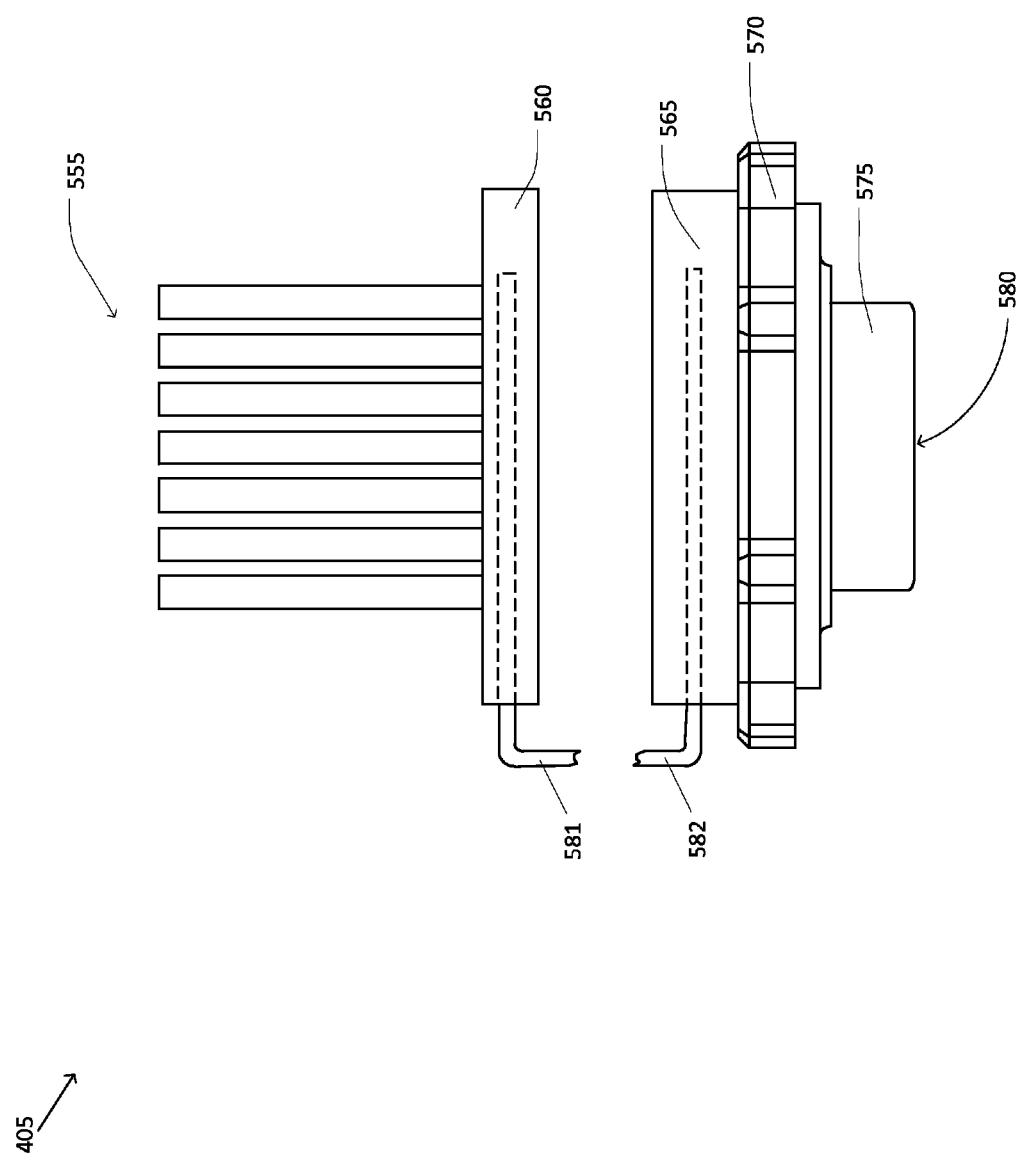
FIG. 4e is a front plan view of a part of a testing apparatus employing a heatsink connected to a thermal interface member via a heat pipe suitable for use with the present invention.

In FIG. 4e there is shown a heatsink and device contact system 405 wherein there is shown a heatsink system comprising extended surfaces referred to herein as posts or fins 555 extending in thermal transfer relation from a base member 560 where the fins are mounted. The base member 560 is connected to thermal contact member 565 by a heat pipe having cold and hot ends 581 and 582, respectively. Heat pipes are well known in the industry as a sealed hollow tube, usually made of copper, and having a wick and a working fluid contained therein. The hot end 582, 565 of the heat pipe next to the heat source 575 and the DUT is often referred to as the evaporation end of the heat pipe, and the cold end 581, 560 of the heat pipe is often referred to as the condensation end. As heat from the device contact surface 575, 580 warms the evaporation end 582, 565 of the heat pipe, the evaporation fluid fills the wick of the heat pipe and spreads along the pipe towards the condensation end 581, 560 where the fluid is cooled, and as the fluid condenses, the vapor gives up the heat it acquired during evaporation and the condensed working fluid is sucked back into the evaporation end 582, 565. This continues in a loop moving heat from 565 to 560 to accomplish more efficient thermal transfer for the system. Part of the efficiency of the heat pipe system is that it allows extension of the cooling system a distance from the heat producing part of the system to thermally isolate the two. The thermal contact member 565 is in turn mounted in thermal relation on a frame, or chassis, referred to as a pedestal 570. Extending in thermal relation downwardly in FIG. 4e from the pedestal 560 is a device contact zone, interface or member 575 having a device contact surface 580 on the underside of the device contact member for making direct contact with the device, its packaging, or a socket for retaining the device to be thermally controlled.

Ventilated Mount Chamber/Heatsink Subsystem Examples

Referring generally to FIGS. 5a-5e, generally speaking the subsystems illustrated by these figures may be seen as comprising a ventilated mount or adapter air chamber for receiving the controlled air supply from the vortex tube system, with provision for discharging the final airflow through apertures; a heatsink as shown in FIG. 4a, 4b, 4d or 4e, or optionally a pedestal assembly as shown in FIG. 4c, and which is exposed to the receiving airflow of the ventilated mount airchamber; an optional thermoelectric cooler for additional cold/hot surface enhanced control; and a pedestal assembly which provides the final contact interface with the target zone or device.

Figure 5D:
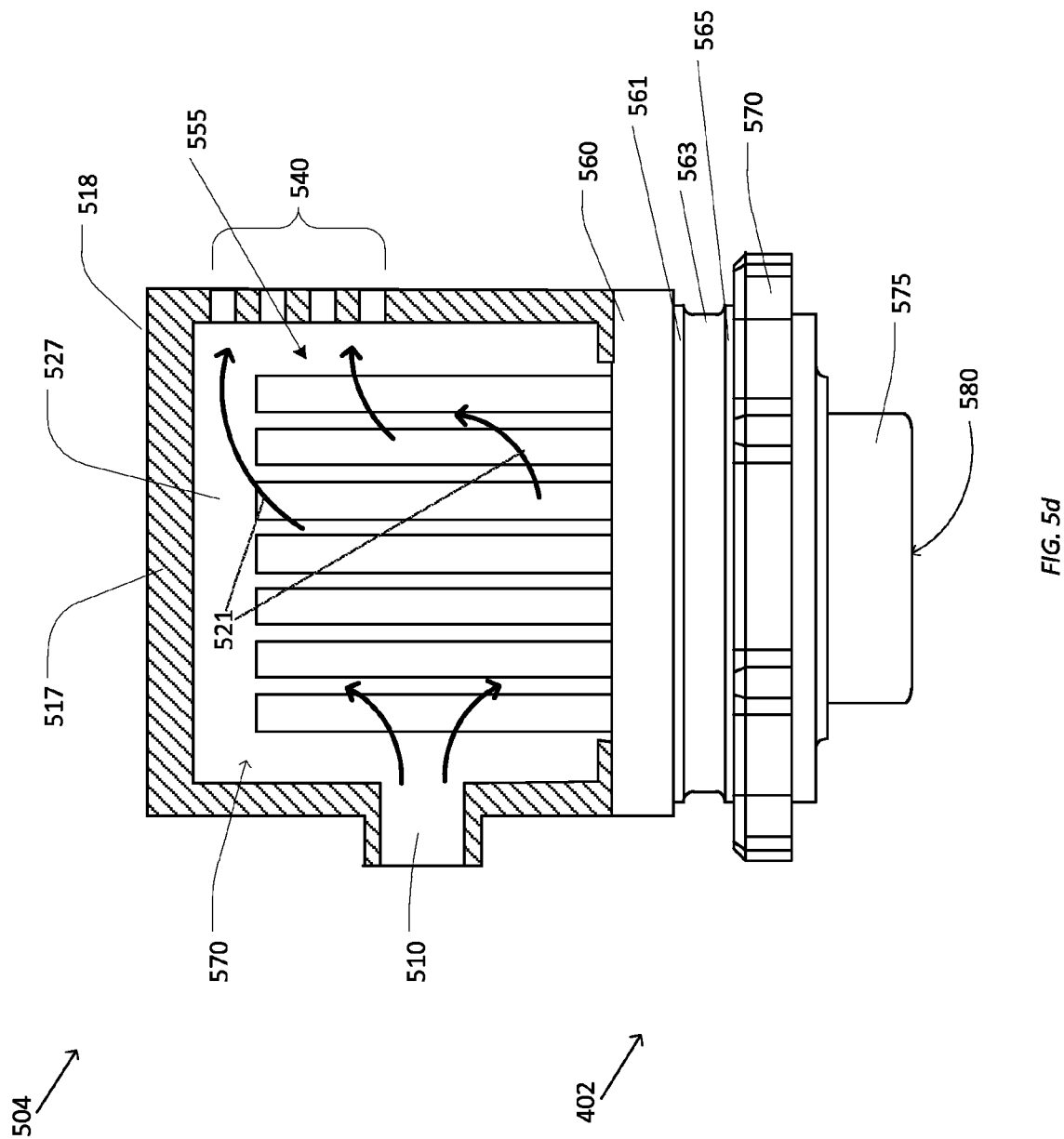
FIG. 5d is a front partial cross-section, partially exploded view of an apparatus for controlling the temperature of a component in accordance with still another embodiment of the invention.

Further, generally speaking, internally, the control of airflow directly to the heatsink extended surfaces (ie. fins, pins, slots etc), can be designed within the air chamber structure itself, either with a vertically oriented air supply (i.e., top down as shown in FIGS. 5a-c and 5e) or from the side (as shown in FIG. 5d).

Referring now specifically to FIG. 5a, there is shown a partially-exploded, partial cross-section view of a first embodiment of apparatus 501, 401 for use in accordance with the invention. The apparatus comprises a ventilated mount cup, chamber or socket 501 defined by a wall 515 if cylindrical or walls 515 if otherwise. For ease of reference this specification will refer to this member in the singular as wall 515, however it is to be understood that the singular includes the plural in this case. At a base portion 514 of wall 515 there may be provided a seal or at least materials are selected for construction of the wall which provide a positive contact for engagement. Ventilated mount chamber 501 comprises a hollowed out countersink portion 520 and an attachment airway 510.

Heatsink and device contact combination 401 comprises a base member 560 with a plurality of posts or fins 555 extending upwardly. As shown by the partially exploded view of FIG. 5a, the fins 555 are preferably designed to fit just within the countersink portion 520 of the ventilated mount 501 such that the wall 515 of the ventilated mount 501 are positioned closely adjacent outer fins 555. Thus, it will be appreciated that if the outer configuration of the fins is square, the cross-section shape of walls 515 could also be square, the same being true with a rectangular-shaped fin configuration and a rectangular-shaped wall configuration. The base 514 of the chamber 515 is designed to form a seal with base 560 of the heatsink and device combination 401 in order to form an enclosure (see e.g., enclosure 570 of FIG. 5d) comprising the base 560 of the heatsink and the countersink portion 520 of the chamber.

The heatsink device contact subsystem 401 of FIG. 5a is similar to the heatsink device contact combination 401 of FIG. 4a, but it will be appreciated that heatsink device contact subsystems 402, 403, 404 or 405 described in connection with FIGS. 4b-4e, or other suitable heatsink device contact combination may, also be employed with ventilated mount chamber 501, or other ventilated mount chamber embodiments disclosed herein, without departing from the true scope and spirit of the invention.

Chamber wall 515 has defined therein a plurality of apertures 540 for regulating the air flow out of the enclosure and enhancing the temperature of the air to which the fins of the heat exchange means are subjected within the enclosure during operation of the vortex tube.

As shown by the arrows 521, air from the pressurized air supply 125 travels down the attachment airway 510, into the hollowed-out countersink portion 520 and out apertures 540. The number, size and location of the apertures may be adjusted in order to tune the ventilated mount to optimize performance of a particular vortex tube. Excessive back pressure on a vortex tube hinders its performance. Low back pressure on the cold outlet of the vortex tube up to 2 psig will not negatively impact performance of the vortex tube, but as much as 5 psig will change the temperature of the outlet cold air by up to 2.8° C. Thus, the apertures 540 in the wall 515 must be of sufficient number and size to keep the back pressure on the outlet of the vortex tube within a tolerance, if any, for reduced efficiency of cold output air for a given application.

Thus, in summary, the design of FIG. 5a comprises a simple and straight forward design allowing air to enter the internal chamber cavity 520 (from a topmost vertical entrance 510) and flow through heatsink fins 555 towards the exit port locations 540.

Referring now to FIGS. 5b and 6a-c, there is shown a partially-exploded, partial cross-section view of another embodiment of apparatus 502, 401 for use in accordance with the invention. The apparatus comprises a ventilated mount cup, chamber or socket 502 defined by a wall 516 if cylindrical or walls 516 if otherwise. For ease of reference this specification will refer to this member in the singular as wall 516, however it is to be understood that the singular includes the plural in this case. At a base portion 514 of wall 516 there may be provided a seal or at least materials are selected for construction of the wall which provides a positive contact for engagement. Ventilated mount chamber 502 comprises a hollowed out countersink area 523 and an attachment airway 510. Within the hollowed out countersink area 523, there is a baffle partition 524 that may be either of circular, square or other suitable cross-section design. The baffle partition 524 serves to direct the air along more of the heatsink fins 555 and also allows the air, as shown by arrows 521 to escape from beneath the baffle portion at 512 along channel 529 and out the apertures 540.

Further, it will be appreciated as shown in FIGS. 6b and 6c that an inner surface 511 of the wall 516 may be square, or square with rounded corners as shown, while the outer surface 513 of the wall 516 may be a different configuration to allow for easier manufacturing for example to create apertures in the wall 516. It will be appreciated that, like a standard socket, any of the embodiments of the ventilated mount may also comprise a round cross section. Further, it will be appreciated that a square, a rectangular, a pentagonal, an octagonal or other configuration may be employed for the ventilated mount without departing from the true spirit and scope of the invention. FIGS. 6b and 6c also illustrate how the chamber/heatsink subassembly may be provided with screw holes 650 adapted for screws (not shown) for holding the chamber 502, heatsink 401, pedestal 570 and base 560 members as a unit as essentially an integral unit. Similar screw/hole design is applicable for each of the various chamber/heatsink combinations shown in FIGS. 4a-e and 5a-e herein.

Figure 10:
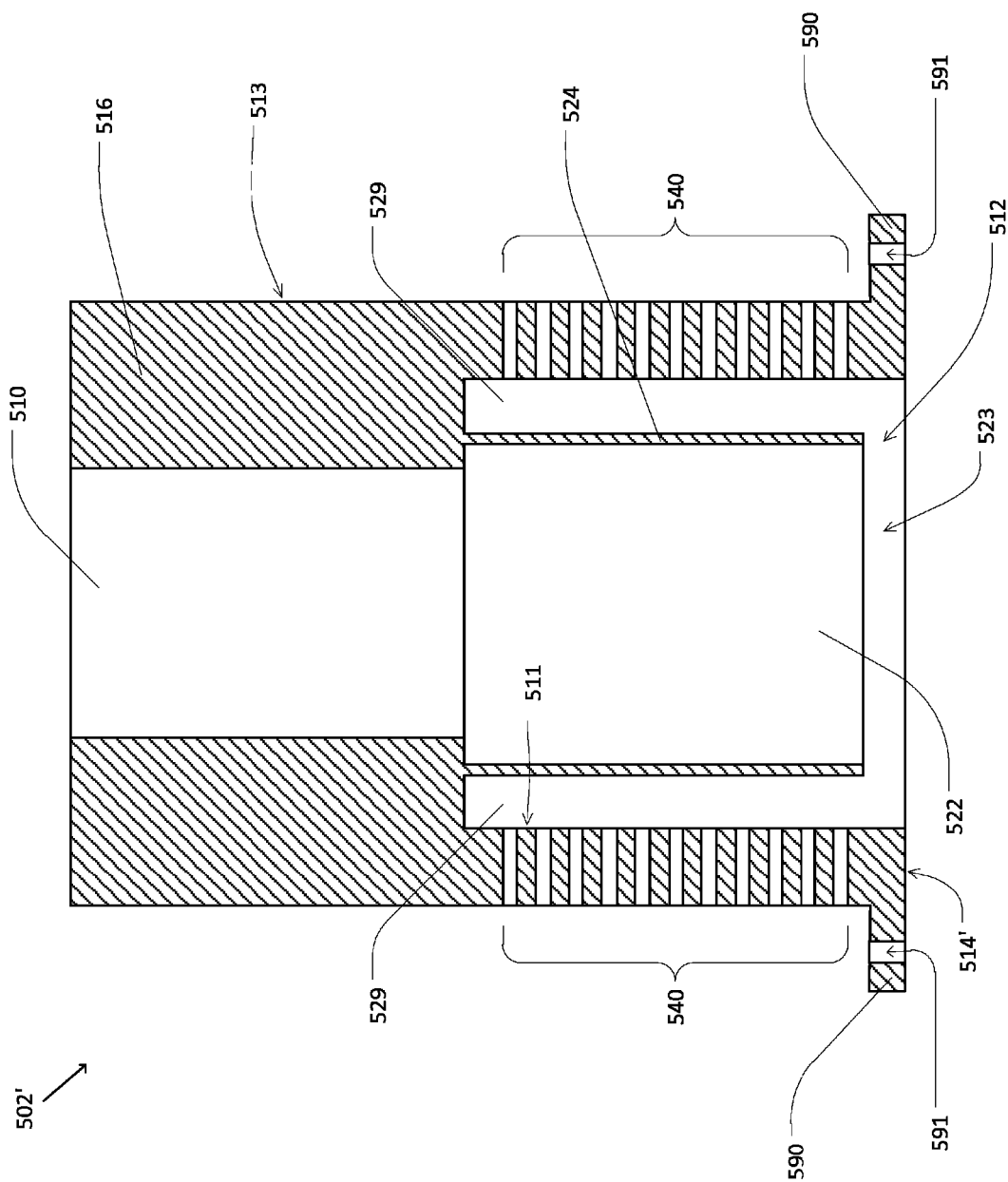
FIG. 10 is a front cross section view of an alternative embodiment of a ventilated adapter or mount in accordance with the present invention.

As shown in FIG. 10, an alternate means of attaching the ventilated mount chamber 502' to the heatsink base 560 or pedestal 570 comprising a flange near the base portion 514' of the chamber with screw holes therein for mounting the chamber.

As described above in connection with FIG. 5a, the heatsink and device contact combination 401 of FIG. 5b comprises a base member 560 with a plurality of extended surface posts or fins 555 extending upwardly. As shown by the partially exploded view of FIG. 5b, the fins 555 are preferably designed to fit just within the countersink portion 520 of the ventilated mount 501 such that the wall 516 of the ventilated mount 501 is positioned closely adjacent outer fins 555, and more central fins 555 are able to reside partially within the baffle partition 524. The base 514 of the chamber wall 516 is designed to form a seal with base 560 of the heatsink and device combination 401 in order to form an enclosure (see enclosure 570 of FIG. 5d) comprising the base 560 of the heatsink and the countersink portion 520 of the chamber.

The heatsink device contact subsystem 401 of FIG. 5b is similar to the heatsink device contact combination 401 of FIG. 4a, but it will be appreciated that heatsink device contact subsystems 402, 403, 404 or 405 described in connection with FIGS. 4b-4e, or other suitable heatsink device contact combination, may also be employed with ventilated mount chamber 502, or any other embodiment of ventilated mount chamber described herein, without departing from the true scope and spirit of the invention.

Chamber wall 516 has defined therein a plurality of apertures 540 for regulating the air flow out of the enclosure and enhancing the temperature of the air to which the fins of the heat exchange means are subjected within the enclosure during operation of the vortex tube.

As shown by the arrows 521, air from the pressurized air supply 125 travels down the attachment airway 510, into the hollowed-out countersink portion 520 and out of the apertures 540. The number, size and location of the apertures may be adjusted as further described below in order to tune the ventilated mount to optimize performance of a particular vortex tube.

Speaking more generically, FIG. 5b illustrates how an internal central funnel or baffle 524, whereby air would be restricted to travel first towards the lower heatsink (i.e., base member 560) surface, with or without fins in its pathway as contemplated with FIGS. 4a-e, and escaping via a lower aperture 512 between the baffle 524 and base 560, henceforth towards the chamber exit port or aperture locations 540. While this embodiment subsystem provides an improved thermal performance system, it does so at a cost of increased back pressure and possible elevated noise and/or condensation levels.

Referring now to FIGS. 5c and 6d, there is shown a partially-exploded, partial cross-section view of a another embodiment of apparatus 503, 401 for use as, and/or in accordance with, the invention. The apparatus comprises a ventilated mount cup, chamber or socket 503 defined by a wall 517 if cylindrical, or walls 517 if otherwise such as square, rectangular, pentagonal, octagonal, etc. For ease of reference this specification will refer to this member in the singular as wall 517, however it is to be understood that the singular includes the plural in this case. At a base portion 514 of wall 517 there may be provided a seal or at least materials are selected for construction of the wall which provides a positive contact for engagement. As shown, ventilated mount chamber 503 comprises a plurality, preferably at least four, air flow channels 537 in communication with an attachment airway 510. It will be appreciated that a single channel or other number of channels, or a concentric uniform channel, may be employed without departing from the true scope and spirit of the invention. The foremost air flow channel is not shown because of the cross-section view chosen for FIG. 5c. At a downstream location, in terms of airflow, the air flow channels 537 are in communication with an inner hollowed-out chamber 538 defined by an enclosed baffle portion 539 having a cap portion 541. Baffle 539 and cap 541 may be integral with chamber 517 or constructed from two separate pieces of material. The inner hollowed-out chamber 538 may be either of circular, square or other suitable cross-section design. At the base of the inner hollowed-out chamber 538 there is a plurality of inlet apertures 543 communicating between the air flow channels 537 and the inner hollowed-out chamber 538.

As described above in connection with FIG. 5a, the heatsink and device contact combination 401 of FIG. 5c comprises a base member 560 with a plurality of extended surfaces, posts or fins 555 extending upwardly. As shown by the partially exploded view of FIG. 5c, the fins 555 are preferably designed to fit just within the inner hollowed-out chamber 538 of the ventilated mount 503 such that the enclosed baffle portion wall 540 is positioned closely adjacent outer fins 555. The base 514 of the chamber 515 is designed to form a seal with base 560 of the heatsink and device combination 401 in order to form an enclosure (see enclosure 570 of FIG. 5d) comprising the base 560 of the heatsink and the inner hollowed-out chamber 538.

The heatsink device contact subsystem 401 of FIG. 5c is similar to the heatsink device contact combination 401 of FIG. 4a, but it will be appreciated that heatsink device contact subsystems 402, 403, 404 or 405 described in connection with FIGS. 4b-4e, or other suitable heatsink device contact combination, may also be employed with ventilated mount chamber 503 without departing from the true scope and spirit of the invention.

Chamber wall 517 has defined therein a plurality of apertures 540 for regulating the air flow out of the enclosure and enhancing the temperature of the air to which the fins 555 of the heat exchange means 401 are subjected within the enclosure during operation of the vortex tube.

The air as shown by arrows 521 travels from the outlet of the vortex tube into inlet attachment airway 510 and is divided to travel into the four airway channels 537 until it passes through the apertures 543 into the inner hollowed-out chamber 538 along base member 560 and along the fins 555 of the heatsink 550 to exit the inner hollowed-out chamber through apertures 540 communicating to the outside of the ventilated mount wall 517. The number, size and location of the apertures 540 may be adjusted as further described below in order to tune the ventilated mount 503 to optimize performance of a particular vortex tube.

More generically speaking, the embodiment design shown in FIG. 5c comprises a sidewall funnel or channel 537, which directs air to the base 560 of the heatsink, and expels airflow laterally at the heatsink base level, henceforth towards the exit port aperture locations 540. This design was found to give a relatively higher thermal performance (i.e., low target temperature).

Referring now to FIG. 5*d*, there is shown in a front partial cross-section view an additional design variation for a chamber 504/heatsink subsystem 402 apparatus illustrating that the air supply may come from an attachment airway inlet port 510 from the side of the chamber/enclosure 527 defined by chamber walls 517 to direct airflow 521 to the heatsink fins 555 that extend from heatsink base 560. The airflow 521 exits on the mostly opposing side of the chamber 527 out of the chamber through apertures 540. A contact surface 514 is disclosed for allowing engagement of the chamber wall 517 with the base 560 of the heatsink system 402 to form an enclosure within which the pressurized air travels. Thus, FIG. 5*d* also illustrates the use of a side chamber inlet port in connection with a thermoelectric cooler (TEC) 565 heatsink subsystem 402 like that subsystem shown in FIG. 4*b*.

FIG. 5*e* illustrates the use of a heatpipe type heatsink 405 like that shown in FIG. 4*e*, which could be integrated into the chamber system 505 as shown. Thus, chamber wall 515 defines an inlet attachment airway 510 and a countersunk chamber portion 520. A contact surface 514 is disclosed for allowing engagement of the chamber wall 517 with the base 560 of the heatsink system 402 to form an enclosure within which the pressurized air travels. The heatpipe type heatsink 405 is described above in connection with FIG. 4*e*.

Alternatively, the chamber system 505 could utilize specialized internal baffles, such as those shown in FIG. 5*c* in connection with chamber system 503, or such as those shown in FIG. 5*b* in connection with chamber system 502, for directing airflow to the base 560 of the finned cold-portion of the heatpipe. In such a scenario, entrance/exit airflow ports 540 could be appropriately positioned to maximize cooling effect.

Referring to FIGS. 6*e* and 6*j*, there is shown a preferred embodiment of a ventilated mount 600 portion of a temperature control apparatus for use with a pin-fin type heatsink portion and in accordance with the invention. The ventilated mount 600 comprises a ventilated mount cup, chamber or socket 606 defined by a wall 608 if generally rounded or cylindrical, or walls 608 if configured as rectangular, square, pentagon, octagon or otherwise. The mount cup further comprises an inner wall surface 609. For ease of reference this specification will refer to this member in the singular as walls 608, however it is to be understood that the singular includes the plural in this case. At a base portion 610 of wall 608 there may be provided a seal or at least materials are selected for construction of the wall which provides a positive contact for engagement. Ventilated mount chamber 606 comprises a hollowed-out countersink area 612 and an attachment airway, or inlet port, 602.

Within the hollowed out countersink area 612, there is a baffle partition 614 that may be either of circular, square or other suitable cross-section design. The baffle partition 614 serves to direct the air along more of the heatsink fins 555 and also allows the air, as shown by arrows 616 to escape from beneath the baffle portion at 612 along channel 618 and out the exit aperture, port or hole 604.

During operation, air enters the mount cup 606 through inlet aperture 602, passes through an inlet chamber 619, beneath the baffle cup or hood 614 as shown at 616, through exit channel 618, out the exit port 604, and if attached for a regeneration version of the apparatus, through a hose 1175 (see FIG. 8*d*) for recirculation.

The ventilated mount 600 comprises an inverted cup-like structure with a partially closed (except for the inlet port 602 and the exit port 604) top, or cap, portion 620. Preferably, with this embodiment of the invention, the inlet port 602 and the exit port 604 are located side-by-side, defined in the top cap portion 620 of the mount cup 606. These ports, or apertures, 602, 604, are preferably located and sized so as to facilitate easy and minimal interconnection of tubing, hoses, conduit, or other communicating structure 1175 (see FIG. 8*d*), as known in the art, for communicating inlet air to the mount 600 and exhausting air from the mount, as in the case of a hose interconnecting the exit port 604 with a heat exchanger 1140.

As adjustments are made to exit port aperture 604 size, to accommodate tuning of the apparatus for a given application, appropriate sizing alterations may be accomplished as shown at angled surface 622 and ledge 624, in designing the mount 600.

Referring now to FIGS. 6*f* and 6*k*, there is shown another alternate embodiment of a ventilated mount 600' portion of a temperature control apparatus in accordance with the invention. The ventilated mount 600' comprises a ventilated mount cup, chamber or socket 600' defined by a wall 608' if generally rounded or cylindrical, or walls 608' if otherwise formed of angled flat surface walls. The mount cup further comprises an inner wall surface 609'. For ease of reference this specification will refer to this member in the singular as walls 608', however it is to be understood that the singular includes the plural in this case. At a base portion 610' of wall 608' there may be provided a seal or at least materials are selected for construction of the wall which provides a positive contact for engagement. Ventilated mount chamber 606' comprises a hollowed-out countersink area 612' and an attachment airway, or inlet port, 602'.

Within the hollowed out countersink area 612', there is a baffle wall partition 614'. The baffle wall partition 614' serves to direct the air along more of the heatsink fins 555 (see e.g., FIG. 5*c*) and also allows the air, as shown by arrows 616' to escape from beneath the baffle portion at 612' along exit channel or chamber 618' and out the exit aperture, port or hole 604'. Therefore, in operation, air enters the mount cup 600' through inlet aperture 602', passes through an inlet chamber 619', beneath the baffle wall as shown at 616', through exit channel 618', out the exit port 604', and if attached for a regeneration version of the apparatus, through a hose 1175 for recirculation.

The ventilated mount 600' comprises an inverted cup-like structure with a partially closed (except for the inlet port 602' and the exit port 604') top, or cap, portion 620'. Preferably, with this embodiment of the invention, the inlet port 602' and the exit port 604' are located side-by-side, defined in the top cap portion 620' of the mount cup 600'. These ports, or apertures, 602', 604', are preferably located and sized so as to facilitate easy and minimal interconnection of tubing, hoses, conduit, or other communicating structure as known in the art, and such as conduit 1175 (see FIG. 8*d*), for communicating inlet air to the mount 600' and exhausting air from the mount, as in the case of a hose interconnecting the exit port 604' with a heat exchanger 1140.

Figure 6A:
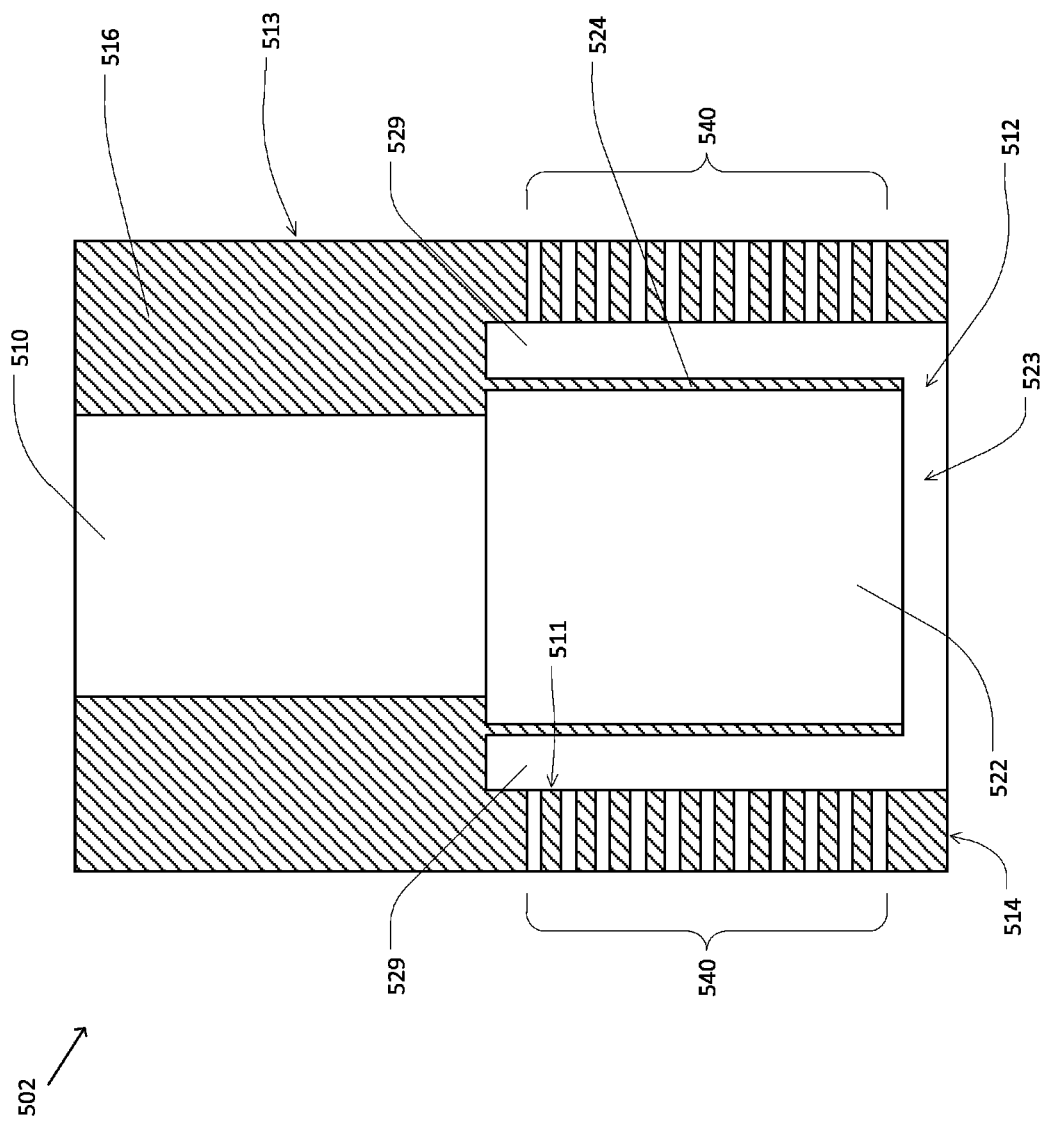
FIG. 6a is a front cross-section view of the ventilated mount portion of apparatus for controlling temperature of a component in accordance with an embodiment of the present invention.
Figure 6G:
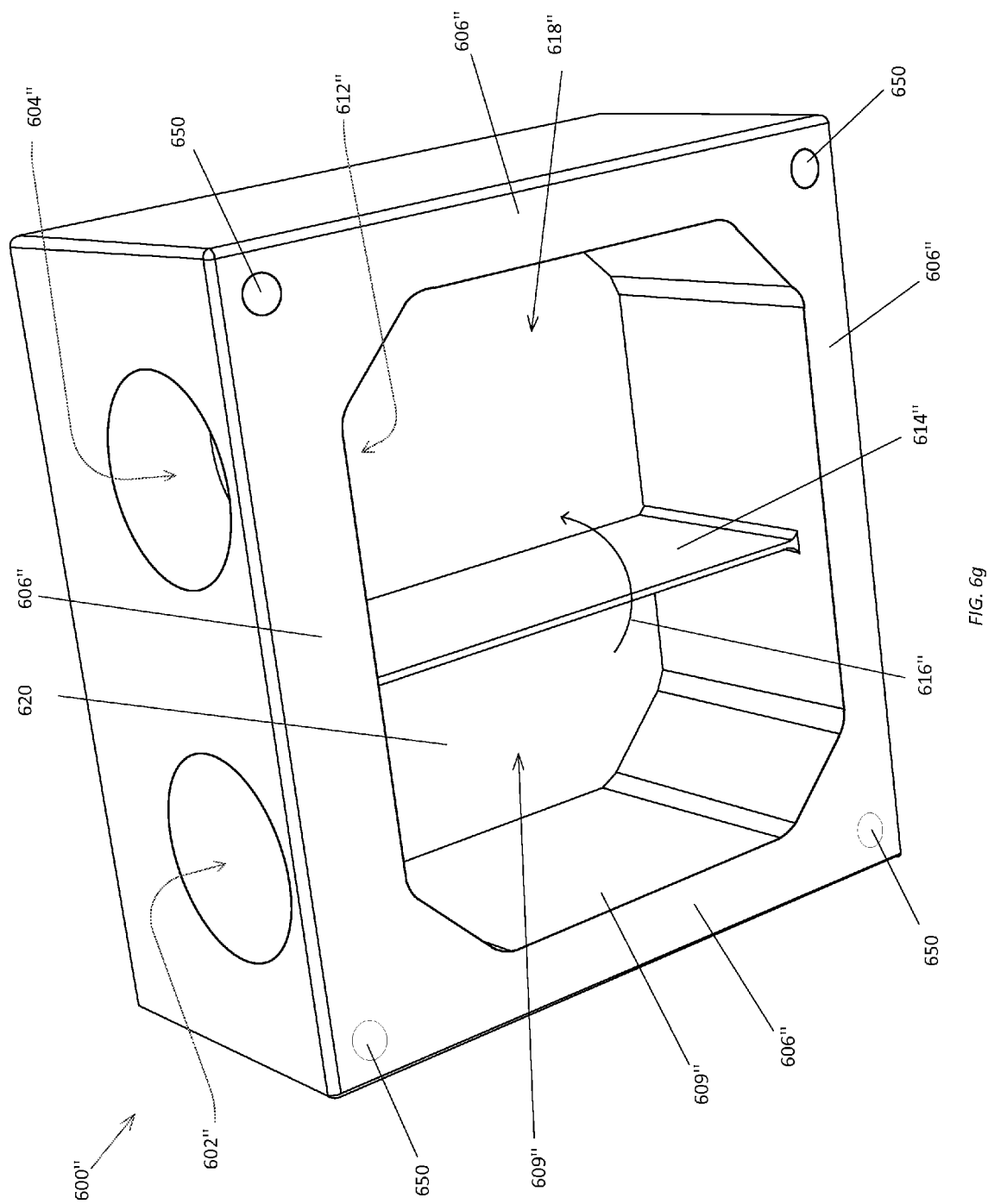
FIG. 6g is a bottom perspective view of yet another ventilated mount portion of apparatus for controlling temperature of a component in accordance with yet another embodiment of the invention.

The ventilated mount chamber 600' of this embodiment of the mount cup portion of the invention is constructed such that internal baffle wall 614' (rather than a funnel) creates a region for intake air to flow over a portion of the heatsink fin surfaces, and an exit region for outflow air to flow over remaining partial heatsink surfaces, with air exhaust directed towards a topside exit port 604' or other, e.g., sidemount, port 606", 606''' shown in FIGS. 6*g* and *h*. It will be appreciated that the ventilated mount 606' could also be made similar to that shown in FIG. 5*d*, with side entrance and/or exit ports. Further, it is possible as well that a plurality of such internal baffle walls may be constructed, so as to provide a maze-like flow path for airflow depending upon performance and fabrication capability.

Referring now to FIG. 6g, an alternate mount chamber 600" comprises similar elements as shown in connection with the mount 600' of FIG. 6f, mount 600" comprising a chamber or socket 606" defined by a wall 608" if generally rounded, as in the case of an elliptical, circular or cylindrical wall, or walls 608" if otherwise. The mount socket 606" defines an inlet aperture 602" and an exit port 604" and further comprises an inner wall surface 609". For ease of reference this specification will refer to this member in the singular as walls 608", however it is to be understood that the singular includes the plural in this case. At a base portion 610" of wall 608" there may be provided a seal or at least materials are selected for construction of the wall which provides a positive contact for engagement. Ventilated mount chamber 606" comprises a hollowed-out countersink area 612".

Within the hollowed out countersink area 612", there is a baffle wall partition 614". The baffle wall partition 614" serves to direct the air along more of the heatsink fins 555 (see e.g., FIG. 5c) and also allows the air, as shown by arrow 616" to escape from beneath the baffle portion at 612" along exit channel or chamber 618" and out the exit aperture, port or hole 604". Therefore, in operation, air enters the mount cup 600" through inlet aperture 602", passes through an inlet chamber 619", beneath the baffle wall as shown at 616", through exit channel 618", out the exit port 604", and if attached for a regeneration version of the apparatus, through a hose 1175 (FIG. 8d) for recirculation.

The ventilated mount 600" comprises an inverted cup-like structure with a closed top, or cap, portion 620". Preferably, with this embodiment of the invention, the inlet port 602" and the exit port 604" are located side-by-side, defined in the side wall portion 606" of the mount cup 600" as shown. These ports, or apertures, 602", 604", are preferably located and sized so as to facilitate easy and minimal interconnection of tubing, hoses, conduit, or other communicating structure 1175 (see FIG. 8d), as known in the art, for communicating inlet air to the mount 600" and exhausting air from the mount, as in the case of a hose interconnecting the exit port 604" with a heat exchanger 1140.

A difference between the mount 600" of FIG. 6g and mount 600' of FIG. 6f is that the inlet aperture 602" and exit port or aperture 604" are formed in the side wall 606" instead of top cap portion 620". Thus, the mount may be designed to be less tall or more wide, which may yield different thermal performance properties than a taller chamber 606'. Also, as shown, there are provided the inlet aperture 602" and the exit port 604" on the side of the mount 600". This may be beneficial for routing of an inlet high-pressure line (e.g., 1130 of FIG. 8d) and an exit conduit, or hose, 1175 may be more easily installed with a side mount configuration in certain situations. Further, as shown, there are provided screw holes 650 for mounting the chamber 600" to a pedestal as described previously.

Figure 6H:
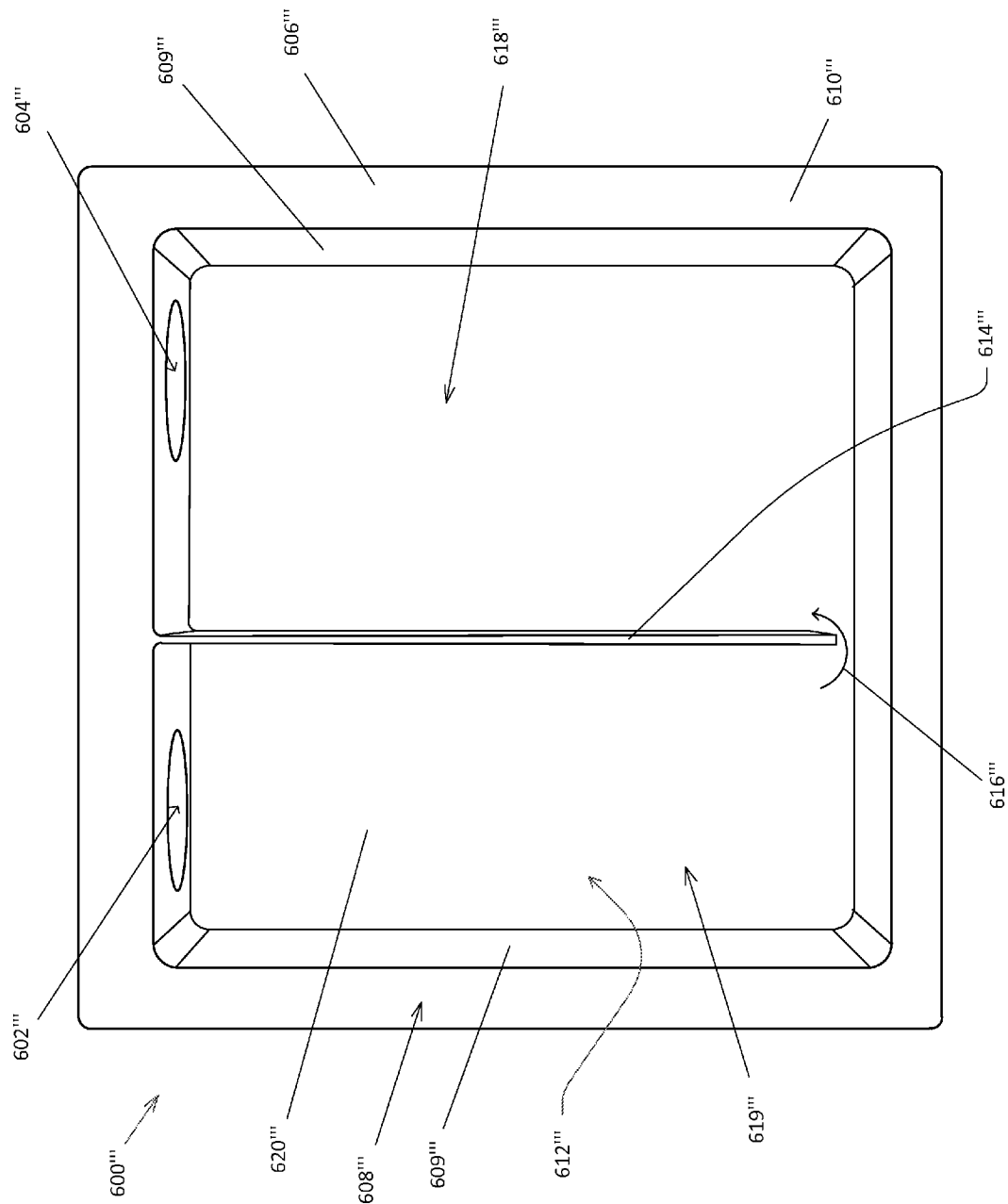
FIG. 6h is a bottom perspective view of a ventilated mount portion of apparatus for controlling temperature of a component in accordance with still another embodiment of the invention.

Referring now to FIG. 6h, an alternate mount chamber 600'" is shown that is similar to that of FIG. 6g. Alternate mount chamber 600'" comprises a chamber or socket 606' defined by a wall 608'" if rounded, or walls 608' if otherwise. The mount socket 606'" defines an inlet aperture 602' and an exit port 604'" and further comprises an inner wall surface 609'". For ease of reference this specification will refer to this member in the singular as walls 608'", however it is to be understood that the singular includes the plural in this case. At a base portion 610' of wall 608' there may be provided a seal or at least materials are selected for construction of the wall which provides a positive contact for engagement. Ventilated mount chamber 606'" comprises a hollowed-out countersink area 612'.

Within the hollowed out countersink area 612'", there is a baffle wall partition 614'". The baffle wall partition 614' serves to direct the air along more of the heatsink fins 555 (see e.g., FIG. 5c) and also allows the air, as shown by arrow 616'" to escape from around the baffle portion at 612'" along exit channel or chamber 618'" and out the exit aperture, port or hole 604'". Therefore, in operation, air enters the mount cup 600'" through inlet aperture 602'", passes through an inlet chamber 619', around the baffle wall as shown at 616'", through exit channel 618'", out the exit port 604'", and if attached for a regeneration version of the apparatus, through a hose 1175 (FIG. 8d) for recirculation.

The ventilated mount 600'" comprises an inverted cup-like structure with a closed top, or cap, portion 620'". Preferably, with this embodiment of the invention, the inlet port 602'" and the exit port 604'" are located side-by-side, defined in the side wall portion 606'" of the mount cup 600'" as shown. These ports, or apertures, 602'", 604'", are preferably located and sized so as to facilitate easy and minimal interconnection of tubing, hoses, conduit, or other communicating structure 1175 (see FIG. 8d), as known in the art, for communicating inlet air to the mount 600'" and exhausting air from the mount, as in the case of a hose interconnecting the exit port 604'" with a heat exchanger 1140'.

A difference between the mount 600'" of FIG. 6h and mount 600' of FIG. 6f is that the inlet aperture 602'" and exit port or aperture 604'" are formed in the side wall 606'" instead of top cap portion 620'. Thus the mount may be designed to be less tall or more wide, which may yield different thermal performance properties than a taller chamber 606'. Also, as shown, there are provided the inlet aperture 602'" and the outlet, or exit, port 604'" on the side of the mount 600'". This may be beneficial for routing of an inlet high-pressure line (e.g., 1130 of FIG. 8d) and an exit conduit, or hose, 1175 as may be more easily installed in certain situations with a side mount as shown with this embodiment. A difference between the mount 600" and the mount 600'" is that the baffle 614' is attached to one side wall 606'", but not the opposing side wall 606'", such that air travels into the mount chamber 606'", through inlet chamber 619'", around the baffle wall 614'", through outlet or exit chamber 618'" and out exit port 604'". With the mount 600", the baffle wall 614" is attached between two side walls 606", and the air passes beneath the baffle wall.

The inner surfaces of the walls of the various ventilated mounts of the invention may be round, square, or square with rounded corners, while the outer surface of the wall may be a different configuration to allow for easier manufacturing. Thus, it will be appreciated that the ventilated mount may comprise a round cross section, or a square, a rectangular, a pentagonal, an octagonal or other configuration may be employed, without departing from the true spirit and scope of the invention.

As described in connection with FIGS. 6b and 6c, the chamber/heatsink subassembly of any of the mount portion embodiments of the invention may be provided with screw holes adapted for screws (not shown) for holding the chamber, heatsink, pedestal and base members essentially as an integral unit. Similar screw/hole design is applicable for each of the various chamber/heatsink combinations shown in FIGS. 4a-e and 5a-e herein.

Figure 6I:
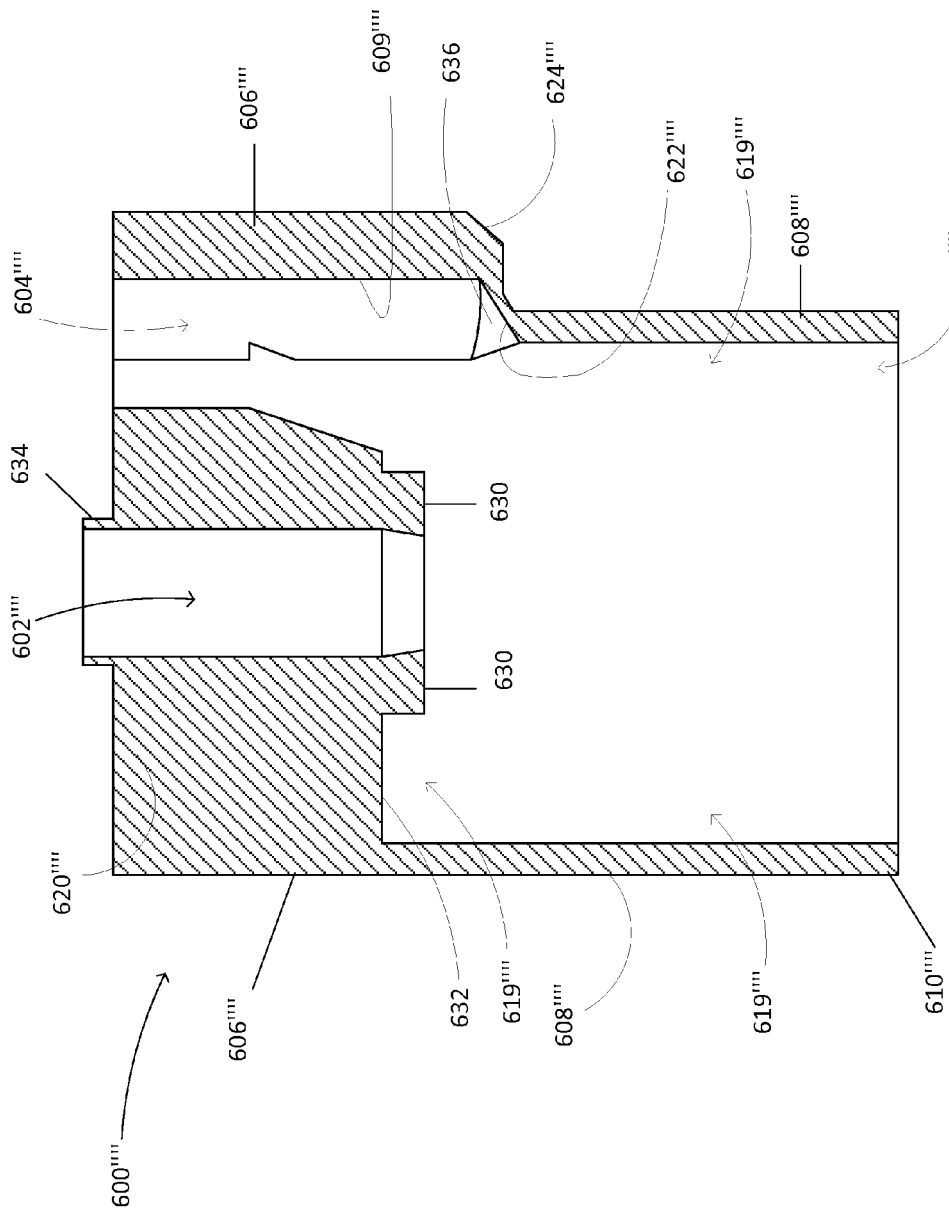
FIG. 6i is a front cross section view of another ventilated mount portion of apparatus for controlling temperature of a component in accordance with another embodiment of the invention.

Referring now to FIG. 6i, there is shown a preferred embodiment of a ventilated mount 600"" portion of a temperature control apparatus for use with an involute-type heatsink portion 1101 (see FIGS. 11a and 11b) and in accordance with the invention. The ventilated mount 600"" comprises a ventilated mount cup, chamber or socket 606"" defined by a wall 608"" if generally rounded or cylindrical, or walls 608' if configured as rectangular, square, pentagon, octagon or otherwise. The mount cup 606"" further comprises an inner wall surface 609"". For ease of reference this specification will refer to this member in the singular as walls 608"", however it is to be understood that the singular includes the plural in this case. At a base portion 610"" of wall 608"" there may be provided a seal or at least materials are selected for construction of the wall which provides a positive contact for engagement. Ventilated mount chamber 606"" comprises a hollowed-out countersink area 612"", an attachment airway, or inlet port, 602"" and an outlet exit port 604"" that communicates with an inner chamber 619"". The outlet exit port 604"" has an angled inner surface 636 for enhancing fluid dynamic flow of the air through the ventilated mount 600"".

Figures 11A, 11B:
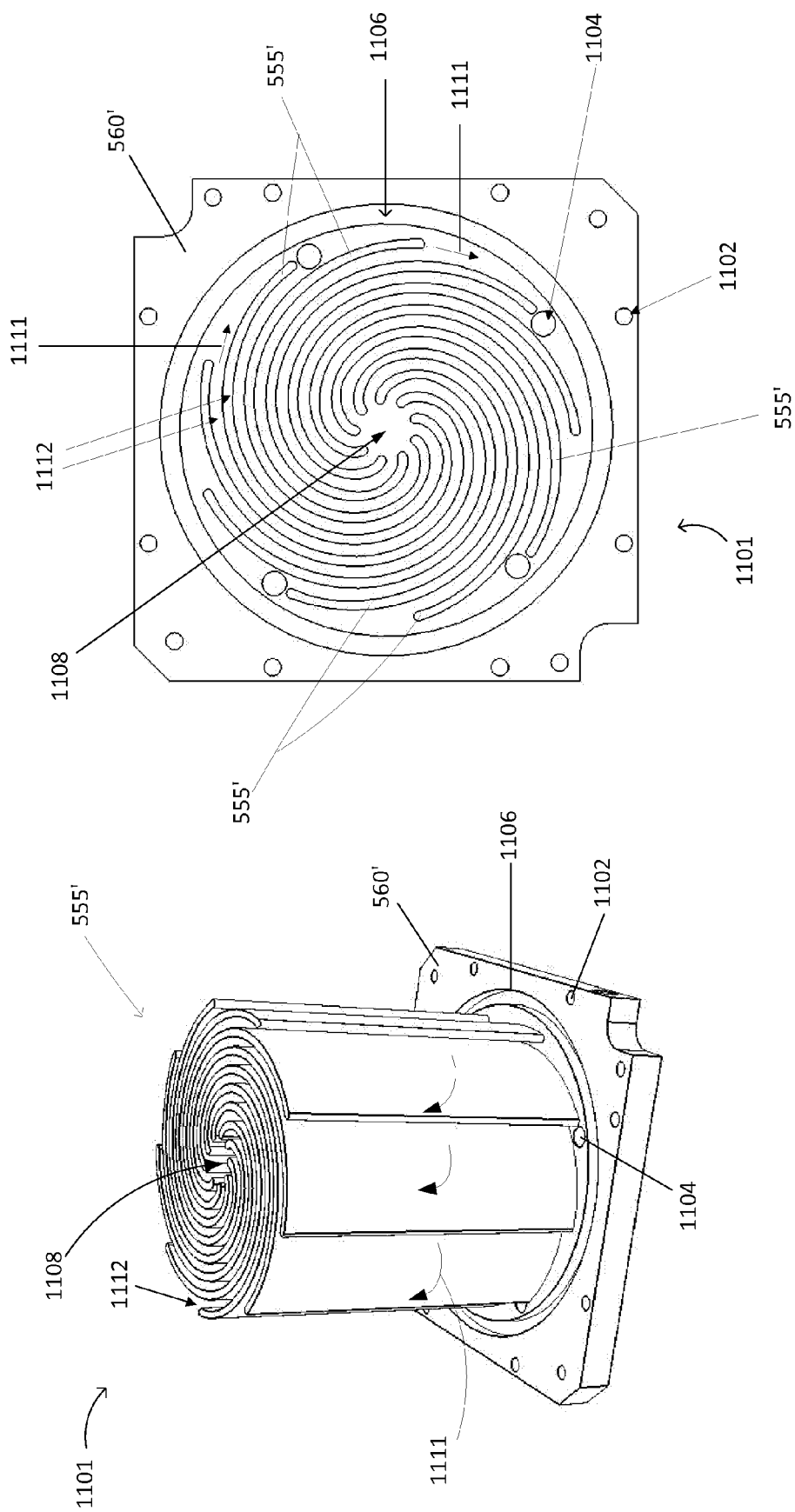

Ventilated mount 600"" does not comprise a baffle partition, but rather is designed for use with an involute-type heatsink portion 1101 (FIGS. 11a and 11b). Involute heatsink portion 1101 is designed to reside just within the hollowed out countersink area 612"". The involute heatsink portion 1101 comprises a central inlet location 1108, and curved fins 555'. The curved fins 555' are mounted and extend upwardly from heatsink base 560' having mounting holes 1102 and 1104 therein. On the base 560' and around the curved fins 555', there is provided a circular groove 1106, in which the base portion 610"" of wall 606"" of ventilated mount 600"" is adapted to reside and therein resides upon interconnection and positive engagement of the ventilated mount and the heatsink.

During operation, air enters the mount cup 606"" through inlet aperture 602"", passes into the central inlet location 1108 of the involute heatsink 1101 for dispersal through the curved fins 555' before it passes as shown at 1111 through spaces 1112 (FIGS. 11a and 11b) between curved fins 555' into an inlet chamber 619"", and out exit port 604"". If attached for a regeneration version of the invention, air from the exit port 604"" of the ventilated mount 600"" exits through a hose 1175 (see FIG. 8d) for recirculation.

The ventilated mount 600"" comprises an inverted cup-like structure with a partially closed (except for the central inlet port 602"" and the exit port 604"") top, or cap, portion 620"". Preferably, with this embodiment of the invention, the inlet port 602"" and the exit port 604"" are located side-by-side, defined in the top cap portion 620"" of the mount cup 606"". These ports, or apertures, 602"", 604"", are preferably located and sized so as to facilitate easy and minimal interconnection of tubing, hoses, conduit, or other communicating structure 1175 (see FIG. 8d), as known in the art, for communicating inlet air to the mount 600"" and exhausting air from the mount, as in the case of a hose interconnecting the exit port 604' with a heat exchanger 1140. The cap portion 620"" is designed with the central entrance or inlet port 602"" communicated in sealed fashion with the upper portion of the curved-fin heatsink 1101 at central inlet 1108 such that an inner wall portion 630 of the cap 620"" portion of the chamber 606"" closely seals the inlet port against the topside of the heatsink, to prevent immediate side-bypass to the exit port 604"". During operation, air is forced into the involute heatsink 1101 and then passes through the heatsink and exits at 1111 to inner chamber 619"" and up through an upper clearance cavity defined at an upper inner wall portion 632 by cap 620"" for ultimate exhaust through chimney or outlet exit port aperture 604"". The upper clearance cavity of chamber 619"" defined by upper inner wall portion 632 of cap 620"" allows for more optimal pressure drop characteristics for improved thermal performance of the mount 600"".

The involute heat sink 1101 has shown very good high-performance characteristics when employed with the appropriately designed mount, such as the mount 600"" shown and described in connection with FIG. 6i.

As adjustments are made to exit port aperture 604"" size, to accommodate tuning of the apparatus for a given application, appropriate sizing alterations also may be accomplished as shown at angled surface 622"" and ledge 624"", in designing the mount 600"".

The ventilated mounts of FIGS. 6e-k are constructed such that the inlet port delivers cooling air to the central funnel system (as in FIG. 6a), but with exhaust air directed to a topside (or other, ie sidemount) exhaust port location, which can then readily be transported as regenerative air, described in connection with FIGS. 8a and 8d herein. The funnel, or baffling, of the embodiments shown in FIGS. 6a-6h, if employed depending upon the embodiment chosen, may be of various possible shapes.

Figure 12B:
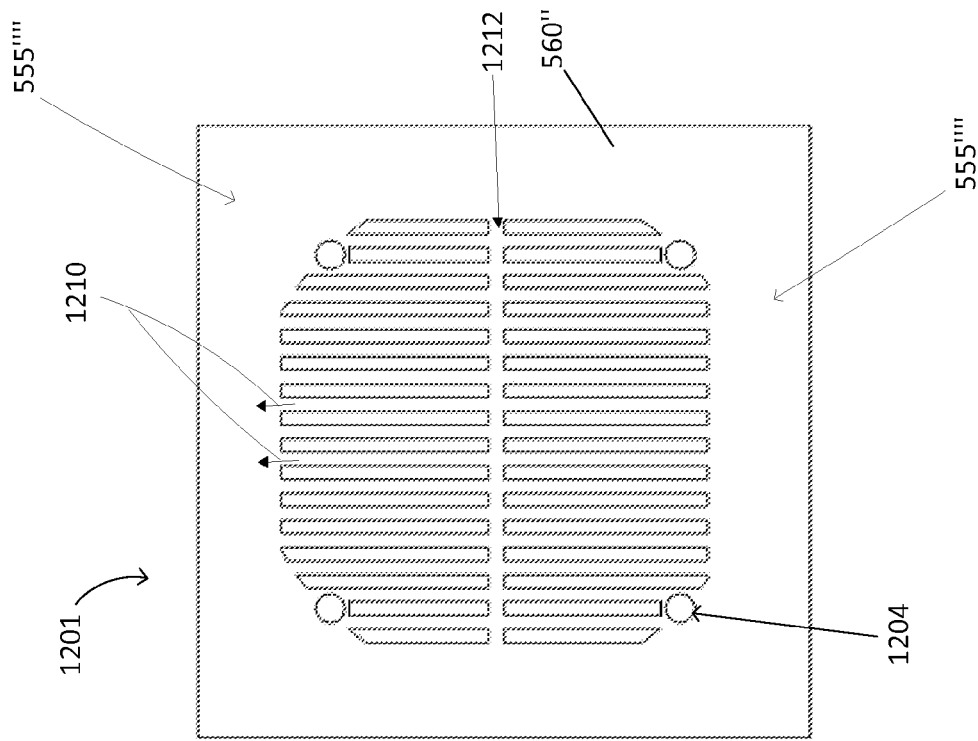
FIG. 12b is a top plan view of the straight-fin heatsink apparatus for use as part of the present invention.
Figure 12A:
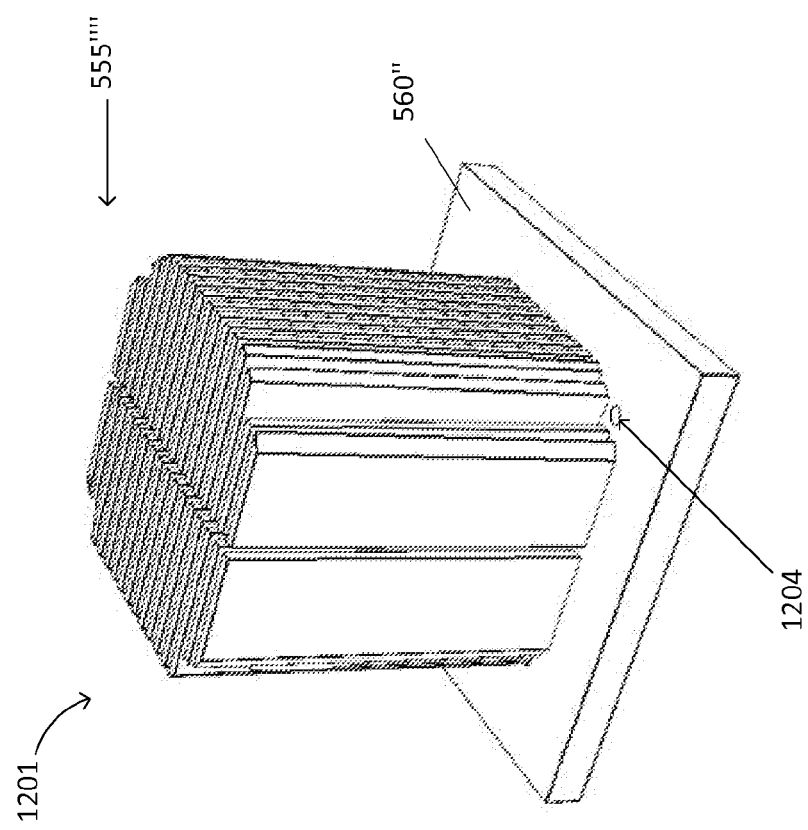
FIG. 12a is a perspective view of an alternate straight-fin heatsink apparatus for use as part of the present invention.

Referring now to FIGS. 12a and 12b, there is provided an alternate straight-fin heatsink 1201 having a plurality of straight fins 555" depending from a base 560" shown as having mounting holes 1204 formed therein. The straight-fin heatsink 1201 further comprises an internal chamber division 1212 allowing a single baffle wall to aid in performance enhancement of the overall system when used for example with the ventilated mount cup depicted in FIG. 6f. A high-density straight-fin design 1201 will typically give substantial performance enhancement over a pin-fin design heatsink 401. This is because the straight-fin design can provide at least two to three times the surface area improvement, within manufacturing capability. This is in harmony with standard performance enhancement procedure when dealing with air-cooled heatsink systems; the degree of fin density will typically vary with such factors as geometry, pressure drop and fabrication limitations.

With any of the above-described heatsink styles, a ventilated mount chamber comprising of multiple exit apertures for exhausting the chamber air could be implemented. However, for the regenerative design option, involving a single inlet and exit port on topside, the ventilated mount chamber would have to be specifically suited to match the heatsink. For pin-fin and straight-fin heatsink designs, this chamber would operate most efficiently utilizing an internal baffle wall, which would split the chamber into portions, preferably two halves, whereby the airflow would be redirected around the lower side of the baffle towards the exit port. The baffle could be a simple straight form, or for the pin-fin style, it could be a circumferential style as shown in FIGS. 6e and 6j. For the curve-fin (involute) heatsink design, the internal baffle is not required, however sealing against the heatsink top would be preferable for optimal performance (as shown in FIG. 6i).

Tuning for Performance and Noise Abatement

Performance Tuning

Preferably, the chambers 501, 502, 503, 504, 505, 600, 600', 600", 600''', 600"" of the invention are sized, the thickness of the chamber's walls are increased, and the chamber's aperture(s) are sized and spaced so as to be adapted for regulating air flow within the enclosure to maximize the magnitude of temperature achievable to an equilibrium state within the enclosure without compromising operation of the vortex tube. This feature will also allow operation of the invention at consistent temperature setpoints for appropriate dwell times required by a particular test. Thus, in combination with the various configurations of heatsink device contact combinations, it will be appreciated that a key feature of the invention is to allow efficient and accurate temperature ramping with an air flow device to a plurality of different, pre-selected temperature setpoints useful in a device testing scenario, depending upon which primary elements of the system of FIG. 1 are chosen for a particular application and upon which subassembly combinations are chosen demonstrated in FIGS. 3a-3c, FIGS. 4a-4e and/or FIGS. 5a-5e. Still further, as described below in connection with FIGS. 8a-8d, greater temperature extremes may be achieved by employing pre-cooling of the pressurized air source or combining vortex tube outputs. The pre-cooling systems of FIGS. 8a-8d are most easily suited for use with a regeneration version of the invention which allows recirculated air from exit port 604', 604", 604''', or 604''''. Such designs allow lower incoming air delivery temperature, which thus improves net performance. These latter preferred designs have a single exit port to provide the regeneration airflow path back to the precooler.

Thus, the number, size and location of the apertures may be adjusted in order to tune the ventilated mount to optimize performance of a particular vortex tube and to adapt the mount to regeneration and precooling systems as described. Excessive back pressure on the vortex tube hinders its performance. Low back pressure on the cold outlet of the vortex tube up to 2 psig will not negatively impact performance of the vortex tube, but as much as 5 psig will change the temperature of the outlet cold air by up to 2.8° C. Thus, the apertures 540 in the wall 515 must be of sufficient number and size to keep the back pressure on the outlet of the vortex tube within a tolerance, if any, for reduced efficiency of cold output air for a given application. Too large of apertures, or too many apertures in the ventilated mount would lead to poor cooling performance by the vortex tube subsystem.

Noise Abatement Tuning

Further, the number, size and location of apertures 540, or alternatively 604, 604', 604", or 604''', 604'''' and the thickness of the wall of the ventilated mount may be used to tune the noise abatement properties of the thermal control apparatus of the present invention. The use of baffling as described above in connection with the various embodiments will further aid in the reduction of noise of the system during operation. As an example, an embodiment of the ventilated mount disclosed in FIG. 5b has reduced the exhaust head noise to ~70-73 dB, whereas the embodiment of the ventilated mount disclosed in FIG. 5c has reduced the exhaust head noise to ~83 dB. The embodiments of the invention shown in FIGS. 6e-6k, used in connection with a regeneration system, achieve even better noise abatment. For comparison, in an office with no talking, slight computer hums, the noise level is ~50-55 dB, and in an office with talking the noise level is ~60-70 dB.

Regarding noise abatement for the pressurized air delivery system, there may be required the use of an appropriate muffler or silencer, at the vortex tube exhaust locations, as well as engineered placement of exit apertures of arbitrary shape, on the ventilated mount, or additional muffler-type design features including noise reduction materials. In designing for noise abatement, optimization of thermal performance is coupled to back-pressure effects of the ventilated mount, since pressure loss will degrade air temperature delivery from the vortex tube system, which in turn must be weighed against noise level acceptability, due to the final air exhaust at the ventilated mount.

Total exhaust air exit flow area should be maintained as in best practice, in similar or greater proportion to the entrance air delivery flow area from the vortex tube system; size of individual exit apertures ideally would be minimized and in multiplicity for total flow area balance to help reduce exhaust noise effects.

Overall Balancing

There is a balance between performance and noise abatement inherent in the design of the multiple-exit-aperture embodiments of the ventilated mounts shown herein. While certain designs have better temperature performance characteristics, such as the regeneration and pre-cooling system embodiments described above, others may have greater noise abatement properties as indicated above. Of the multiple-exit-aperture embodiments shown and described, in terms of performance, the embodiment shown in 5c appears to be best. Next best in terms of thermal performance of multiple aperture embodiments is the embodiment shown in 5b, and the next best is shown in FIG. 5a. But the opposite is true when considering noise levels. In other words, the noise level is lowest for the embodiment shown in FIG. 5a, the next quietest is that of the embodiment shown in FIG. 5b, and the next quietest after that is that of the embodiment shown in FIG. 5c.

Figure 8A:
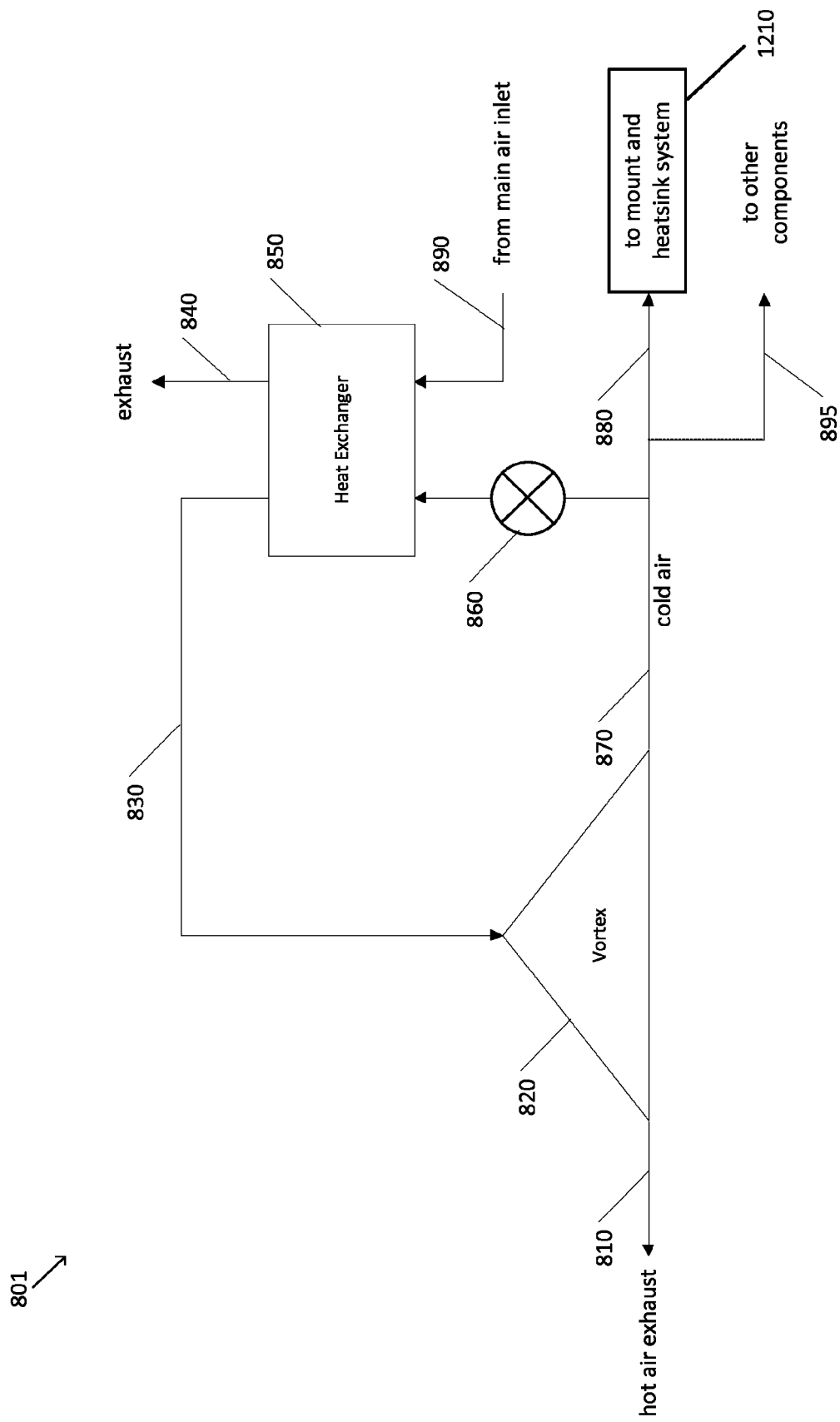
FIG. 8a is a schematic flow diagram illustrating a system for pre-cooling inlet air to a vortex tube in accordance with an embodiment of the invention.
Figure 8B:
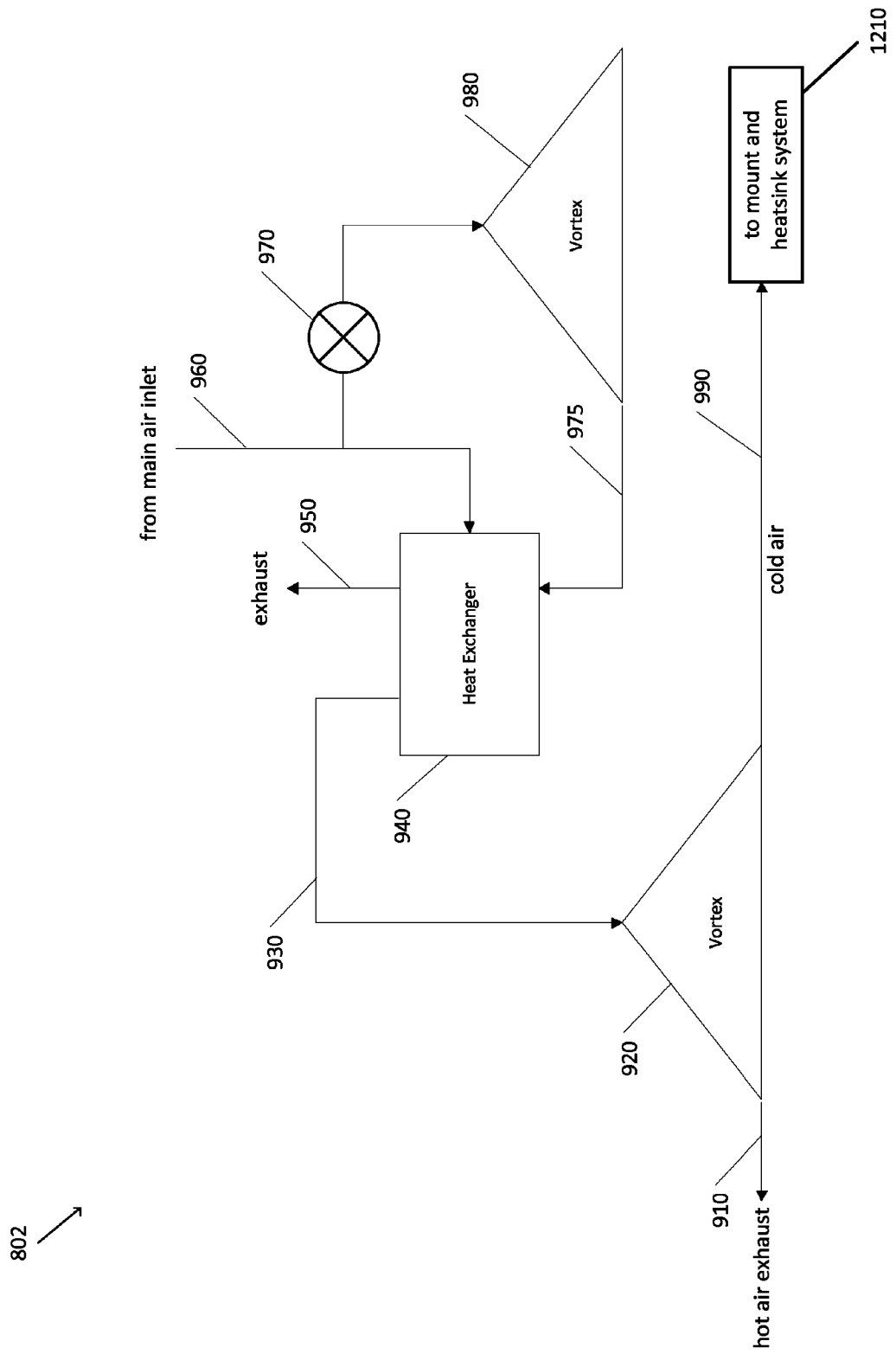
FIG. 8b is a schematic flow diagram illustrating a system for pre-cooling inlet air to a vortex tube in accordance with another embodiment of the invention.
Figure 8C:
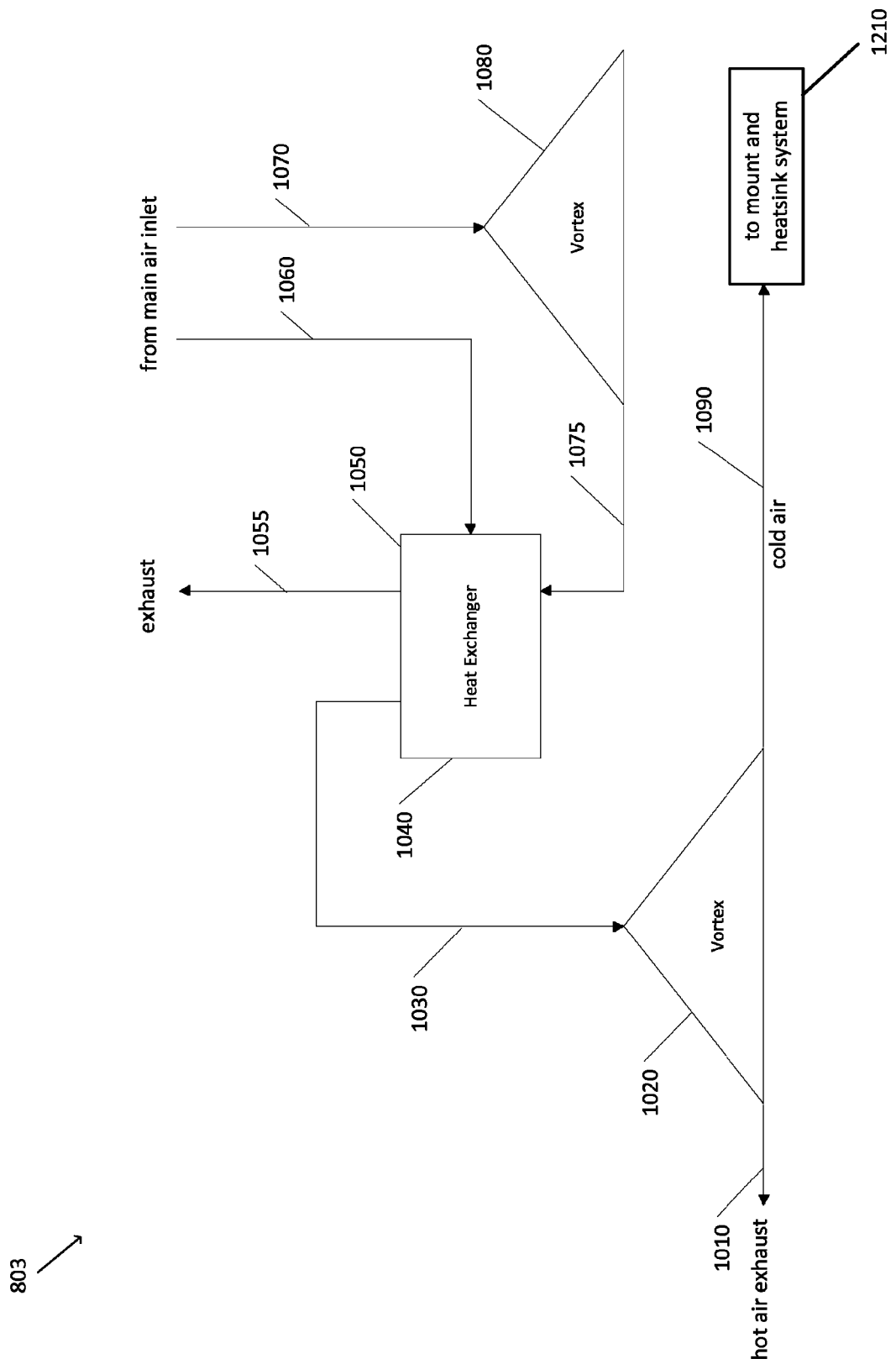
FIG. 8c is a schematic flow diagram illustrating a system for pre-cooling inlet air to a vortex tube in accordance with yet another embodiment of the invention.
Figure 8D:
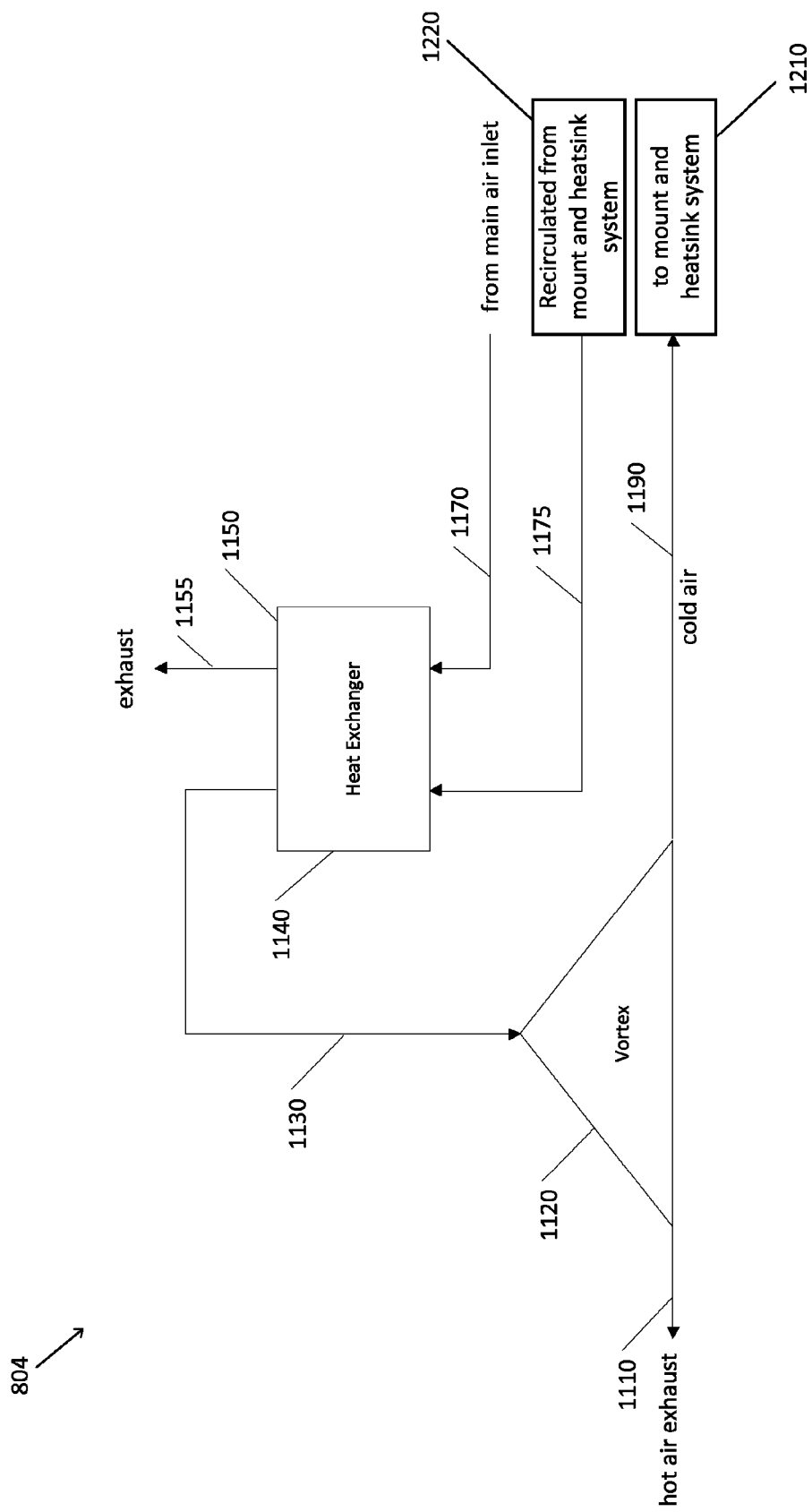
FIG. 8d is a schematic flow diagram illustrating a system for pre-cooling inlet air to a vortex tube in accordance with still another embodiment of the invention.

The alternate single-exit aperture embodiments, as shown in FIGS. 6e, 6j, 6f, 6k, 6g, 6h, and 6i, wherein there is enabled exhaust airflow that is redirected for regeneration as shown in FIGS. 8a and 8d, that is, where air is not exited at multiple chamber perforations, but rather a single exit port, represent even further reduced noise and frost abatement properties in some applications. While inlet/outlet port sizes, if overly constrictive, may contribute to increased local noise at certain air-pressures and temperatures, designing around the noise issue is less of a problem with the single exit port design embodiments, because of the relative ease of adjusting a single exit port diameter as compared to multiple exit port diameters. Nevertheless, since thermal performance of the apparatus, is impacted by pressure loss in hoses, depending again upon the size of the hose and exit port chosen, preferably both the inlet and outlet hose flow area and connections are made as large as possible. Further, since the embodiments entailing redirection of exhaust air through a single exit port to a heat exchanger would include a hose length back to the heat exchanger (i.e. as shown in FIG. 8d) tuning of the design of the overall apparatus for desirable temperature, noise abatement characteristics and frost prevention characteristics in accordance with the principles disclosed herein is able to be accomplished. In sum, while the regenerative designs of FIGS. 6e-6k reduce condensation, and hence frosting, as well as exhibiting noise abatement properties depending upon the application and as previously described, other applications where noise abatement isn't as critical, and/or where extreme temperatures are not as critical, or where regeneration of air from the target area is not indicated, other alternate embodiments including multiple aperture embodiments, may be employed. Testing has shown that, generally, if too cold of air is exited at multiple very small apertures, there is a tendency towards local frost buildup. The use of dry-air (i.e., at least having a dewpoint less than the vortex cold delivery air temperature) has shown to prevent undesirable internal frost buildup that may occur during extended times of operation of the system at such locations as the vortex generator, fittings and tubing. An industry standard −40° F. dewpoint pressurized air delivery means would suffice for safe unhindered operation of most vortex system purposes. Colder dewpoint delivery means, for example industry standard −60F to −100F, would allow even further margin of frost free operation if colder vortex temperatures are tuned. Compressed air supply having minimal dryness, for example minimal industry systems typically having 50° F. dewpoint dryness capability, may be insufficient for continuous long term use with the vortex system without experiencing undesirable frosting on system components.

It is important to note that air dewpoint specification is necessary to prevent both internal as well as external frosting, both of which can directly lead to air flow blockage in the system and thus loss of thermal performance. The external frosting could occur in a non-regenerative system setup, that is, with the ventilated mount chamber having multiple exit apertures, and evaluatory tests should be performed to ensure safe operation within a particular test environment. Even if the vortex system has clean, dry air, the external (ambient) environment will typically have an elevated dewpoint temperature, and thus any local condensation/frosting may occur at exit locations where differing air streams interact.

One way to avoid frost buildup in extremely cold testing target area environments, and hence avoid local electronic equipment water damage associated with defrosting upon system shut off, is to employ a single exit aperture embodiment of the invention. With such a system, it has been determined that a −40° C. low dewpoint air supply allows the vortex system, with regeneration, to operate safely for extended time periods without risk of frost buildup.

Thus, while the air chamber may be fully open, thereby allowing escaping air with the least pressure resistance, this also usually would provide the least temperature performance capability for the system. A perforated chamber, having one or more strategic exit port aperture locations, allows for better overall thermal performance, however this must be designed carefully so as to not overly increase the back pressure which would be felt by the vortex delivery system (hence adversely affecting its delivery performance). The exit port aperture locations, or location, could be located essentially on any exposed surface of the chamber (top, sides or bottom), however thermal performance and pressure would optimize these locations.

Figure 9:
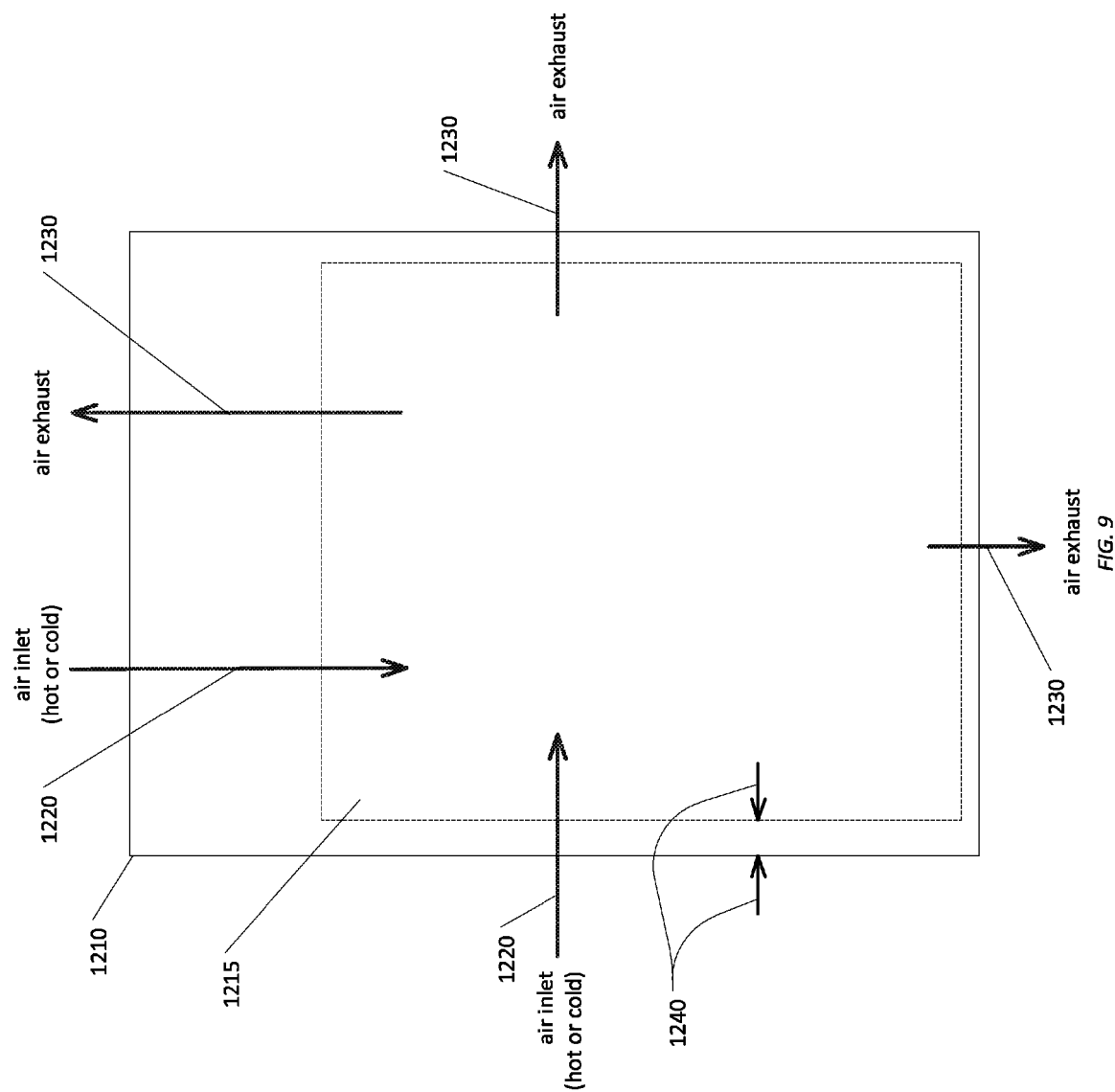
FIG. 9 is a graphic illustrating relative wall thickness design parameters for tuned performance and noise abatement in accordance with the present invention; [100]

Referring to FIG. 9, while the thickness and material of the chamber 1210, 1215 itself are critical, the shape can be somewhat arbitrary. FIG. 9 illustrates thinner versus thicker walls for chamber selection. Top wall thickness 1210 per FIG. 9 should be sufficiently thick to provide complete insulation, as typically carries the inlet port location 1220. Sidewalls 1240, however, are best on the order of approximately $\frac{1}{8}^{th}$ inch thick if other packaging constraints permit; side wall thickness up to ¼inch thickness were not found to adversely impact back pressure. Air exhaust 1230, for example through apertures, could appropriately be through side walls, or through a bottom wall as shown. Thus, while wall thickness should be maximized, design consideration must also be given to overall dimensional restraints, as well as pressure drop created by exit aperture port lengths which traverse the walls.

It will be appreciated that if the outer configuration of the fins is square, the cross-section shape of walls 515 might also be square, the same being true with a rectangular-shaped fin configuration and a rectangular-shaped wall configuration. Further, it will be appreciated as shown in FIGS. 6b and 6c that an inner surface 516 of the wall 515 may be square, or square with rounded corners as shown, while the outer surface 517 of the wall 515 may be a different configuration to allow for easier manufacturing for example to create apertures in the wall 515.

As a matter of design, the air chamber internal cavity, which is occupied by the heatsink extended surfaces, must be considered as a refrigeration control volume, wherein cold supply air, from the vortex tube supply, should be insulated from the external ambient environment as much as possible. Thus, the chamber is preferably selected of low thermal conductivity material, such as preferably ABS plastic material, which can withstand sub-zero temperature levels without risk of fatigue. However, other materials that have similar and otherwise desirable properties given a particular application may be employed.

Figure 7A:
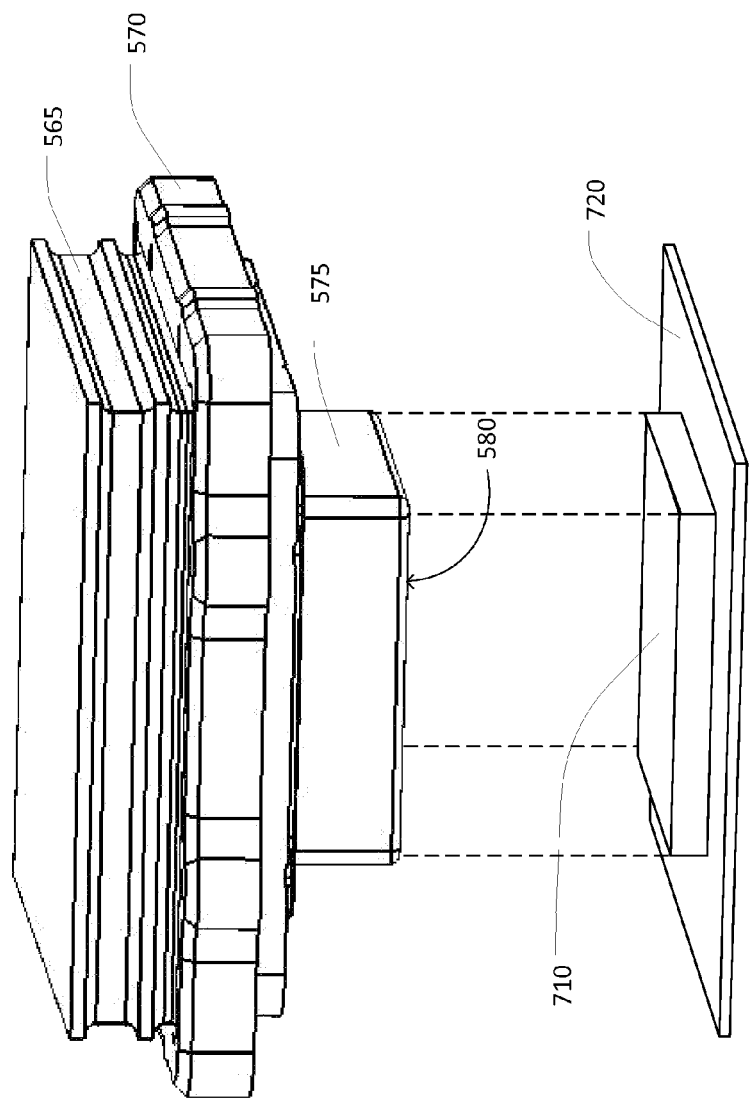
FIG. 7a is perspective view of part of a testing apparatus suitable for use with the present invention to provide a contact interface with a device.
Figure 7B:
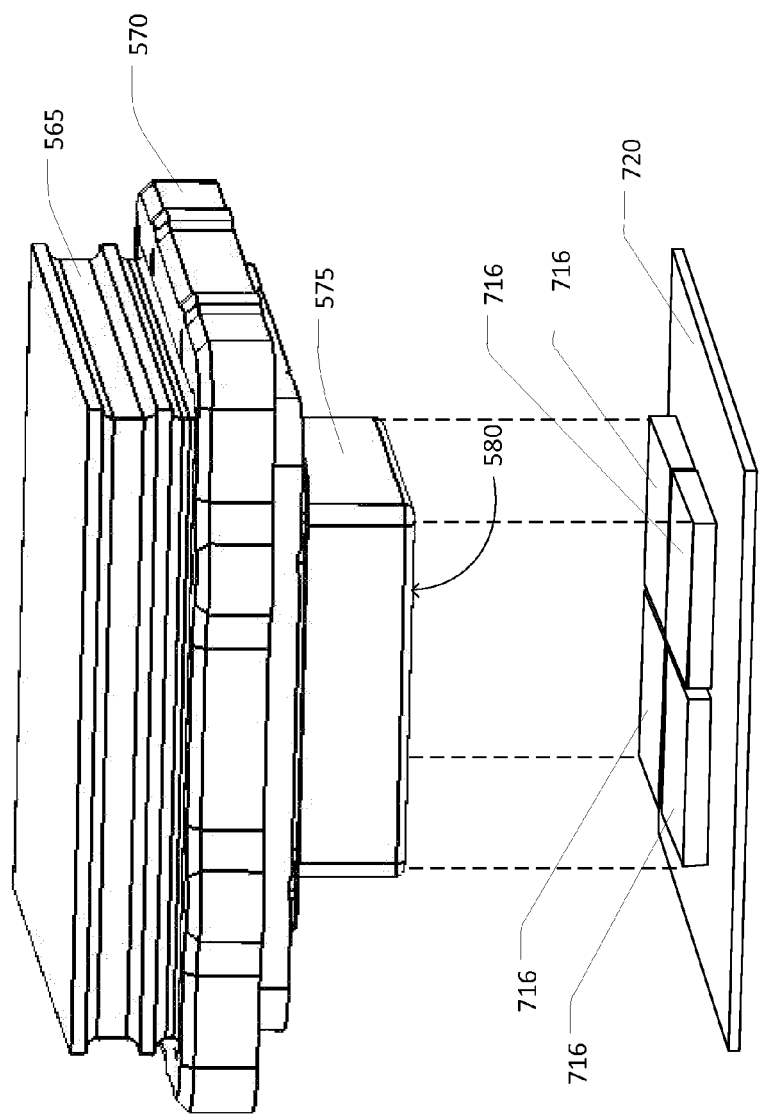
FIG. 7b is a perspective view of part of an alternative testing apparatus suitable for use with the present invention to provide a contact interface with a plurality of devices.

FIGS. 7a and 7b shows variations in the target contact zone/surface 580, where a single arbitrary device 710 comprises a surface area depending from substrate or pedestal 720, the device presenting a rectangular surface area, or otherwise, or multiple surfaces 716 on a pedestal 720 might be accessed. The mechanical contact interface 580 (i.e., the lower pedestal) of the heatsink system (e.g., heatsink system 402 having a TEC 565, pedestal 570 and contact member 575 as shown) would be appropriately sized for mating with these device surfaces 716. In electronic test systems, the device 710, or plurality of devices 716, may also be contained within a test socket (not shown), or test sockets, as well known in the art, necessitating sufficient lower pedestal clearances for providing final contact conditions.

Control, Testing and Recording Apparatus

In accordance with this, and other, aspects of the invention, there is provided recording means adapted for recording the component's activity at a particular temperature setpoint and test. Referring again to FIG. 1, such systems, include control system apparatus 105, test measurement system 121 and recording systems 103, are generally known in the art of testing semiconductor devices. Controller 105 has a user interface 101, various input/output connections 110, 115, 120, 121 for inputs to the controller being used to sample measured current conditions and other device operating parameters or metrics and outputs being used to control effectors such as vortex tube, heaters, coolers, etc. Thus, control for programming, measuring, recording and storing of test results of a device under test 160 are shown with control system 105, user interface 101 and electrical/software inputs/outputs 121 to a device control and measurement apparatus 165 as are known in the art. The controller 105 is able to be programmed to perform an automated sequence of steps involved in a particular test, such as supplying pre-determined temperature setpoints and taking action based upon the input values as known in the art. A system for recording and storing measured parameters and metrics 103 is operatively connected to the controller comprising data storage means well known in the art. An example of a known semiconductor testing system is demonstrated in U.S. Pat. No. 7,394,271 to Lopez et al. and related references. In the '271 patent, current consumption of the device under test is measured under a variety of temperature conditions. Other measurements of the device are possible with such a system.

Operation and Design Considerations

An object of the invention is to ramp to and control a design target setpoint temperature, for reference as indicated by the pedestal contact zone, via a mechanical contact. For semiconductor test, this would imply the surface temperature of a device, be it of typical package construction or an exposed die. Also, this surface or device may or may not have an inherent power dissipation which must be additionally thermally "pumped" into the heatsink system, as with a heat pipe, a thermoelectric cooler or a fan. The larger the power dissipation, the more capable the heatsink system needs to be, and the TEC must be able to pump this dissipation level. This has usually implied standard use of larger heatsinks and/or larger airflow and/or colder or hotter air temperatures.

The surface size of the contact zone may vary, and this dictates the dimensional constraints of the system; the pedestal contact zone typically will match the required device target surface, and the overall girth dimensions of the heatsink assembly system can be dictated by electronic board constraints, or socket-to-socket spacing, as examples. These dimensional constraints may also dictate whether the vortex cooler system can be placed in close proximity to the heatsink system; typically there would be physical extensions, both mechanical and electrical extensions, between the two systems requiring connecting members.

The operation of the heatsink assembly consists typically of hot or cold mode setpoints. These can usually be attained by supplying the heatsink with an air flow and reduced or elevated temperature, either cold or hot compared with ambient. The heatsink itself, having an integral or separate pedestal assembly, could provide the needed requirements for a thermal target to which the output of a vortex tube may be directed. If a thermoelectric cooler is included in the assembly, it will dramatically improve both hot and cold mode operations, since substantial temperature differentials can be attained with such a thermoelectric subsystem.

By providing a suitable cold airflow from the vortex cooler system, setpoint temperature can be targeted by operating the heatsink system with a thermoelectric cooler. If maximum cold air temperatures are sought, that is for cold mode setpoint, then typically the vortex cooler system would need to be tuned for maximum cold temperature delivery, implying least amount of airflow cold fraction at highest possible air pressure. Conversely, maximum hot air temperature can be attained with larger cold fraction, that is for hot mode setpoint operations.

It will be appreciated by those of ordinary skill in the art that while air is the primary gas with which the vortex tube is operable to accomplish the purposes of the invention, other gases that are compatible for use with the apparatus disclosed and the component concerned would fall within the true scope and spirit of the claims of the invention appended hereto. For example, it is conceivable that nitrogen gas may be used with the present invention without modification to the apparatus of the invention or the methods described. Use of such may have the beneficial effect of retarding flame and/or operating to cooler temperatures.

The range of temperature operation for semiconductor device tests typically comprise, at the point of mechanical contact, or at the location of the device or a lid holding the device in a socket, target setpoint temperatures of $-40°$ C.$<$Tc$<125°$ C. A wider range of $-55°$ C.$<$Tc$<150°$ C. is appropriate for some applications. Test setpoint cycling rate requirements typically vary as 0.3 to 2° C./second for a hot ramp to a hot setpoint, and 0.2 to 0.5° C./second for cold ramp to a cold setpoint. Thus, the lower rates would correspond to a normal benchtop rate of about 300 seconds to attain $-40°$ C. (from 25° C. ambient), and similarly to 125° C. for hot ramp. The faster rates represent about the maximum values desired in high repetitive cycling applications. The normal setpoints and rates are attainable using the proposed vortex tube assisted air-cooled heatsink system, however setpoint and rate enhancement can be further improved with optimal heatsink design, colder air delivery, as discussed further below in connection with an alternate, and for hot ramp through switchable use of vortex hot exhaust air and/or cartridge heater supplementary usage.

In summary, essential design features of the ventilated mount (chamber) have been determined and are notable for optimal performance: 1) Thicken the walls of the chamber as described above in connection with FIG. 9. This helps to "hold" the low internal air temperature for cooling mode. 2) Direct cold air intake from vortex supply to the lower portion or base of a standard finned heatsink or to fins of a heatpipe heatsink. 3) Employ internal funneling and baffling design features while not overly restricting the flow area so as to have too great of pressure loss which would negatively impact vortex output performance and entail noise penalties. 4) Exhaust air thru higher located multiple apertures on the chamber walls, with confirmed flow exit area conserved, or alternately exhaust air through a single exit aperture that is appropriately sized and preferably coupled with an air pre-conditioning system. While minimum size of multiple exit aperture embodiments, on the order of 1 mm in diameter, may assist noise reduction as well as performance, too small of apertures may hinder performance due to condensation obstruction, and as described above, a single exit aperture mount with pre-conditioning offers noise abatement, frost prevention and thermal gains in certain situations depending upon the application. Thus, for example, a preferred system for temperature control of devices under test, such as IC chips, is a single exit aperture mount coupled to a regenerative air pre-conditioning system, such as a heat exchanger.

Preconditioning of Input Air to Vortex Tube System

FIGS. 8*a*-*d* illustrate options for pre-cooler systems, which pre-condition, or cools as illustrated in the figures, the incoming air supply which is fed to the pressurized air system and vortex cooling system.

FIG. 8*a* shows a pre-cooler system 801 comprising a valved bleed, as would be provided for example with a solenoid 860, off from the cold air exhaust 870 of the vortex cooler system 820, which would cool incoming air via a heat exchanger 850. Heat exchanger 850 comprises a first air inlet for receipt of cold inlet low pressure air from the solenoid 860, a second inlet for receiving pressurized air from the pressurized air system as shown at 890, an outlet for exhaust 840, and an outlet for supplying pre-conditioned air 83 to the inlet of the vortex tube 820.

In effect, cold air from the vortex tube 820 is allowed to bleed off of the system at 870, 860 in order to pre-cool the inlet air for the same vortex tube 820.

FIGS. 8*b* and 8*c* show pre-cooler subsystems 802, 803 respectively, which use a second vortex cooler system 980, 1080 to utilize incoming air 960, 1060 from the pressurized air supply, either valved at 970 as shown in 8*b*, or direct separate supply at 1060 as shown in 8*c*, which then similarly feeds the cold air to a heat exchanger 940, 1040 to cool the primary vortex cooler system 920, 1020 with hot air exhaust 910, 1010 and cold air outlet 990, 1090.

FIG. 8*d* illustrates a pre-cooler subsystem 804 for recirculation of cold air 1175 exhausted from the ventilated mount of the heatsink system, which is used similarly as in the apparatus shown in FIG. 8*a* to feed a heat exchanger 1150 which cools the incoming air 1130 to the primary vortex cooler system 1120.

In this alternative aspect and embodiments of the invention, pre-condition of air supplied to the thermal control system of the invention enables greater temperature ramping, control and range performance of the system. With pre-cooling, temperatures as low as $-55°$ C. as measured at the pedestal contact zone are achievable. With pre-heating, temperatures greater up to 150° C. are achievable, and especially hot ramp rate improvement is achieved. This would provide additional net airflow temperature cooling capability for test assemblies, as well as stabilize incoming temperature variations. Further, these pre-cooler systems help counteract the negative performance effect of back pressure on the vortex tube subsystem.

While the aforementioned pre-conditioning embodiment is shown as dealing with pre-cooling input to the vortex tube subsystem, it will be appreciated that a similar system could be used for pre-heating purposes without departing from the spirit and scope of the appended claims. For current device testing applications, non-pre-heated exhaust has been found sufficient, however, should higher operation temperatures of a device under test be developed, pre-heating may become a requirement and such would be covered by the appended claims hereto.

As shown in FIG. 8a, in accordance with another aspect of the invention, downstream bleed air from the vortex tube system may be used as shown at 895 to cool other testing or thermal control apparatus, such as a printed circuit board, a test socket, or other device in the environment needing cooling. This may be accomplished in several ways: For example, a separate dedicated line may extend from, bleed off, the vortex supply system before it reaches the heatsink system. Or, at the heatsink system, some of the supply air may be bled off at that point. Alternatively, bleed air may be used from an internal passageway, for example through the heatsink or inside the chamber. Or an exterior bleedoff may be incorporated which uses some of the ventilated air from the chamber for this purpose.

While several embodiments of the present invention have been shown and described, it will be apparent to those skilled in the art that many changes and modifications may be made without departing from the invention in its broader aspects as set forth in the appended claims.

What is claimed is:

1. Thermal control apparatus adapted for use with a pressurized air supply for ramping a component to a temperature setpoint comprising:
   a vortex tube having an inlet adapted for connection with the pressurized air supply, a cold air outlet, and a hot air outlet;
   a ventilated mount comprising an inlet communicating with an inward hollowed chamber having a rim, the inlet of said ventilated mount connected to at least one of the outlets of said vortex tube;
   heat exchange means comprising a plurality of fins mounted on a base, the fins extending from the base into the inward hollowed chamber of said ventilated mount, the base of said heat exchange means adapted for sealed engagement with the rim of the chamber to form an enclosure for the fins of the heat exchange means, the base of said heat exchange means also making a thermal connection with the component; and
   means adapted to be operatively connected with the pressurized air supply for controlling the output temperature of said vortex tube so as to be adapted for ramping the component to a temperature setpoint.

2. The apparatus of claim 1, further comprising a pedestal having a contact interface for thermally engaging the component, wherein the base of said heat exchange means resides on said pedestal, and wherein the chamber has a plurality of apertures therein for regulating the air flow out of the enclosure and enhancing the temperature of the air to which the fins of said heat exchange means are subjected within the enclosure during operation of said vortex tube.

3. The apparatus of claim 2, further comprising means operatively connected with said heat exchange means for enhancing the efficiency of the heat exchange means for controlling the temperature of the component, wherein the rim of the chamber is adapted for engagement with the base of said heat exchange means to form an enclosure comprising the chamber and the base of said heat exchange means, the enclosure being closely adjacent said heat exchange means, and wherein the chamber has a plurality of apertures therein for regulating the air flow out of the enclosure and enhancing the temperature of the air to which said heat exchange means is subjected within the enclosure during operation of said vortex tube.

4. The apparatus of claim 2, wherein the inlet of said ventilated mount is in communication with both the cold and hot air outlets of said vortex tube, and further comprising means operatively connected with said vortex tube for controlling either cold air or hot air stream directly passing into said ventilated mount for ramping the temperature within the enclosure to a plurality of setpoints.

5. The apparatus of claim 2, further comprising means internal of the chamber of said ventilated mount for directing air flow from the inlet of the ventilated mount to adjacent the base of the heat exchange means, and wherein the apertures in the chamber are spaced a distance from the base of the heat exchange means to encourage air flow from the base of said heat exchange means, traveling along and adjacent the length of the fins of the heat exchange means and exiting the apertures.

6. The apparatus of claim 3, wherein said means operatively connected with said heat exchange means further comprises a thermoelectric cooler, wherein the base of said heat exchange means resides on and adjacent the thermoelectric cooler, wherein the rim of the chamber is adapted for engagement with the base of said heat exchange means to form an enclosure comprising the chamber and the base of said heat exchange means, the enclosure being closely adjacent said heat exchange means, and wherein the chamber has a plurality of apertures therein for regulating the air flow out of the enclosure and enhancing the temperature of the air to which the heat exchange means is subjected within the enclosure during operation of said vortex tube.

7. The apparatus of claim 5, wherein said means operatively connected with said heat exchange means comprises a cartridge heater retained within said pedestal for assisting with raising the temperature of the component.

8. The apparatus of claim 2, further comprising recording means for recording the component's activity at a particular temperature setpoint.

9. The apparatus of claim 8, further comprising a temperature sensor retained within said pedestal for transmitting temperature values to said recording means.

10. The thermal control apparatus of claim 1, further comprising an air pre-conditioning subsystem adapted for providing enhanced temperature air to the inlet of said vortex tube.

11. The thermal control apparatus of claim 10, wherein said air pre-conditioning subsystem further comprises:
    a heat exchanger having a first inlet adapted for receiving pressurized air from the pressurized air supply, a second inlet adapted for selectably receiving part of the outlet air from at least one of the outlets of said vortex tube, said heat exchanger also comprising a first outlet adapted for supplying air to the inlet of said vortex tube adapted for connection with said pressurized air supply and a second outlet for exhaust, wherein said heat exchanger is adapted for at least one of pre-heating and pre-cooling the pressurized air source prior to receipt by said vortex tube.

12. The thermal control apparatus of claim 10, wherein said air pre-conditioning subsystem further comprises:
    another vortex tube having an inlet adapted for receipt of air through its connection with said pressurized air supply, a cold air outlet, and a hot air outlet; and
    a heat exchanger having a first regulated inlet adapted for receiving pressurized air from said pressurized air supply, a second inlet adapted for receiving the outlet air from at least one of the outlets of said another vortex tube, said heat exchanger also comprising a first outlet for supplying air to the inlet of said vortex tube adapted for connection with said pressurized air supply and a second outlet adapted for exhaust, wherein said heat exchanger is adapted for at least one of pre-heating and pre-cooling the pressurized air source prior to receipt by said vortex tube.

13. The apparatus of claim 1, further comprising a pedestal, wherein the base of said heat exchange means resides on said pedestal, and wherein the chamber of said ventilated mount further comprises an exit aperture therein for regulating the air flow out of the enclosure and enhancing the temperature of the air to which the fins of said heat exchange means are subjected within the enclosure during operation of said vortex tube.

14. The apparatus of claim 10, further comprising a pedestal, wherein the base of said heat exchange means resides on said pedestal, wherein the chamber of said ventilated mount further comprises an exit aperture therein for regulating the air flow out of the enclosure and enhancing the temperature of the air to which the fins of said heat exchange means are subjected within the enclosure during operation of said vortex tube, and wherein said apparatus further comprises a conduit interconnecting the exit aperture and said air-preconditioning system.

15. The apparatus of claim 14, wherein said air pre-conditioning subsystem further comprises:
   A heat exchanger having a first inlet adapted for receiving pressurized air from said pressurized air supply, a second inlet adapted for selectably receiving part of the outlet air from at least one of the outlets of said vortex tube, said heat exchanger also comprising a first outlet adapted for supplying air to the inlet of said vortex tube adapted for connection with said pressurized air supply and a second outlet for exhaust, wherein said heat exchanger is adapted for at least one of pre-heating and pre-cooling the pressurized air source prior to receipt by said vortex tube.

16. The apparatus of claim 14, wherein said air pre-conditioning subsystem further comprises a heat exchanger having a first inlet adapted for receiving pressurized air from said pressurized air supply, a second inlet adapted for receiving recovered exhaust air from said ventilated mount, said heat exchanger also comprising a first outlet adapted for supplying air to the inlet of said vortex tube adapted for connection with said pressurized air supply and a second outlet for exhaust, wherein said heat exchanger is adapted for at least one of pre-heating and pre-cooling the pressurized air source prior to receipt by said vortex tube, and wherein said conduit interconnects the exit aperture and the second inlet of said heat exchanger.

17. The apparatus of claim 13, further comprising a baffle mounted within the chamber of said ventilated mount for directing airflow from the inlet of the ventilated mount to adjacent the base of the heat exchange means, and wherein the exit aperture of the chamber is located opposite the base of the heat exchange means to further encourage air flow from the base of said heat exchange means to travel along and adjacent the length of the fins of the heat exchange means toward the exit aperture.

* * * * *